United States Patent [19]
Tanzawa et al.

[11] Patent Number: 5,828,621
[45] Date of Patent: Oct. 27, 1998

[54] SEMICONDUCTOR MEMORY DEVICE AND HIGH-VOLTAGE SWITCHING CIRCUIT

[75] Inventors: Toru Tanzawa, Ebina; Tomoharu Tanaka, Yokohama; Ken Takeuchi, Tokyo, all of Japan

[73] Assignee: Kabushiki Kaisha Toshiba, Kawasaki, Japan

[21] Appl. No.: 941,370

[22] Filed: Sep. 30, 1997

Related U.S. Application Data

[62] Division of Ser. No. 773,893, Jan. 17, 1997, Pat. No. 5,708,606, which is a continuation of Ser. No. 516,360, Aug. 17, 1995, abandoned.

[30] Foreign Application Priority Data

Aug. 19, 1994 [JP] Japan ................................. 6-195823
Aug. 19, 1994 [JP] Japan ................................. 6-218031

[51] Int. Cl.$^6$ .................................................. G11C 7/00
[52] U.S. Cl. ..................................... 365/229; 365/185.11
[58] Field of Search ............................... 365/230.03, 229, 365/185.11, 185.15, 185.24, 185.27

[56] References Cited

U.S. PATENT DOCUMENTS

| | | | |
|---|---|---|---|
| 4,381,552 | 4/1983 | Nocilini et al. ........................ 365/227 |
| 5,245,572 | 9/1993 | Kosonocky et al. ............... 365/185.11 |
| 5,267,218 | 11/1993 | Elbert ................................... 365/185.4 |
| 5,272,677 | 12/1993 | Yamamura ............................. 365/227 |
| 5,313,429 | 5/1994 | Chevallier et al. ..................... 365/226 |
| 5,402,382 | 3/1995 | Miyawaki et al. ..................... 365/218 |
| 5,422,855 | 6/1995 | Eslick et al. ........................... 365/229 |
| 5,490,118 | 2/1996 | Nishioka et al. ....................... 365/229 |

FOREIGN PATENT DOCUMENTS 3-177111  8/1991  Japan .

*Primary Examiner*—Tan T. Nguyen
*Attorney, Agent, or Firm*—Oblon, Spivak, McClelland, Maier & Neustadt, P.C.

[57] ABSTRACT

A semiconductor memory device comprises an array of electrically rewritable memory cells which are arranged in a matrix, erasing section for applying an erasing voltage to the memory cells to effect erasing, and writing section for applying a writing voltage to the memory cells to effect writing, wherein in the erasing section and writing section, either MOS transistors to which a voltage higher than the erasing voltage and writing voltage is applied or MOS transistors which transfer a voltage higher than the erasing voltage and writing voltage contain MOS transistors which are in a weak inversion state or an inversion state with their substrate bias voltage, gate voltage and source voltage at 0 V.

7 Claims, 44 Drawing Sheets

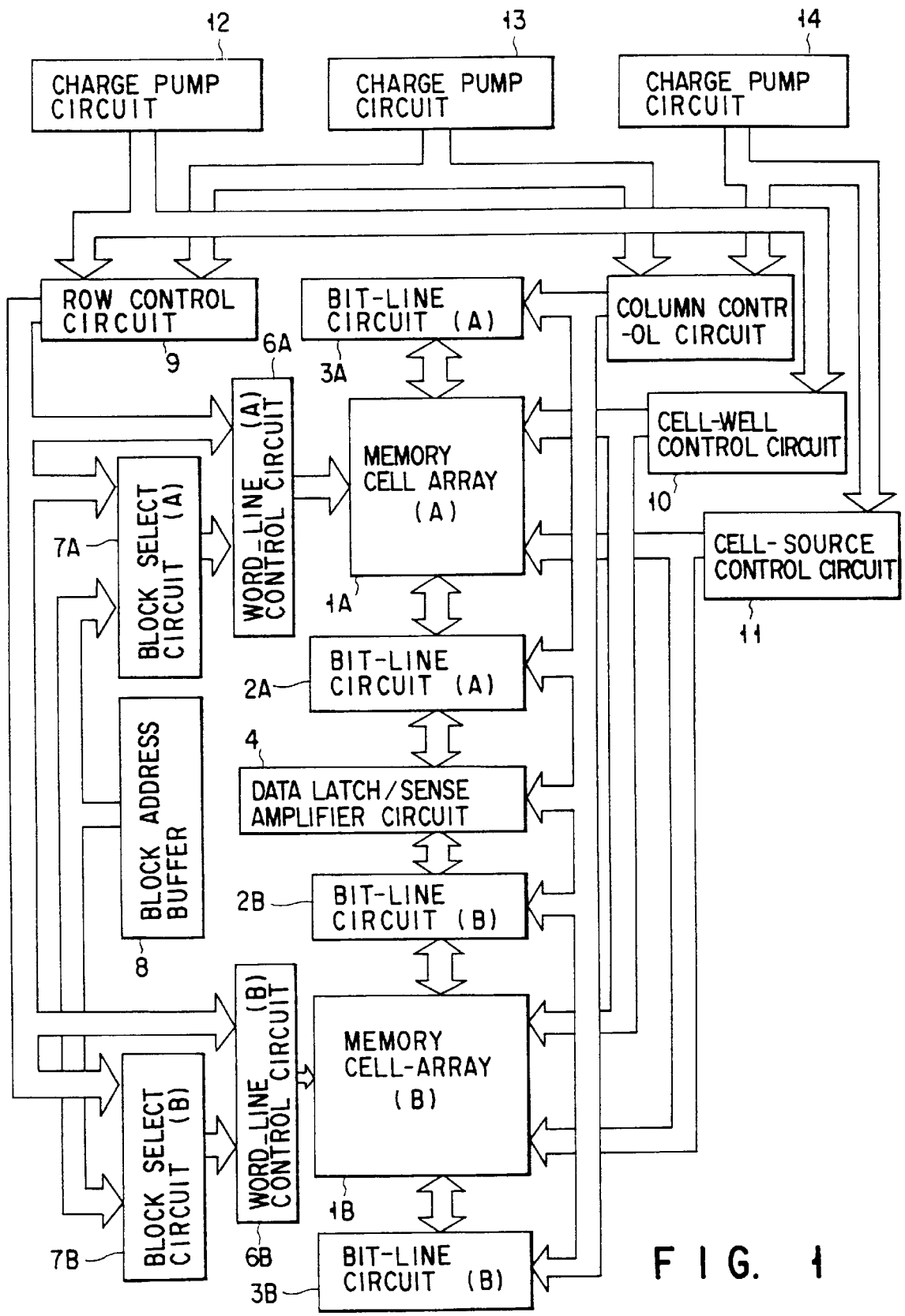
F I G. 1

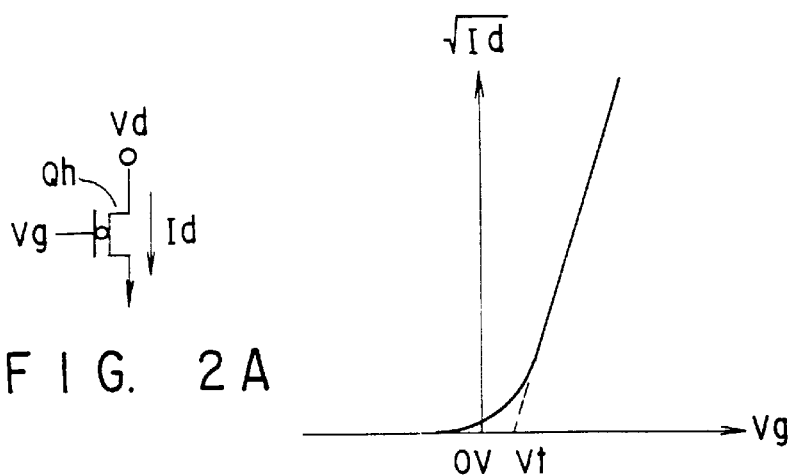
FIG. 2A
FIG. 2B
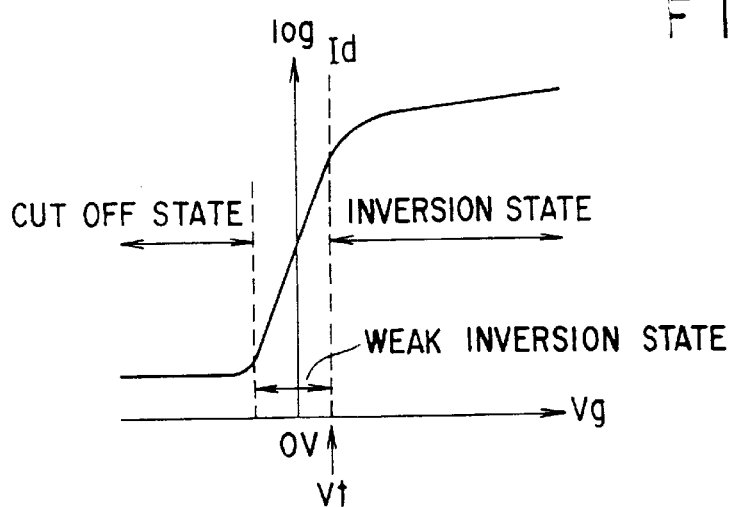
FIG. 2C
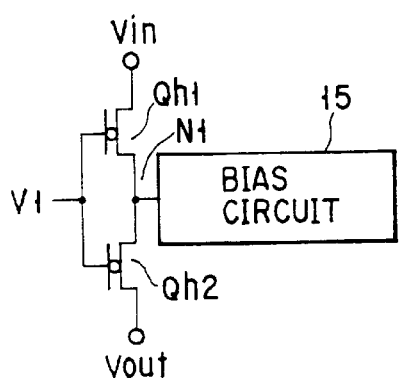
FIG. 3A
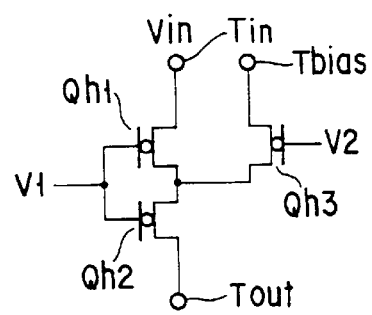
FIG. 3B

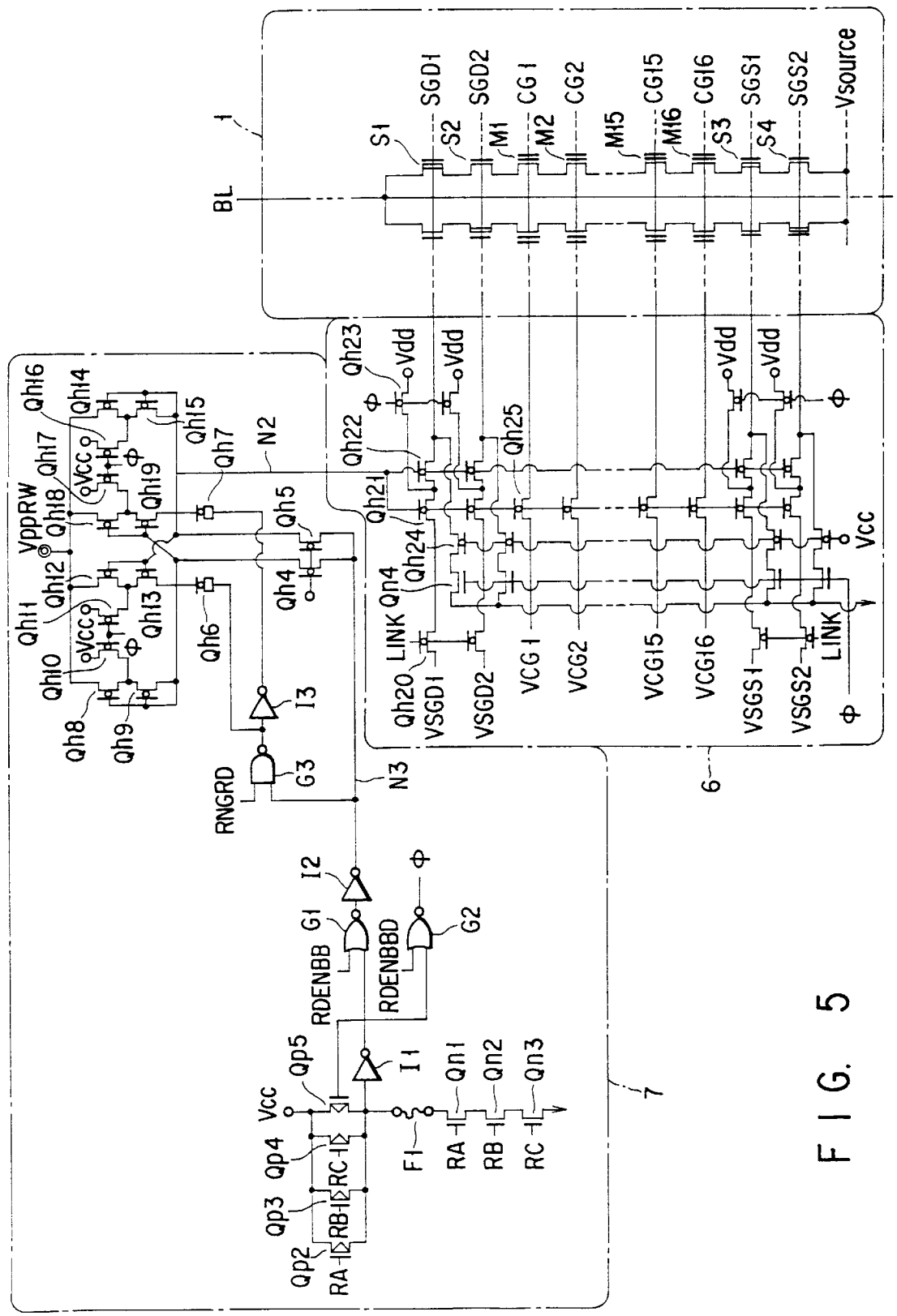
F I G. 5

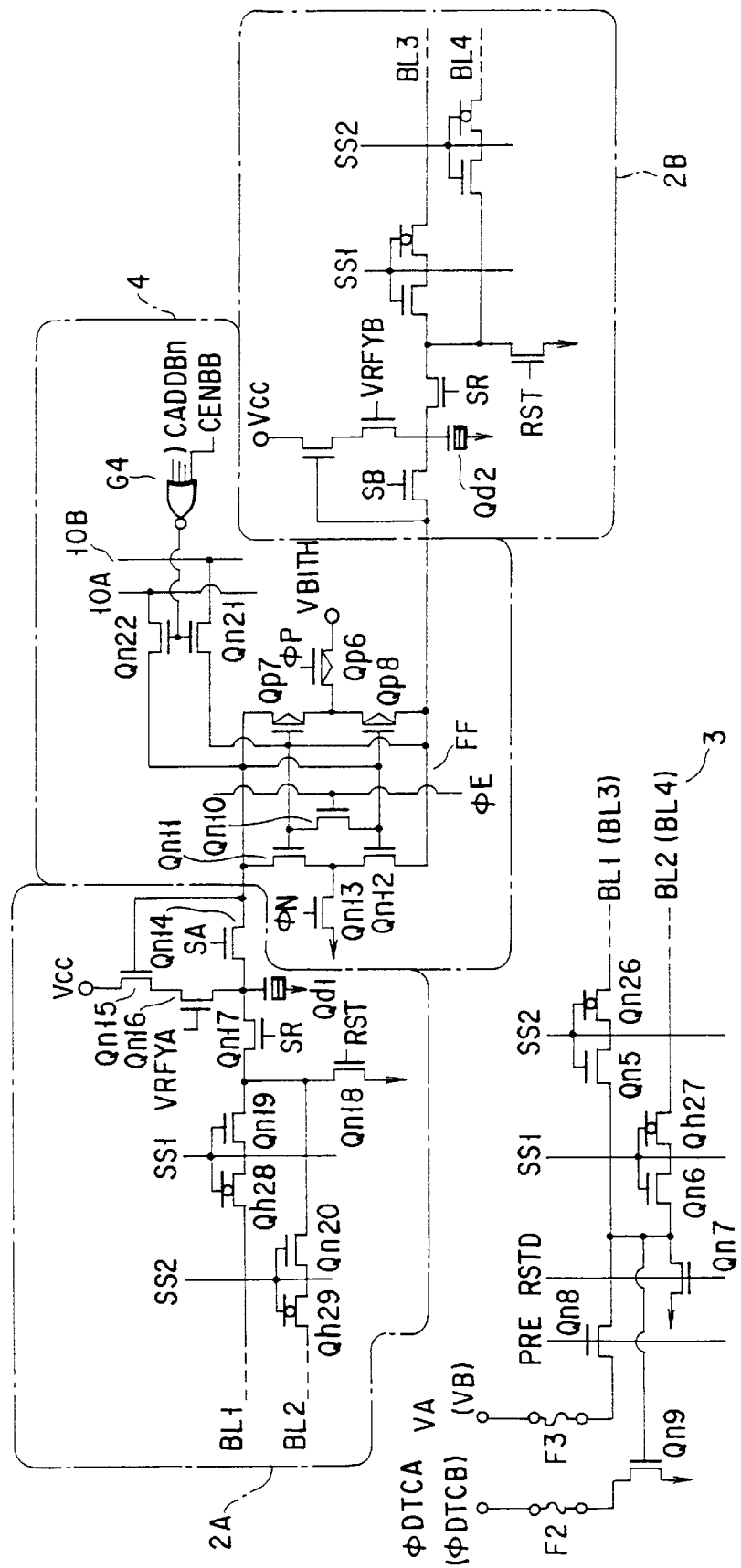
F I G. 6

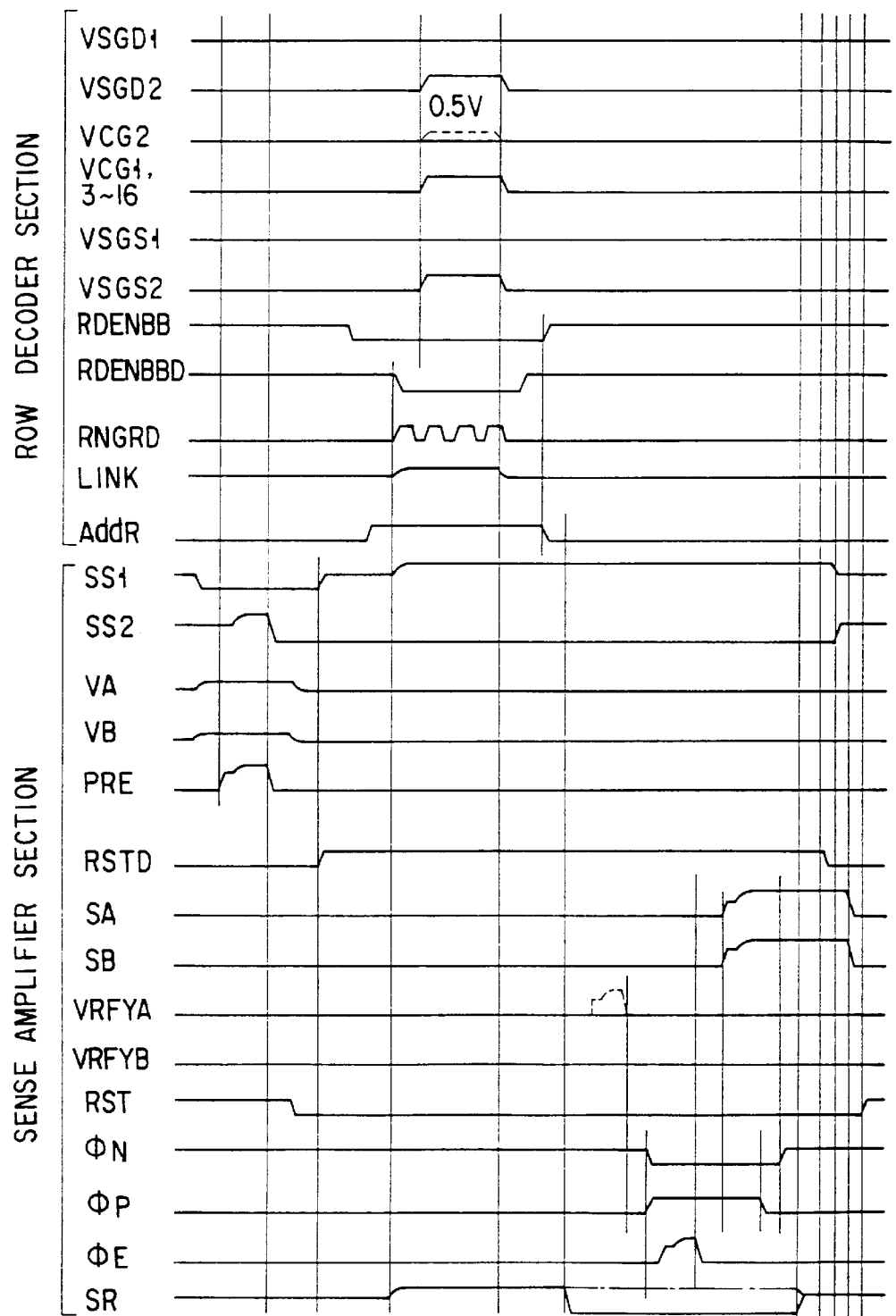
F I G. 8

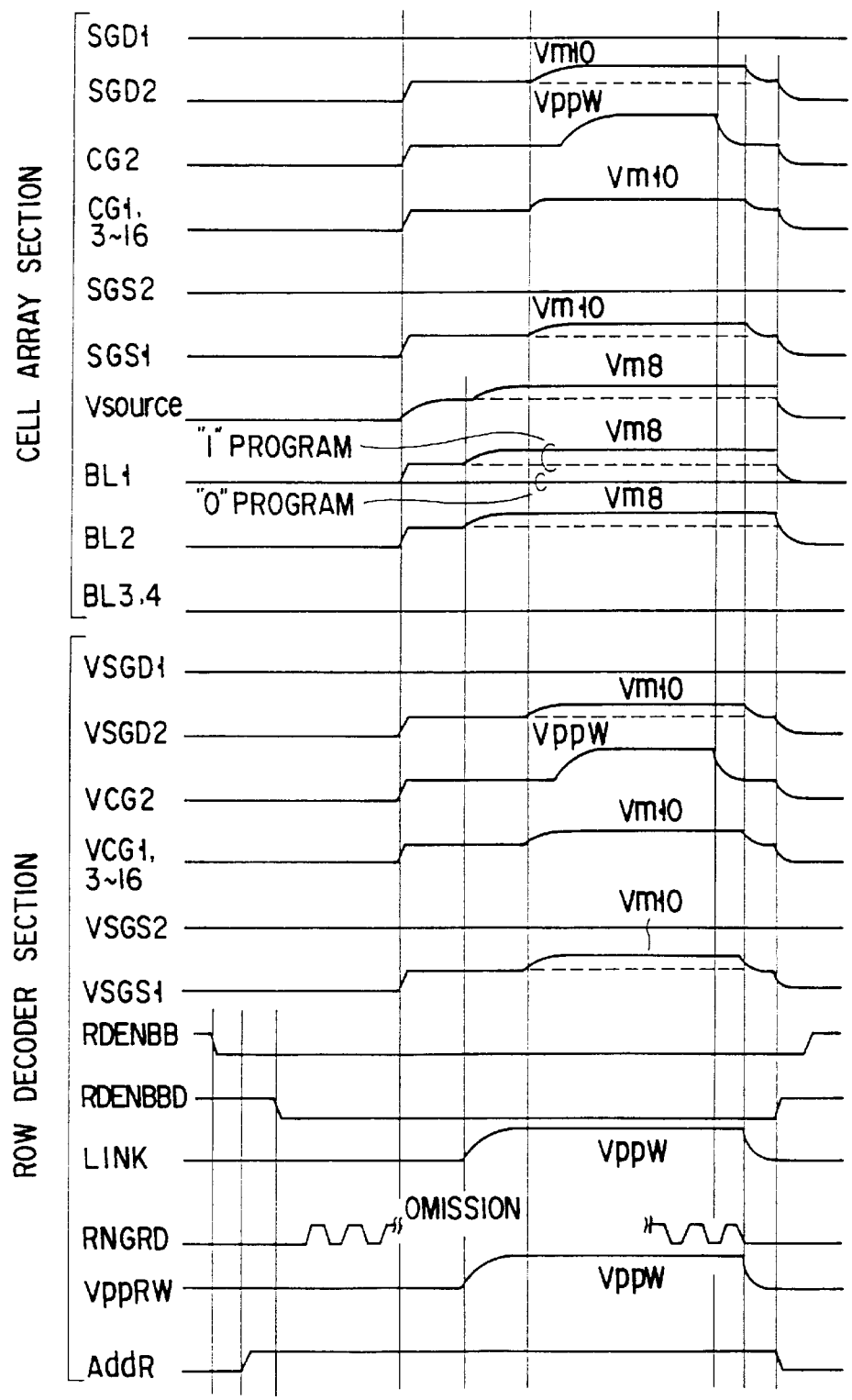
F I G. 9

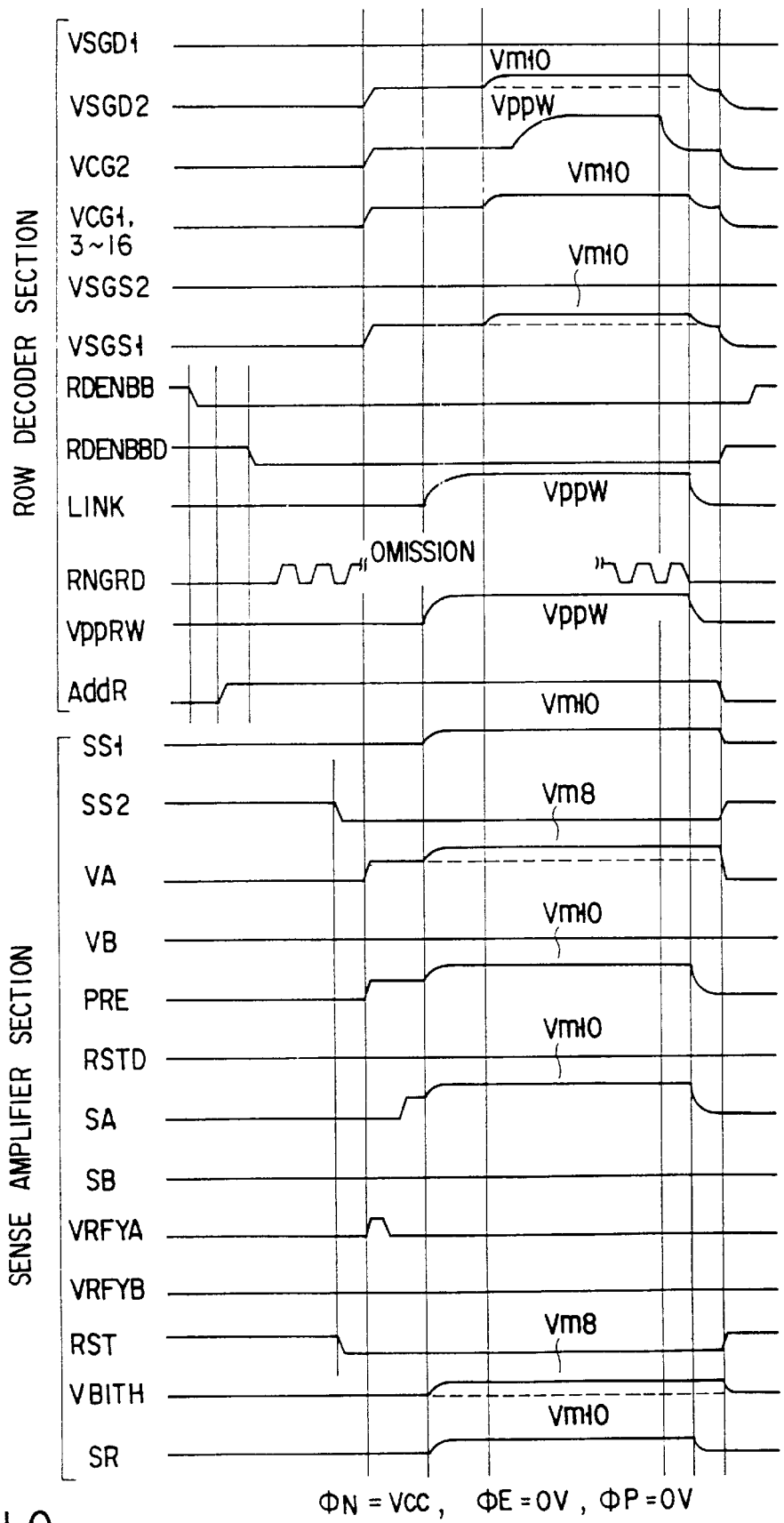
F I G. 10

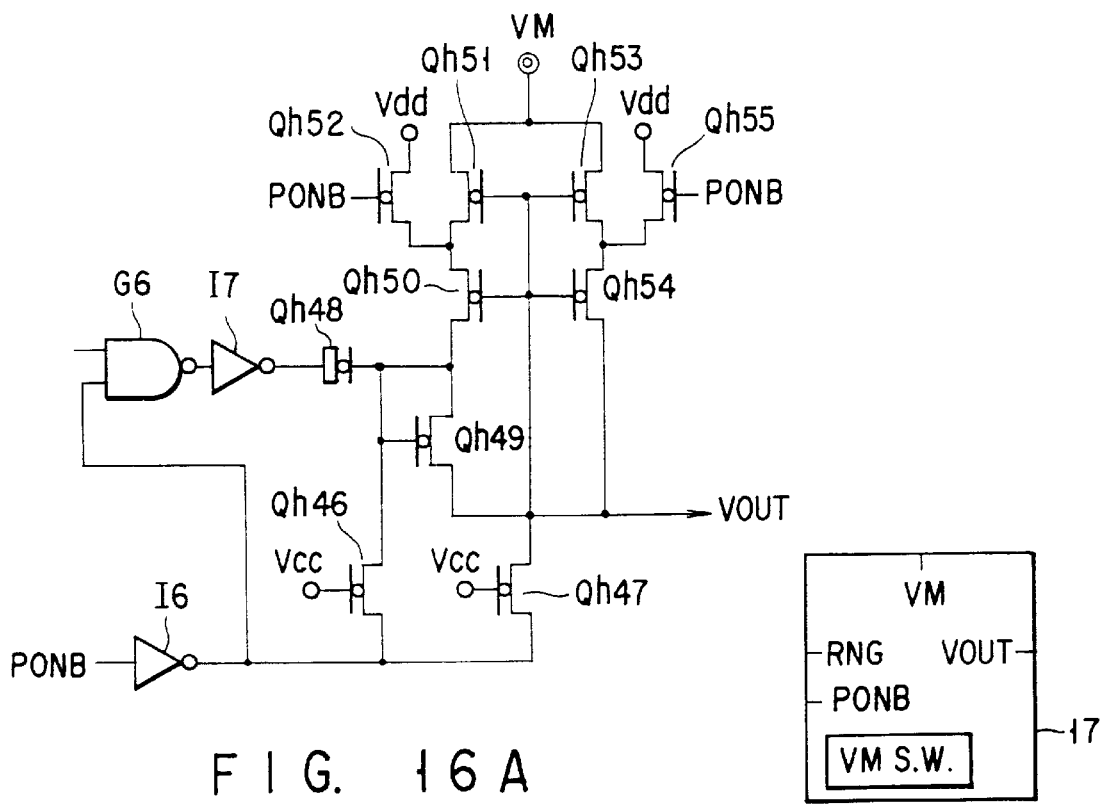
F I G. 16A
F I G. 16B
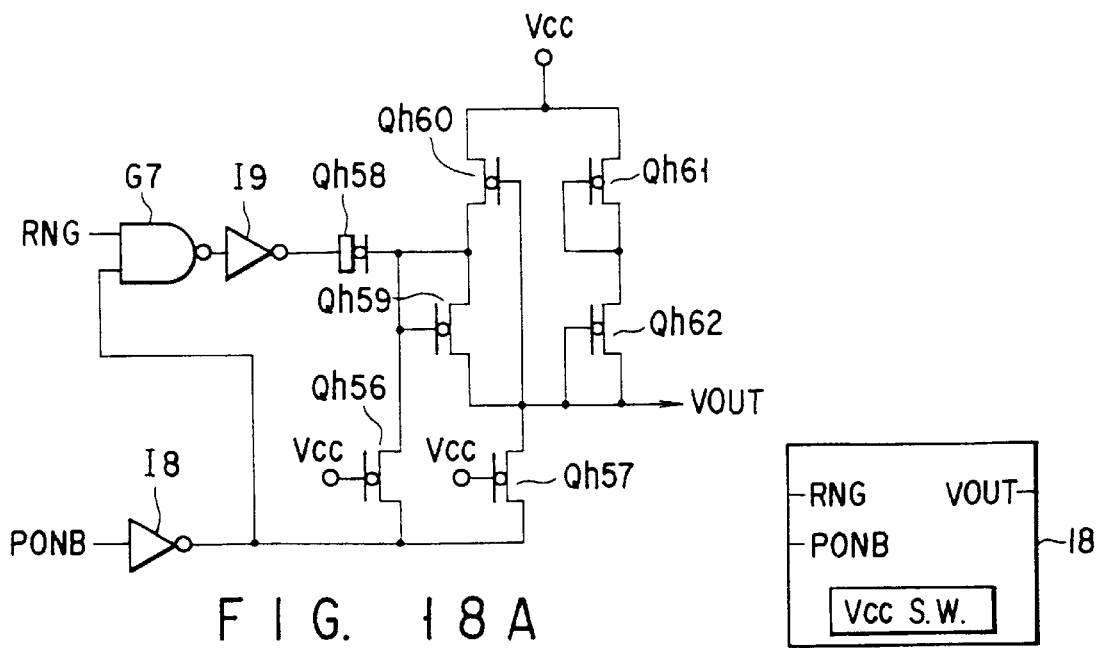
F I G. 18A
F I G. 18B

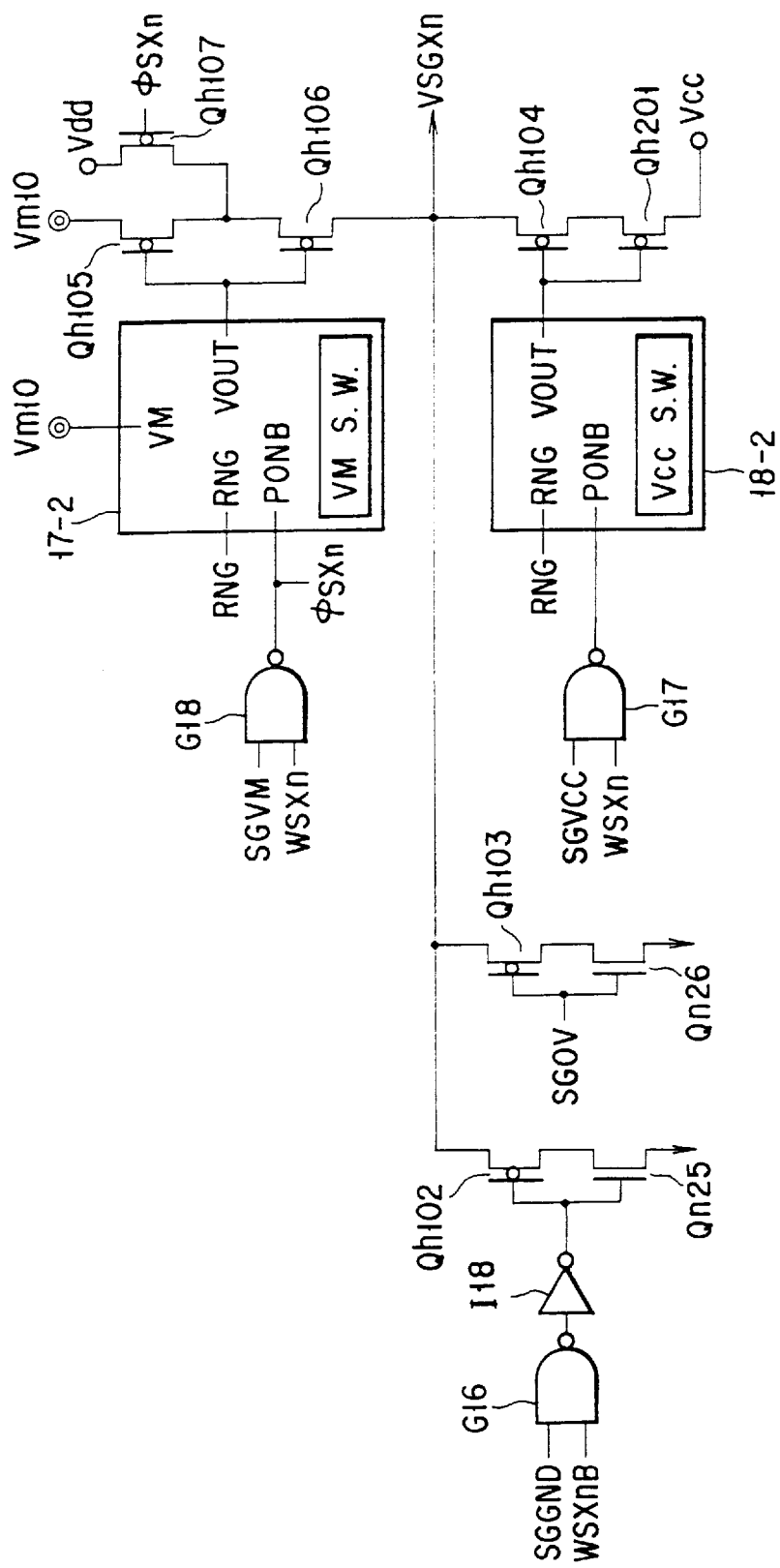
F I G. 24

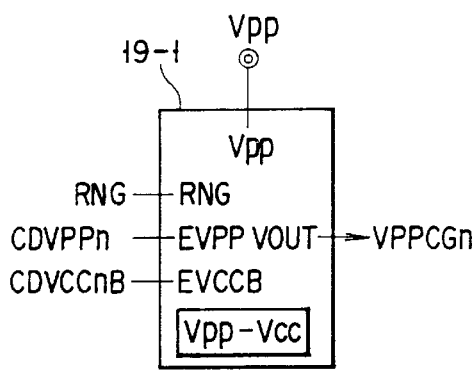
F I G. 26
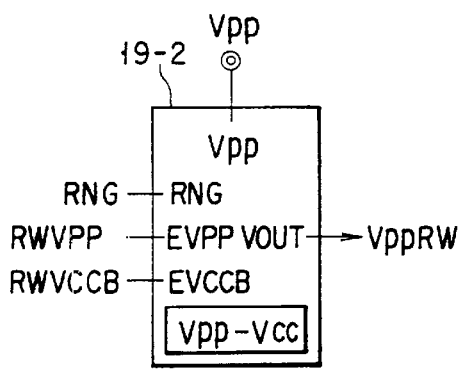
F I G. 27
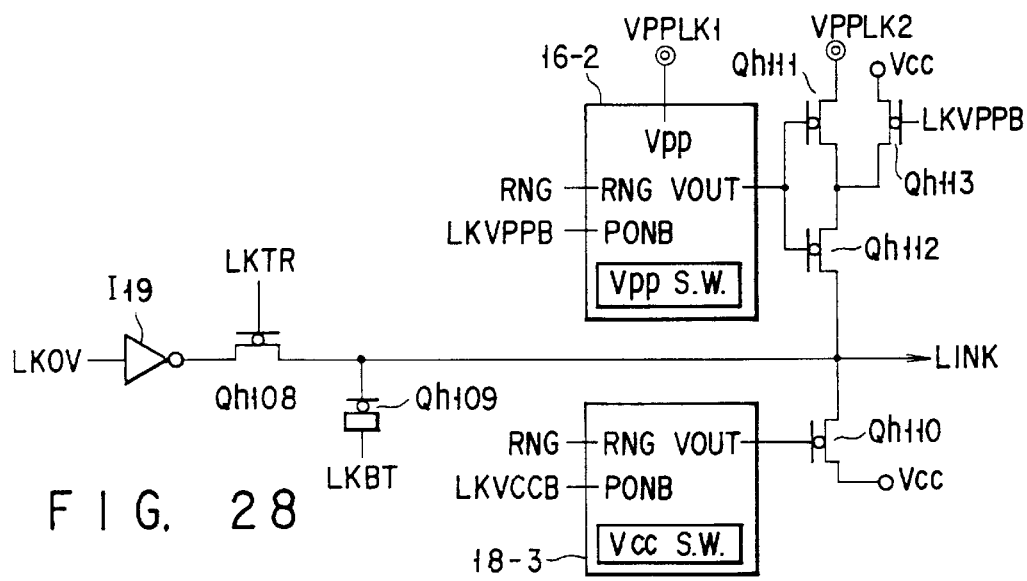
F I G. 28
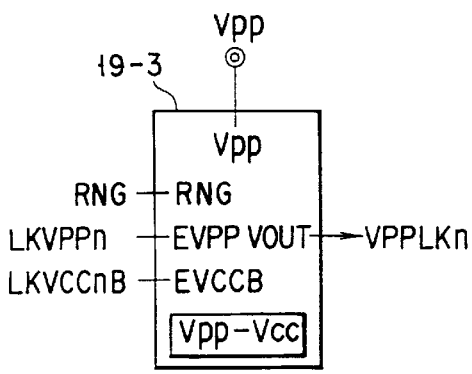
F I G. 30
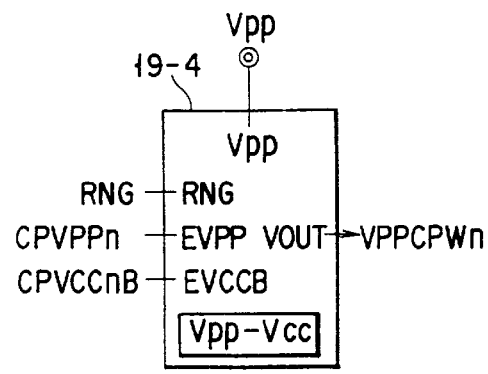
F I G. 31

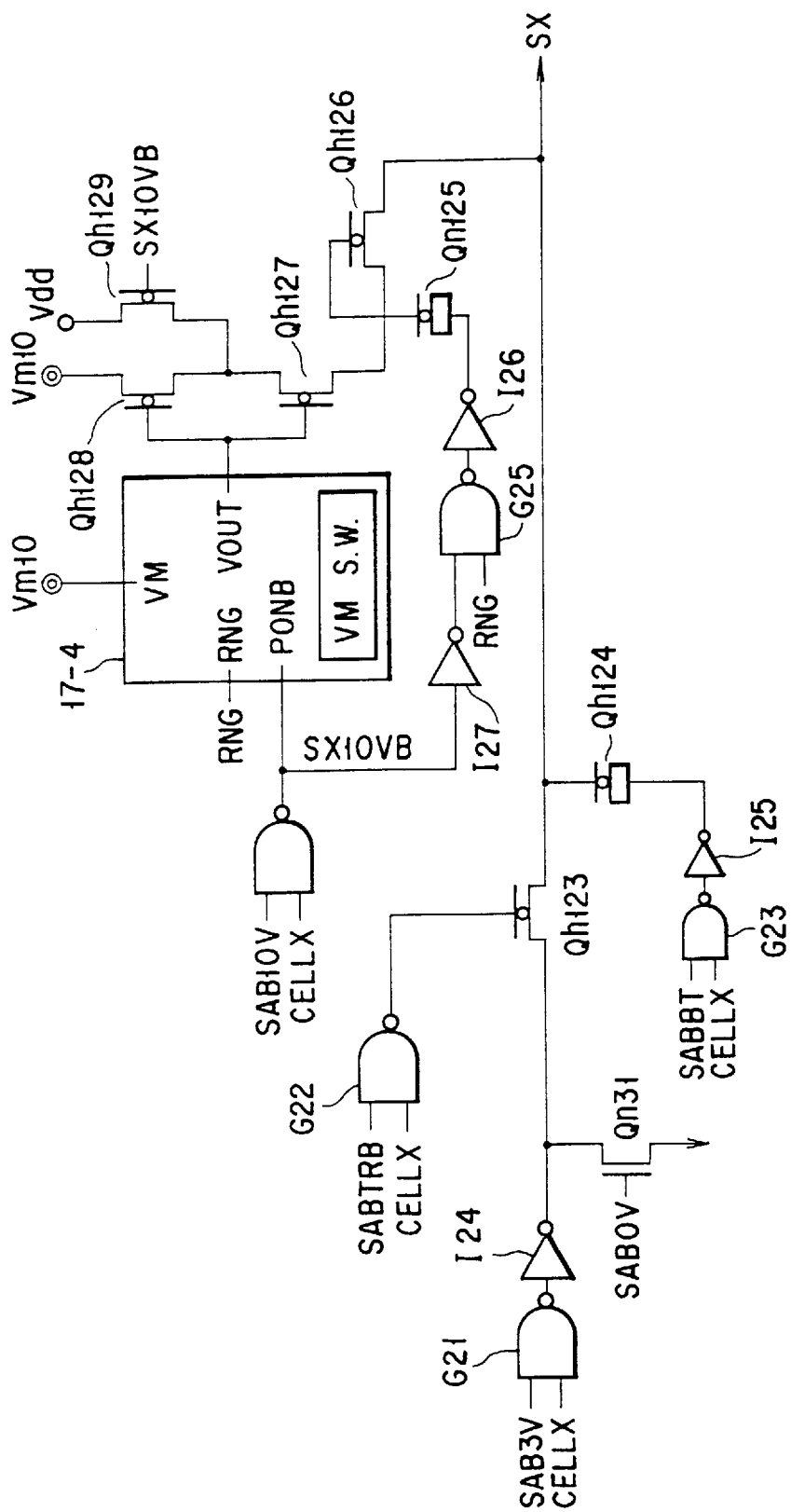
F I G. 36

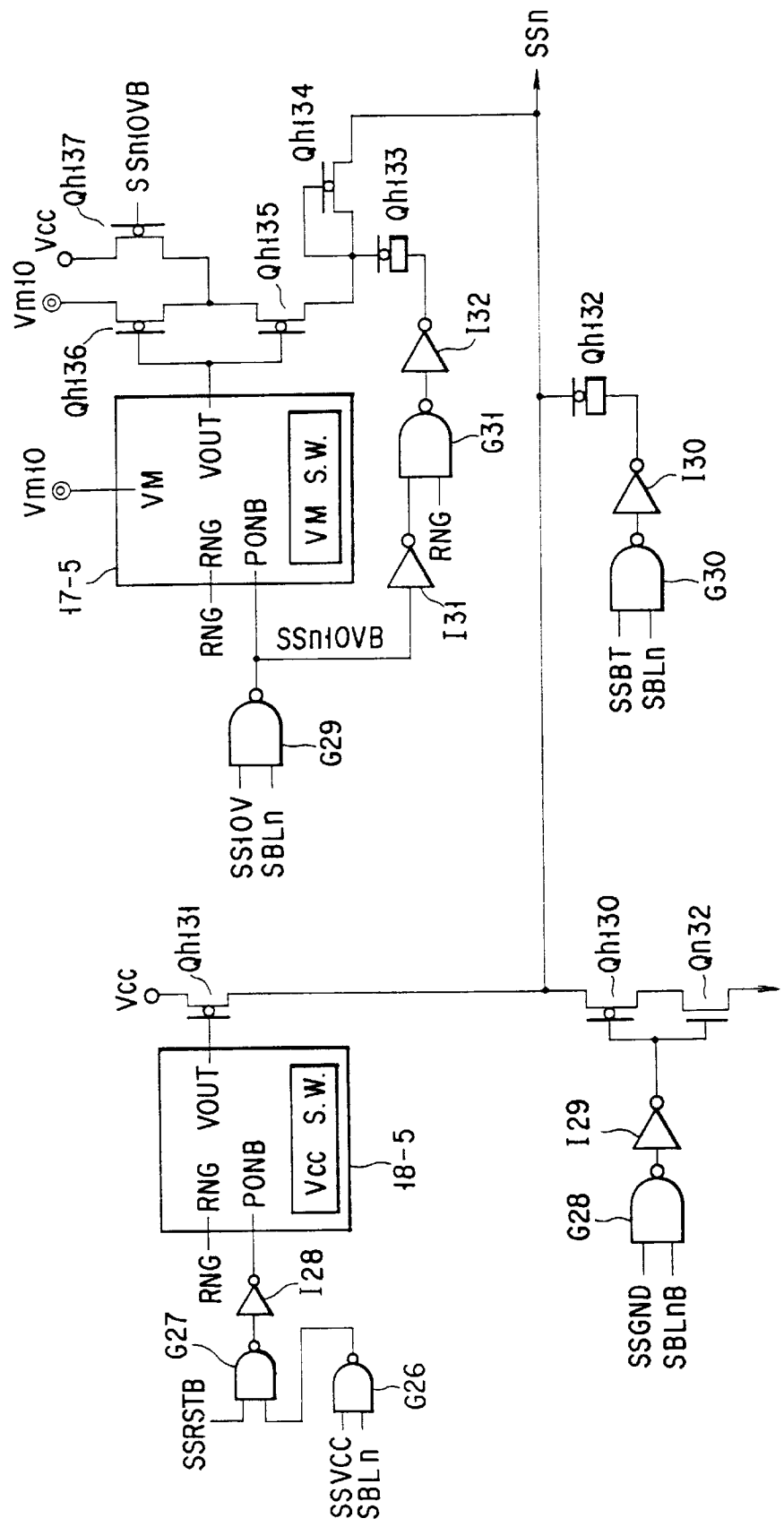
F I G. 38

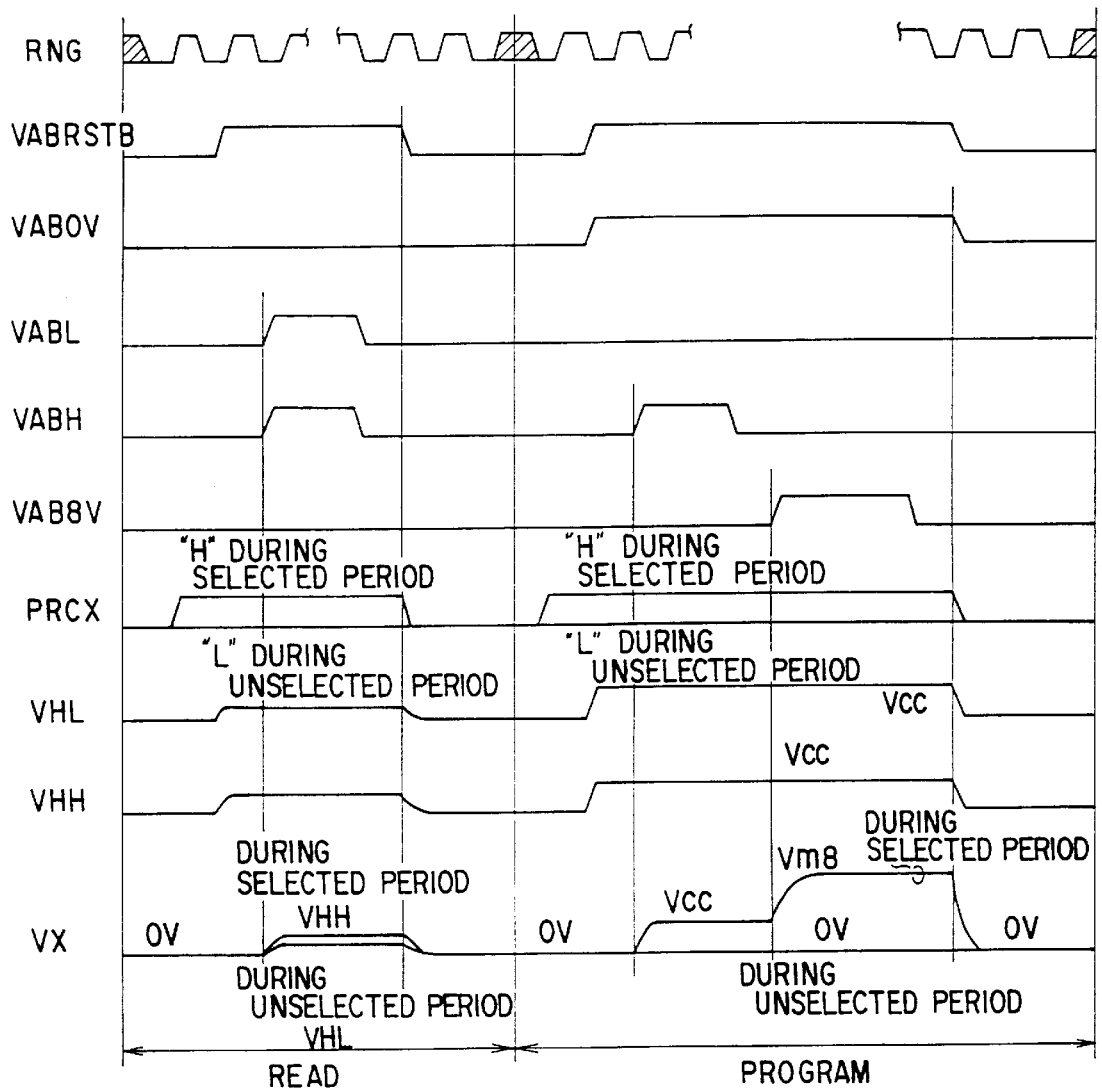
F I G. 43

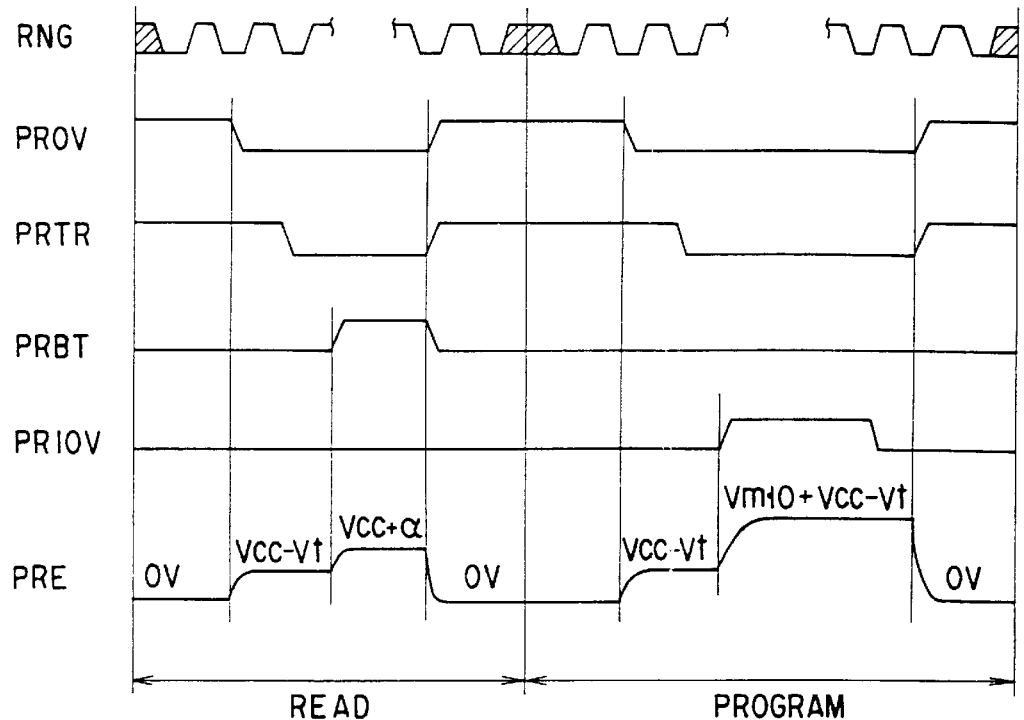
F I G. 45
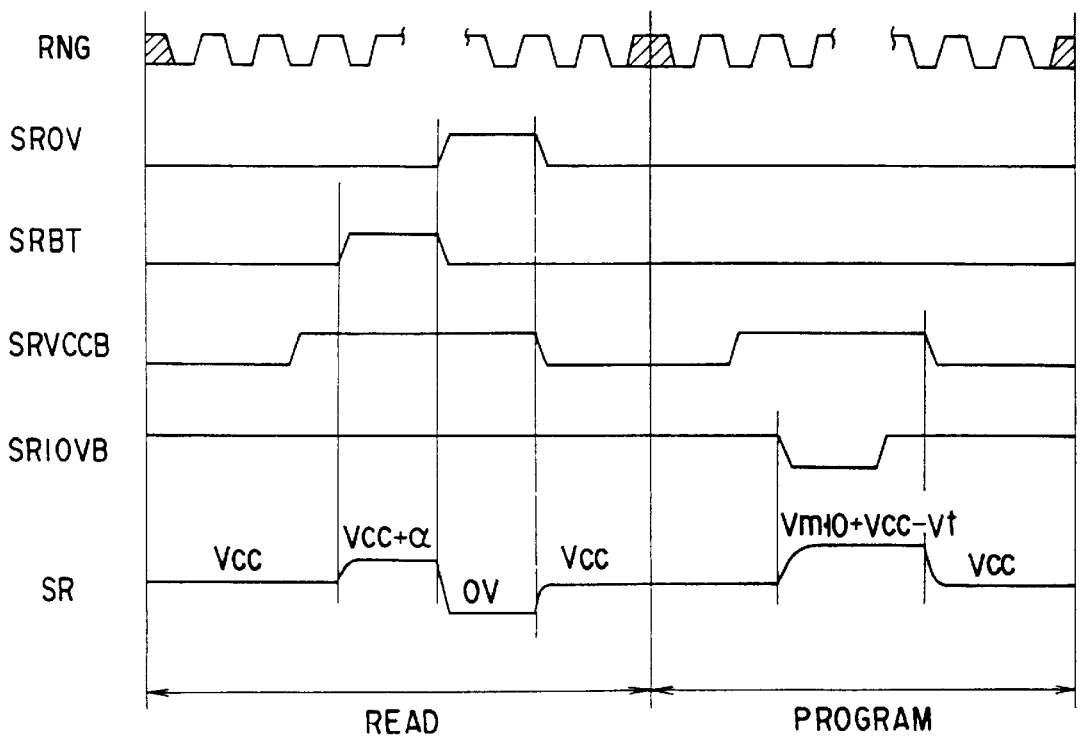
F I G. 47

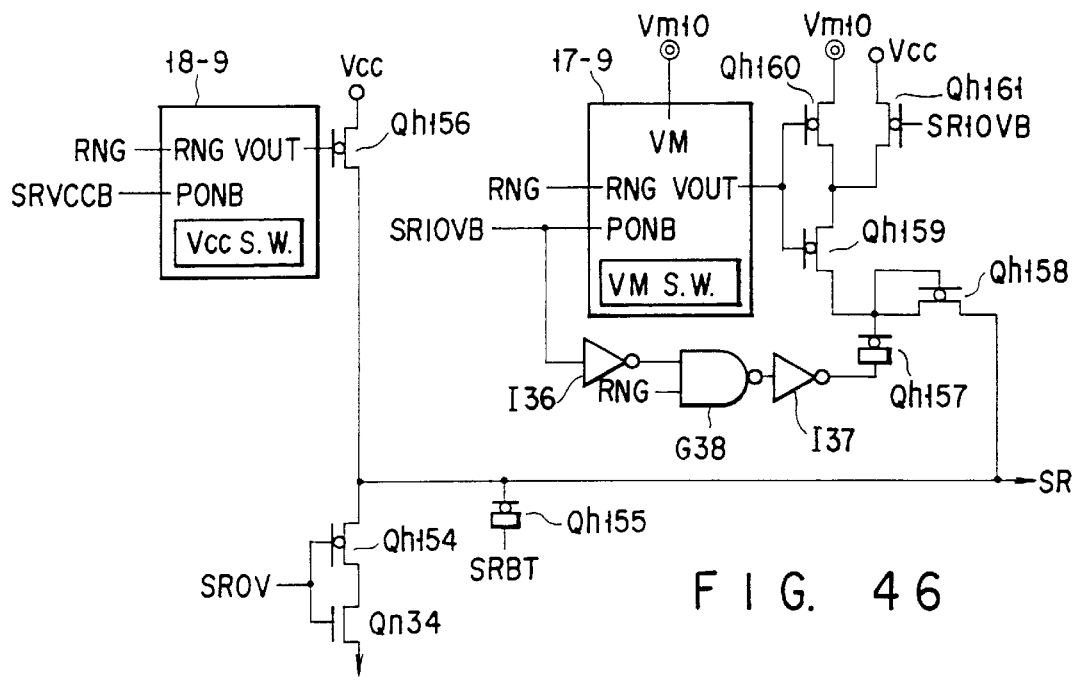
F I G. 46
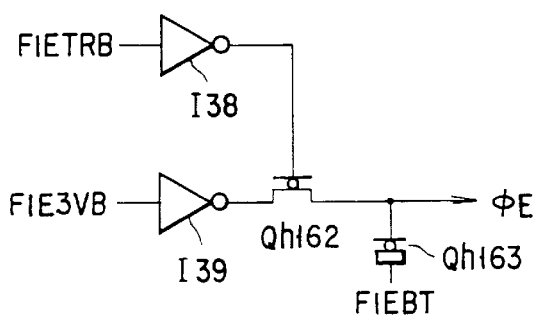
F I G. 48
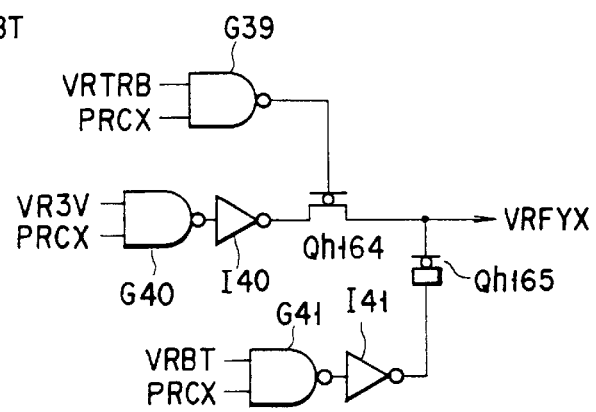
F I G. 50

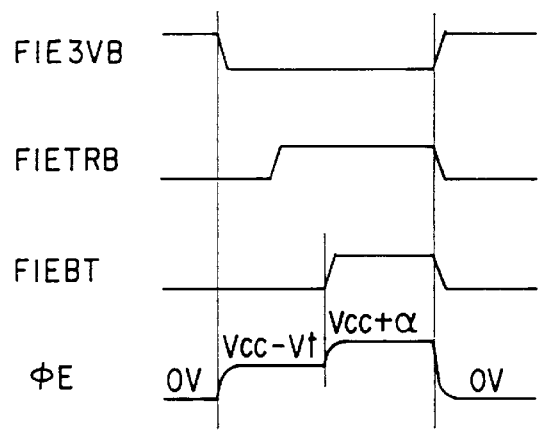
FIG. 49
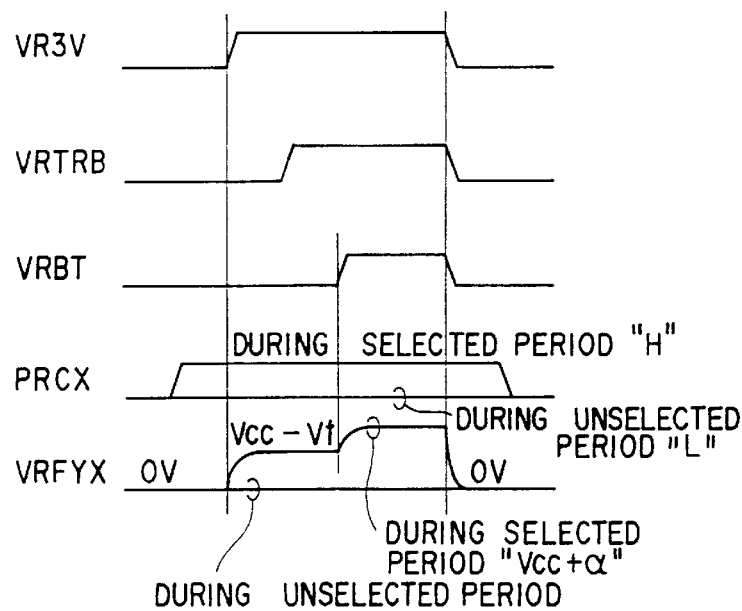
FIG. 51
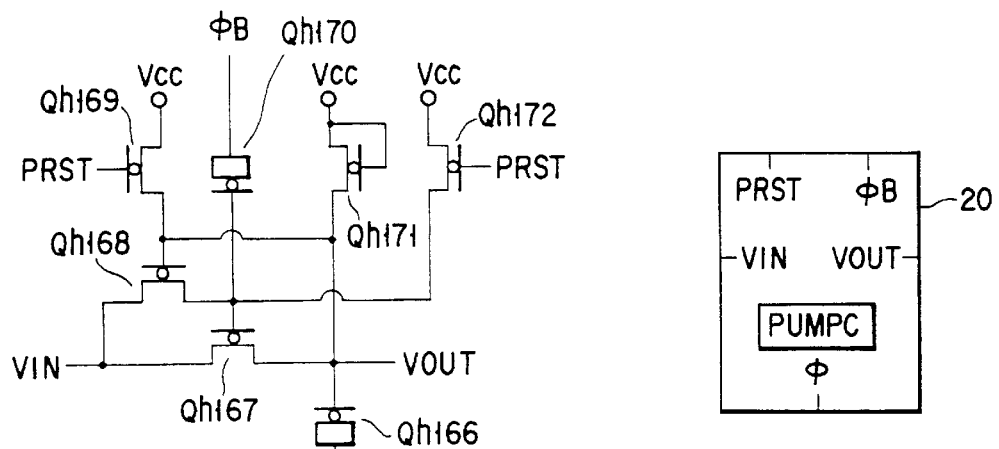
FIG. 52A
FIG. 52B

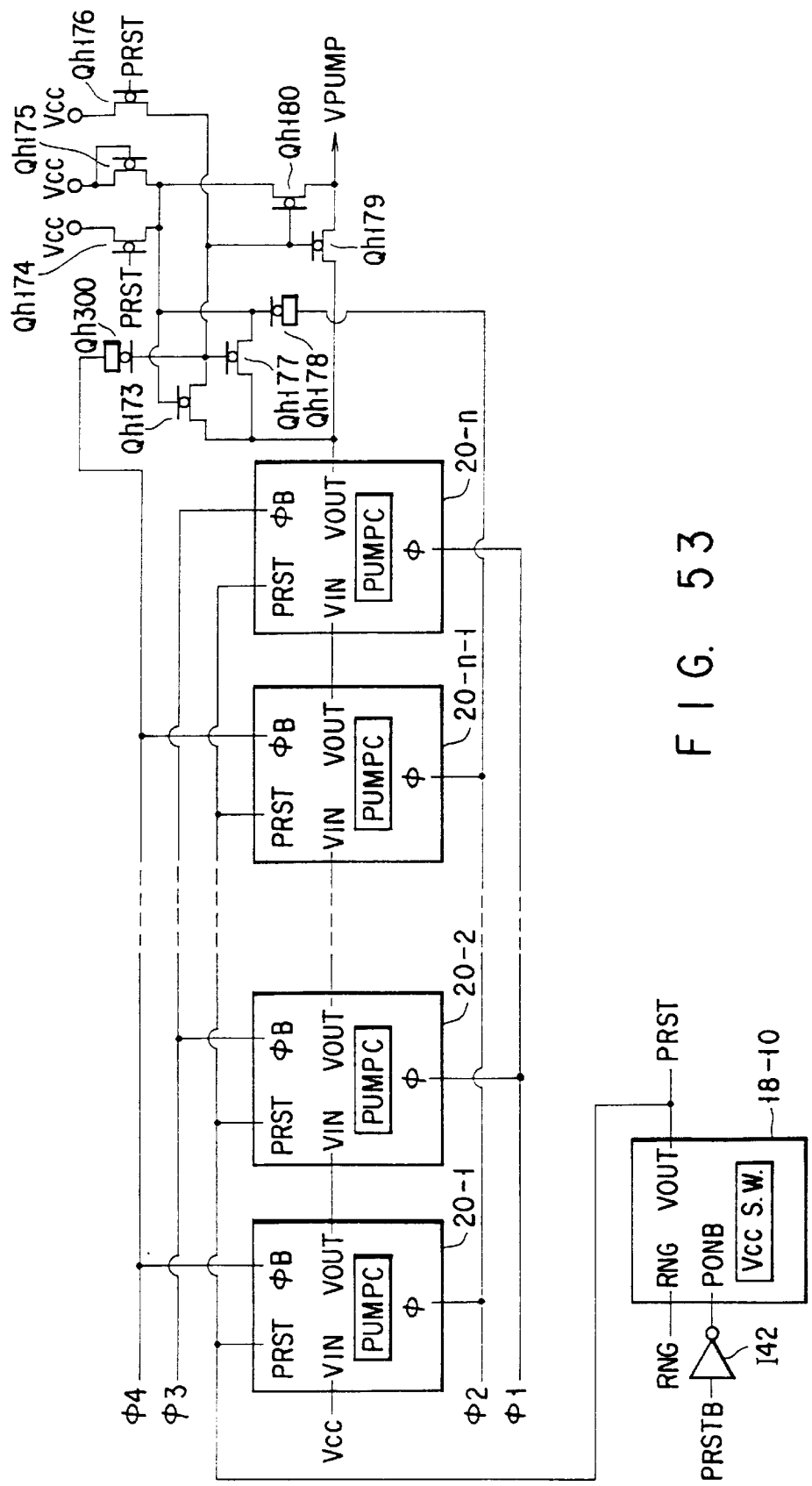
F I G. 53

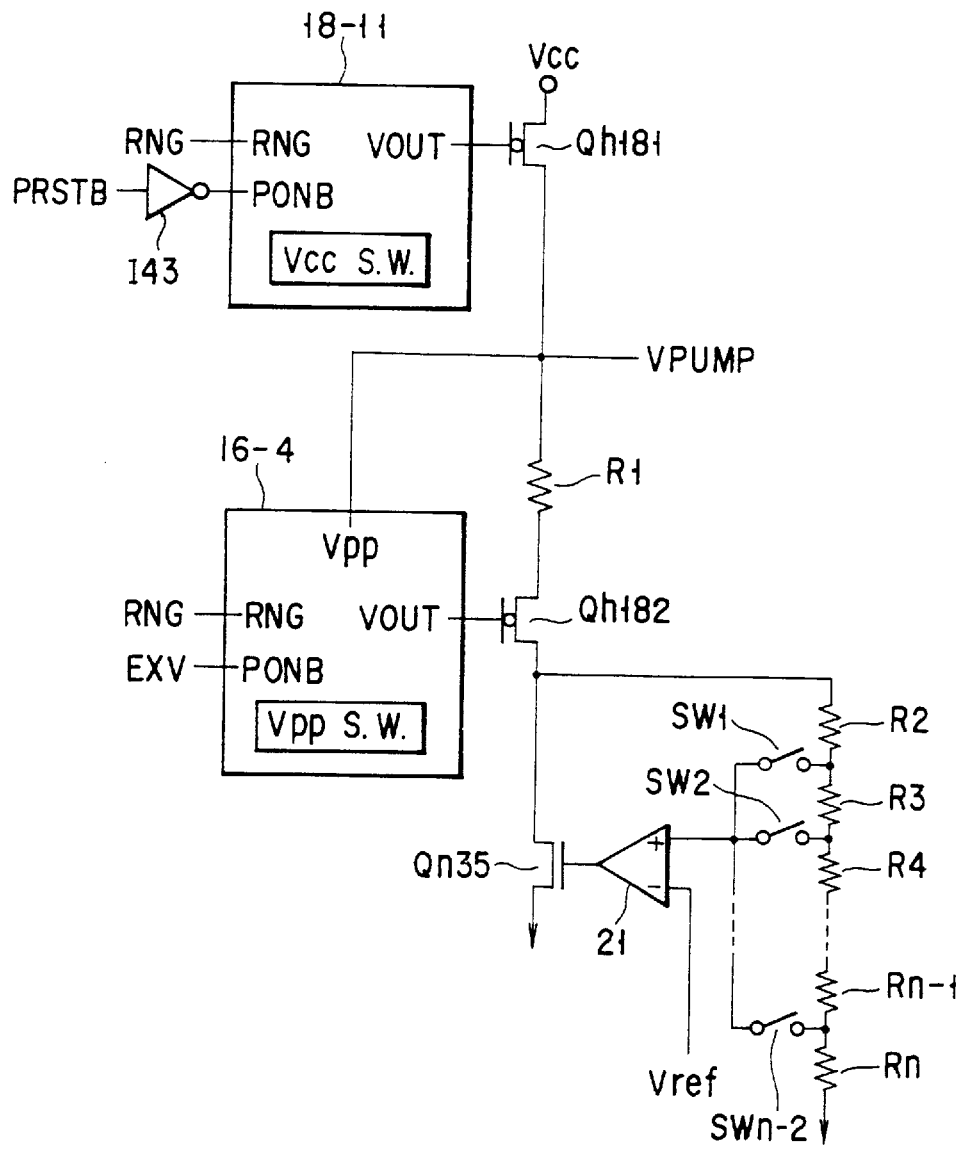
F I G. 54

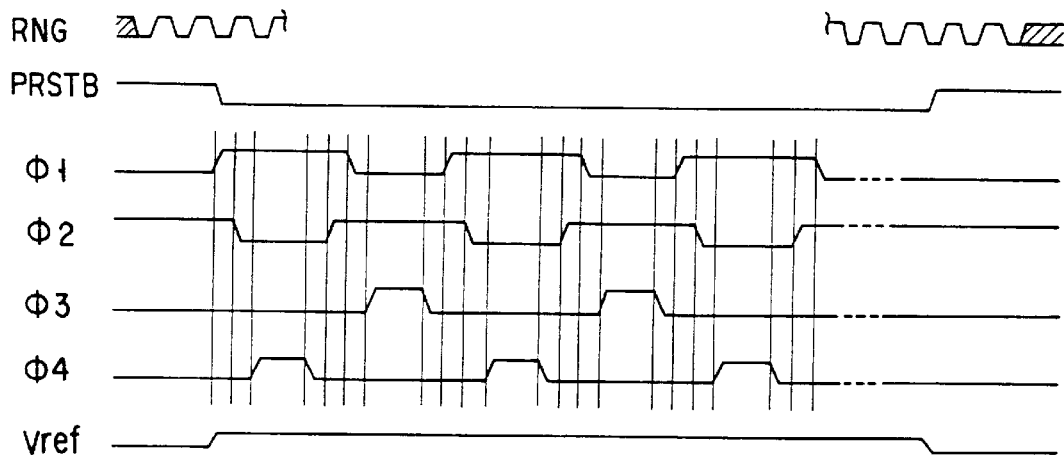
F I G. 55
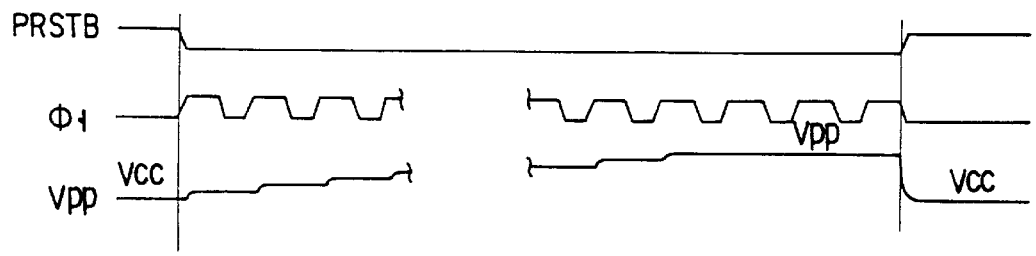
F I G. 56
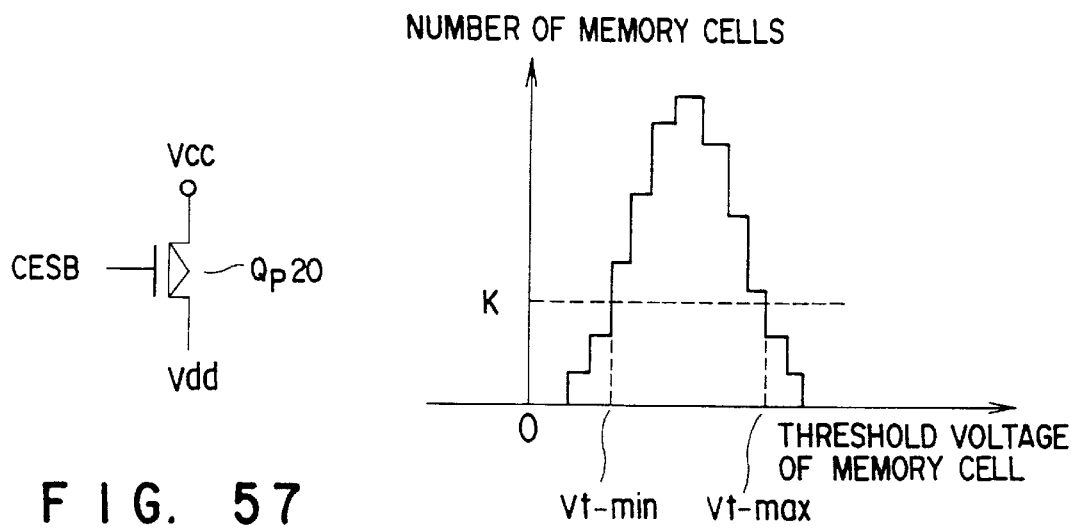
F I G. 57
F I G. 58

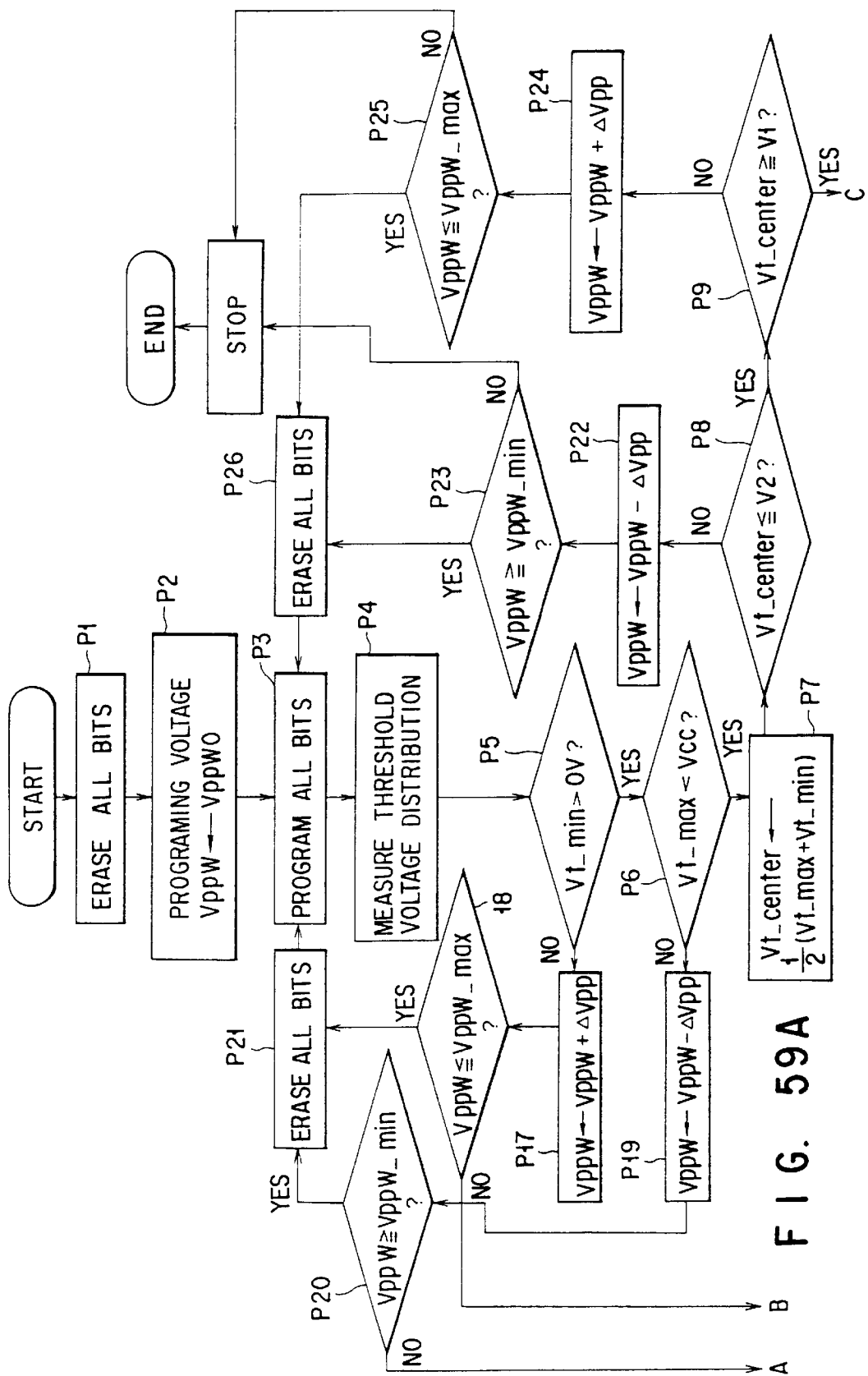
F I G. 59A

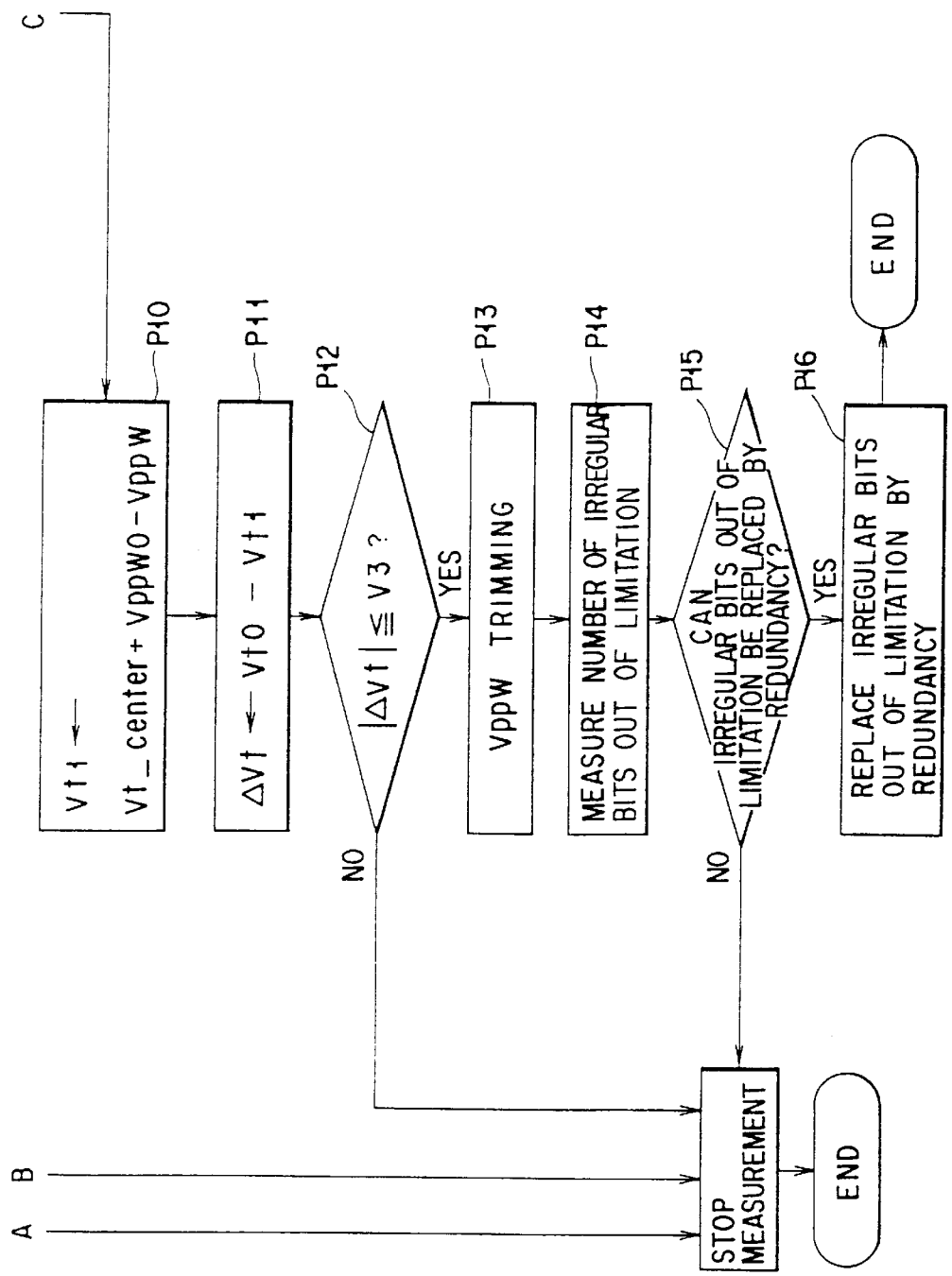
F I G. 59B

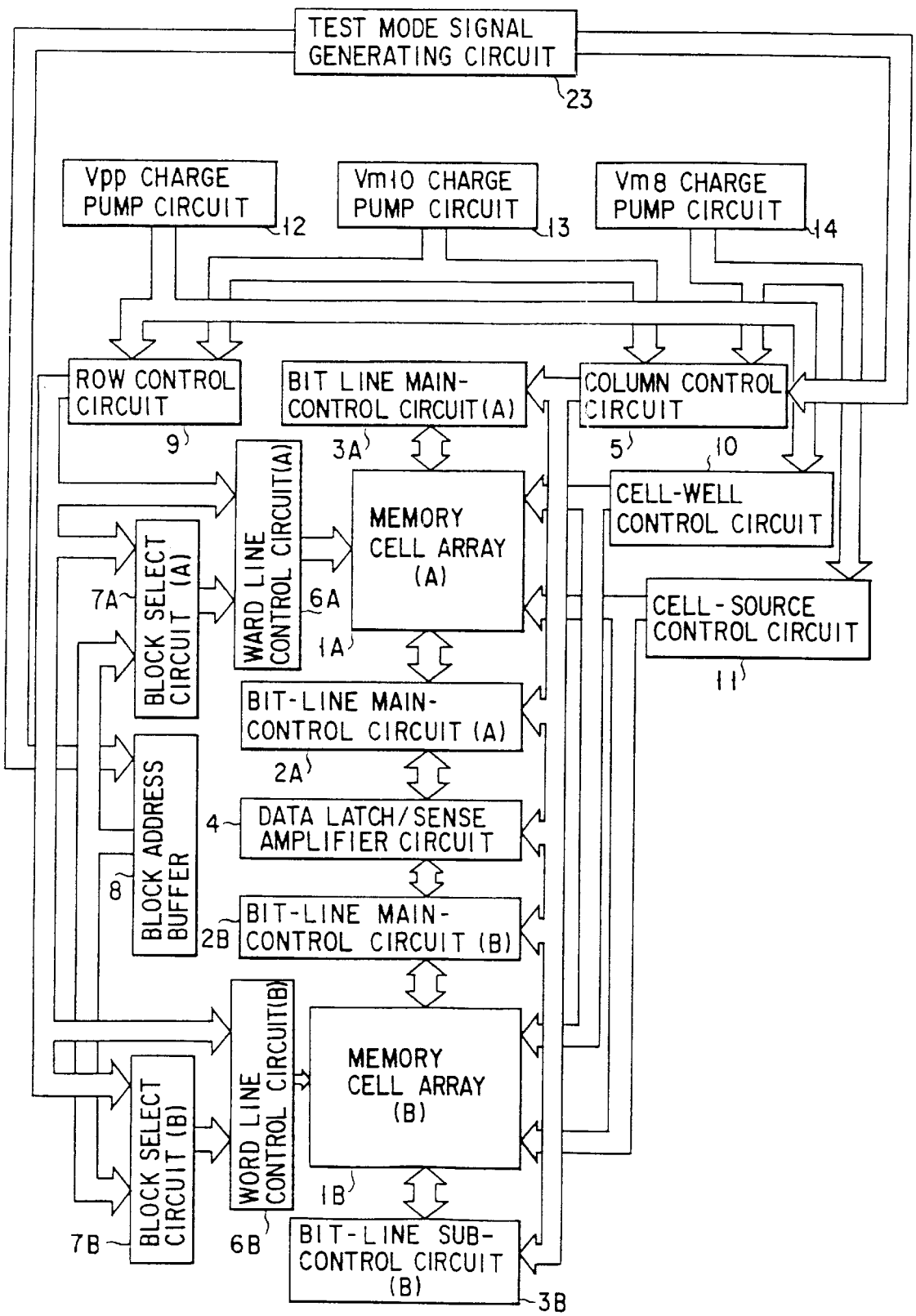
F I G. 60

SEMICONDUCTOR MEMORY DEVICE AND HIGH-VOLTAGE SWITCHING CIRCUIT

This is a Division, of application Ser. No. 08/733,893 filed on Jan. 17, 1997, now U.S. Pat. No. 5,708,606, which is a Rule 62 File Wrapper Continuation Application of application Ser. No. 08/516,360, filed Aug. 17, 1995, now abandoned.

BACKGROUND OF THE INVENTION

1. Field of the Invention

This invention relates to a semiconductor memory device, such as an electrically rewritable nonvolatile semiconductor memory device (EEPROM), and more particularly to an EEPROM that writes and erases the data into and from memory cells by tunnel current.

The invention further relates to such a high-voltage switching circuit as is used in the semiconductor memory device, and more particularly to a voltage switching circuit that uses only NMOS transistors (n-channel MOS transistors).

2. Description of the Related Art

One known type of EEPROMs is a NAND-cell EEPROM capable of high integration. In this type of EEPROM, a plurality of memory cells are connected in series in such a manner that their source and drains may be shared by adjacent cells and these series-connected cells are treated as one unit and connected to a bit line. The memory cells generally have an FETMOS structure in which a charge storage layer (a floating gate) and a control gate are laminated together. The memory cell array is formed by integrating cells in a p-type substrate or p-well. The drain side of a NAND cell is connected to a bit line via a select gate and the source side is connected to a common source line via a select gate. The control gates of the memory cells are arranged consecutively in the row direction and serve as word lines.

The NAND-cell EEPROM operates as follows. The data is written, starting at the memory cell farthest from the bit line (i.e., the memory cell on the source line side). A high voltage $V_{ppW}$ (=about 18 V) is applied to the control gate of the selected memory cell, an intermediate voltage of $V_{m10}$ (=about 10 V) is applied to the control gates of the memory cells closer to the bit line than the selected one and their select gates on the drain side, and 0 V or an intermediate voltage of $V_{m8}$ (=about 8 V) is applied to the bit line according to the data.

When 0 V is applied to the bit line, the voltage is transferred to the drain of the selected memory cell, causing electrons to be injected into a charge storage layer. This causes the threshold voltage of the selected memory cell to shift in the positive direction. This state is assumed to be "0", for example. When $V_{m8}$ is applied to the bit line, electron injection virtually does not take place and consequently the threshold voltage does not change and remains negative. This state is assumed to be "1" and the erased state. The data is written simultaneously into the memory cells sharing the control gate.

The data is erased in blocks simultaneously from all of the memory cells in the selected NAND cell. All of the control gates in the selected NAND cell block are set at 0 V and the p-well is set at 20 V. At this time, with the high voltage applied to the p-well, the select gate, bit line, and source line are also set at 20 V. This causes the electrons in the charge storage layer to be discharged into the p-well in all of the memory cells in the selected NAND cell block, causing the threshold voltage to shift in the negative direction. All of the control gates of the memory cells in the NAND-cell blocks not to be erased are set at 20 V. High voltages necessary for writing and erasing are generated at the charge pump circuit.

The data is read by setting the control gate of the selected memory cell at 0 V and the control gates and select gates of the other memory cells at a power-supply voltage Vcc (e.g., 3 V), and sensing whether or not current flows through the selected memory cell. To achieve this, the threshold voltage of the memory cell after writing must be Vcc or less.

Since such a NAND-cell EEPROM uses a wide voltage range of 0 V to Vpp (up to 20 V), transistors dealing with a voltage range of 0 V to $V_{m10}$ (up to 10 V) (hereinafter, abbreviated as Vm-route transistors) and high-withstand-voltage transistors handling a voltage range of 0 V to Vpp (hereinafter, abbreviated as Vpp-route transistors) are needed. The reason for this is that a circuit to which only a voltage of $v_{m10}$ or less is applied is composed of Vm-route transistors of a relatively small size, thereby suppressing the circuit area and only the transistors to which Vpp is applied are determined to be Vpp-route transistors.

This type of device, however, has the following problem. When n-channel and p-channel MOS transistors are used as Vpp-route transistors, the number of types of transistor increases and production cost rises. When, for example, only n-channel MOS transistors are used as Vpp-route transistors and constitute a circuit, the power-supply voltage cannot be made low because of a decrease in the voltage transfer efficiency due to the threshold voltage of the transistors. Furthermore, when a circuit is composed of, for example, n-channel MOS transistors with a low threshold voltage, acting as Vpp-route transistors, leakage current in the transistors increases the drawn current in the stand-by condition or prevents the high voltage Vpp from being stepped up from the power supply voltage.

Still furthermore, since the writing voltage and erasing voltage are generated internally at the charge pump circuit, variations in production are liable to have an adverse effect on the devices and variations in the threshold voltage after the data has been written into the memory cell must be restricted within a specific range.

Additionally, the above-described semiconductor memory device is provided with a high-voltage switching circuit that switches the high voltage between the selected mode and the unselected mode. With the high-voltage switching circuit, a high voltage is applied to the source of an n-channel MOS transistor (hereinafter, referred to as an NMOS transistor) and a gate voltage is applied to its gate, depending on whether it is in the selected or unselected mode. Specifically, in the selected mode, the gate of the NMOS transistor is applied with the stepped-up voltage, or a high voltage raised from the power supply voltage, the output (drain) is supplied with a boosted voltage higher than the high voltage by at least the threshold voltage of the NMOS transistor so as to achieve complete transfer. In the unselected mode, the gate is applied with the ground.

With the high-voltage switching circuit, although the magnitude of the high boosted voltage required depends on the threshold voltage of the NMOS transistor, the boosted voltage must be made as low as possible to improve the reliability of the transistor. Therefore, the threshold voltage of the NMOS transistor must be made as low as possible. Use of transistors with a low threshold voltage would result in a poorer cut-off characteristic, increasing a leakage current from the high voltage when the high voltage is not transferred. Specifically, even when the output and the gate of the NMOS transistor are grounded, the transistor is not cut off, permitting the input or a leakage current from the high voltage to increase. In this way, because the high voltage is obtained by stepping up the power-supply voltage, as the leakage current increases, a desired high voltage cannot be output.

SUMMARY OF THE INVENTION

An object of the present invention is to provide a semiconductor memory device which, even if only n-channel MOS transistors whose threshold voltage is low are used as Vpp-route transistors to constitute a circuit, is capable of reducing the power consumption in the stand-by condition, sufficiently stepping up a high voltage of Vpp, lowering the power supply voltage, and reducing the manufacturing cost.

Another object of the present invention is to provide a high-voltage switching circuit which, even if the threshold voltage of an NMOS transistor drops and its cut-off characteristic deteriorates, reduces a leakage current from the high voltage obtained by stepping up the power-supply voltage in the unselected mode and thereby prevents the high voltage from dropping.

A semiconductor memory device according to the present invention uses, for example, only n-channel MOS transistors whose threshold voltage is low as Vpp-route transistors. Only from the viewpoint of voltage transfer efficiency, all of the Vpp-route transistors that transfer the high voltage for erasing and writing are determined to be, for example, n-channel MOS transistors whose threshold voltage is low. To suppress leakage current, all of the block select circuits are brought into the selected state in the stand-by condition. Furthermore, a switching circuit is composed of a voltage transfer circuit made up of two Vpp-route transistors connected in series and sharing the gate electrode and a bias circuit that is connected to the series connection and activated so as to apply a bias to suppress a leakage current when the voltage is not transferred. To reduce the drawn current in the stand-by condition, the bias circuit is deactivated.

Furthermore, the distribution of the threshold voltage after writing is measured and the writing voltage is regulated on the basis of the threshold voltages with distribution rates larger than a specific value. In addition, the memory cells with the threshold voltages a specific value or more away from these threshold voltages are relieved.

Concrete configurations of a semiconductor memory device according to the present invention are as follows.

A semiconductor memory device comprises: an array of electrically rewritable memory cells laminated which are arranged in a matrix; erasing means for applying an erasing voltage to the memory cells to effect erasing; and writing means for applying a writing voltage to the memory cells to effect writing, and is characterized in that, in the erasing means and writing means, one of MOS transistors to which a voltage higher than the erasing voltage and writing voltage is applied and MOS transistors which transfer a voltage higher than the erasing voltage and writing voltage contain MOS transistors which are in a weak inversion state or an inversion state with their substrate bias voltage, gate voltage and source voltage at 0 V. Each of the memory cells is composed of a charge storage layer and a control gate laminated together on a semiconductor layer and composed of a source and a drain at a surface of the semiconductor substrate.

Another semiconductor memory device comprises: an array of electrically rewritable memory cells laminated which are arranged in a matrix; erasing means for applying an erasing voltage to the memory cells to effect erasing; and writing means for applying a writing voltage to the memory cells to effect writing, and is characterized in that in the erasing means and writing means, either MOS transistors to which a voltage higher than the erasing voltage and writing voltage is applied or MOS transistors which transfer a voltage higher than the erasing voltage and writing voltage contain MOS transistors composed only of MOS transistors of a first type, the MOS transistors being in a weak inversion state or an inversion state with their substrate bias voltage, gate voltage and source voltage at 0 V. With this configuration, the MOS transistors are n-channel MOS transistors and has the following preferred features.

(1) A voltage to be transferred is applied to the source under a conditions that the substrate bias voltage is at 0 V and gate voltage and drain voltage are at power-supply voltage, and are in a cut-off state under a condition the substrate bias voltage and gate voltage are at 0 V.

(2) The MOS transistors are in an inversion state under the conditions that the substrate bias voltage is at 0 V and the source voltage is the erasing voltage and writing voltage and that the gate voltage is the erasing voltage and the writing voltage added with the power-supply voltage.

(3) The MOS transistors are n-channel MOS transistors and are in a cut-off state under the condition at a voltage transferred to the source with the substrate bias voltage at 0V and the gate and drain voltages at the power supply voltage is applied to the drain with the substrate bias voltage, source voltage and gate voltage at 0 V.

A still another semiconductor memory device comprises: an array of electrically rewritable memory cells laminated which are arranged in a matrix; erasing means for applying an erasing voltage to the memory cells to effect erasing; and writing means for applying a writing voltage to the memory cells to effect writing, and in characterized in that in the erasing means and writing means, either MOS transistors to which a voltage higher than the erasing voltage and writing voltage is applied or MOS transistors which transfer a voltage higher than the erasing voltage and writing voltage are composed of two types of MOS transistors, a first type and a second type, the second-type MOS transistors being n-channel MOS transistors that are in an inversion state with the substrate bias voltage at 0 V and the gate and source voltages at a power-supply voltage and in a cut-off state with the substrate bias voltage and gate voltage at 0 V and the source voltage at the power-supply voltage, and the first-type MOS transistors being n-channel MOS transistors that are in a weak inversion state or an inversion state with the substrate bias voltage, gate voltage, and source voltage at 0 V and have a threshold voltage higher than that of the second-type n-channel MOS transistors. With this configuration, the first-type n-channel MOS transistors are n-channel MOS transistors and a voltage to be transferred is applied to the source under a conditions that the substrate bias voltage is at 0 V and gate voltage and drain voltage are at power-supply voltage, and are in a cut-off state under a condition the substrate bias voltage and gate voltage are at 0 V. Further more, the first-type n-channel MOS transistors are in an inversion state under the conditions that the substrate bias voltage is at 0 V and the source voltage is the erasing voltage and writing voltage and that the gate voltage is the erasing voltage and the writing voltage added with the power-supply voltage. The first-type n-channel MOS transistors are in a cut-off state under the conditions that a voltage transferred to the source with the substrate bias voltage at 0 V and the gate and drain voltages at the power-supply voltage is applied to the drain with the substrate bias voltage, source voltage and gate voltage at 0 V, and are in an inversion state under the conditions that the substrate bias voltage is at 0 V and the source voltage is the erasing voltage and writing voltage and that the gate voltage is the erasing voltage and the writing voltage added with the power-supply voltage.

Another semiconductor memory device is characterized by comprising: a memory cell array where memory cells are arranged in a matrix, the memory cells forming a plurality of memory cell groups; block select circuits for selecting memory cell blocks containing the plurality of memory cell groups; and means for bringing all of the block select circuits into a block-selected state in a stand-by condition. A still another semiconductor memory device comprises: an array of electrically rewritable memory cells laminated which are arranged in a matrix, the memory cells forming a plurality of memory cell groups; erasing means for applying an erasing voltage to the memory cells to effect erasing; writing means for applying a writing voltage to the memory cells to effect writing; and block select circuits for selecting memory cell blocks containing the plurality of memory cell groups, wherein in the erasing means and writing means, MOS transistors to which a voltage higher than the erasing voltage and writing voltage is applied or transferred are in a weak inversion state or an inversion state with their substrate bias voltage, gate voltage and source voltage at 0 V, and the erasing means and writing means contain means for bringing all of the block select circuits into a block-selected state in a stand-by condition.

With above configurations, the block select circuits contains voltage conversion circuits, each composed of a block address decoder and a MOS transistor of a first-conductivity type connected to the block address decoder and further comprises a block control circuit that receives the outputs of the block select circuits and controls the memory-cell blocks, in which the block control circuit is a voltage transfer circuit composed of the first-conductivity-type MOS transistor whose gate electrode is connected to the block select circuit.

A semiconductor memory device is characterized by comprising: an array of electrically rewritable memory cells laminated which are arranged in a matrix; data storage circuit for temporarily storing the writing data; erasing means for erasing the data in the memory cells; and test means for performing an erasure operation without selecting any memory cell and at the same time, deactivating the data storage circuit.

Another semiconductor memory device comprises: a memory cell array in which memory cells are arranged in a matrix; and memory-cell control means for controlling the memory cells, and is characterized in that the memory cell control means contains a switching circuit comprising a charge transfer circuit where the source electrode of a first MOS transistor is connected to the drain electrode of a second MOS transistor and the gate electrode of the first MOS transistor is connected to the gate electrode of the second MOS transistor and a bias circuit that applies a bias voltage to the source electrode of the second MOS transistor and the drain electrode os the second MOS transistor so as to electrically disconnect the drain electrode of the first MOS transistor from the source of the second MOS transistor in case that the switching circuit is unselected and that does not apply the bias voltage to the source electrode of the first MOS transistor and the drain electrode of the second MOS transistor so as to electrically connect the drain electrode of the first MOS transistor to the source electrode of the second MOS transistor in case that the switching circuit is selected, the bias circuit being deactivated in a stand-by condition.

A still another semiconductor memory device comprises: an array of electrically rewritable memory cells laminated which are arranged in a matrix; erasing means for erasing the data in the memory cells; writing means for writing the data into the memory cells; writing voltage regulating means for regulating a writing voltage; and threshold-voltage sensing means for measuring the threshold voltages of the memory cells, and is characterized in that the data in more than a specific number of memory cells is erased and then writing is effected into the erased memory cells, the threshold voltages of the memory cells into which the writing has been done are sensed and the threshold voltage distribution is measured, and the writing voltage is regulated on the basis of the threshold voltages with distribution rates larger than a specific value.

Another semiconductor memory device comprises: an array of electrically rewritable memory cells laminated which are arranged in a matrix; erasing means for erasing the data in the memory cells; erasing voltage regulating means for regulating an erasing voltage; writing means for writing the data into the memory cells; and threshold voltage sensing means for measuring the threshold voltages of the memory cells, and is characterized in that writing is effected into more than a specific number of memory cells and then the erasing of the written memory cells is effected, the threshold voltages of the memory cells from which the data has been erased are sensed and the threshold voltage distribution is measured, and the erasing voltage is regulated on the basis of the threshold voltages with distribution rates larger than a specific value.

A still another semiconductor memory device comprises: an array of electrically rewritable memory cells laminated which are arranged in a matrix; erasing means for erasing the data in the memory cells; writing means for writing the data into the memory cells; threshold voltage sensing means for measuring the threshold voltages of the memory cells; and redundant memory cells for replacing defective memory cells, and is characterized in that the data in more than a specific number of memory cells is erased and then writing is effected into the erased memory cells, the threshold voltages of the memory cells into which the writing has been done are sensed and the threshold voltage distribution is measured, and the memory cells with the threshold voltages more than a specific value away from the threshold voltages with distribution rates larger than a specific value are replaced by redundant memory cells.

Another semiconductor memory device comprises: an array of electrically rewritable memory cells laminated which are arranged in a matrix; erasing means for erasing the data in the memory cells; writing means for writing the data into the memory cells; threshold voltage sensing means for measuring the threshold voltages of the memory cells; and redundant memory cells for replacing defective memory cells, and is characterized in that writing is effected into more than a specific number of memory cells and then the erasing of the written memory cells is effected, the threshold voltages of the erased memory cells are sensed and the threshold voltage distribution is measured, and the memory cells with the threshold voltages more than a specific value away from the threshold voltages with distribution rates larger than a specific value are replaced by redundant memory cells.

A high-voltage switching circuit for outputting a high voltage applied to an input terminal to an output terminal in the selected mode and electrically disconnecting the input terminal from the output terminal in the unselected mode, the high-voltage switching circuit is comprises: a first NMOS transistor having a gate, a source, and a drain coupled to the input terminal; a second NMOS transistor having a gate, a source coupled to the output terminal, and a drain coupled to the source of the first NMOS transistor; and a third NMOS transistor having a gate, a source coupled to the source of the first NMOS transistor, and a drain to which a power-supply voltage is applied, and is characterized in that the gates of the first and second NMOS transistors are coupled to an ON voltage to transfer the high voltage applied via the input terminal to the drain of the first NMOS transistor to the source of the second NMOS transistor in the selected mode, and are grounded in the unselected mode, and the gate of the third NMOS transistor is grounded in the selected mode and is coupled to the power-supply voltage in the unselected mode. The circuit is characterized by further comprising a booster which is coupled to the gates of the first and second NMOS transistors and which is deactivated in the unselected mode and activated in the selected mode, and the first and second NMOS transistors turn off when the booster is deactivated, and a high voltage applied to the drain of the first NMOS transistor is disconnected from the source of the second NMOS transistor, whereas they are turned on by a boosted voltage outputted from the booster when the booster is activated, and a high voltage applied to the drain of the first NMOS transistor is transferred to the source of the second NMOS transistor.

In addition to the above embodiments, other preferable embodiments are:

(1) n-channel MOS transistor are formed on a first semiconductor layer which is grounded.

(2) n-channel MOS transistors of a first type and a second type are formed on a first semiconductor layer which is grounded.

(3) A block control circuit controls the word lines of memory cells.

(4) n-channel MOS transistors of a first type are in a weak inversion state with the substrate bias voltage, gate voltage, and source voltage at 0 V.

(5) n-channel MOS transistors of a first type are in a very weak inversion state or in a cut-off state with the substrate bias voltage at 0 V and the gate and source voltages at a power-supply voltage.

With the present invention, although, for example, only n-channel MOS transistors with a low threshold voltage are used as Vpp-route transistors, reducing leakage current makes it possible to realize NAND-cell EEPROMs which can be manufactured at low cost, have a low power consumption, and operate efficiently even on a low power-supply voltage.

With a semiconductor memory device of the present invention, high-withstand-voltage transistors to which a writing voltage or an erasing voltage is applied can be made up only of such transistors as are in an inverted or a weak inversion state when the threshold voltage is low and the gate voltage, source voltage, and substrate voltage are at 0 V. Furthermore, the high-withstand-voltage transistor may be limited to only one type. A leakage current liable to develop in the stand-by condition because of the low threshold voltage can be suppressed by bringing all of the block select circuits into the block-selected state in the stand-by condition. In a switching circuit provided with a bias circuit that biases the point where two such high-withstand-voltage transistors are connected in series, a leakage current can be suppressed by deactivating the bias circuit in the stand-by condition. This enables operation even on the low power-supply voltage, realizing the low-cost manufacturing of semiconductor memory devices.

Furthermore, with a semiconductor memory device according to the present invention, a stress test can be conducted at high speeds by deactivating the data storage circuit that temporarily stores the writing data in a peripheral circuit voltage stress test during an erase operation. This enables greater throughput in the test processing, realizing the low-cost manufacturing of semiconductor memory devices.

In the unselected mode, the source voltage of the third NMOS transistor goes to a voltage lower than the power-supply voltage by the threshold voltage of the NMOS transistor. Therefore, the cut-off characteristic of the first NMOS transistor improves, and a leakage current from the high voltage is reduced. Since a leakage current from the second NMOS transistor comes from the power-supply voltage applied to the power-supply terminal, the high voltage will not drop.

In the selected mode, the gate voltage applied to the first and second NMOS transistors rises to the boosted voltage level of a high voltage, and the gate voltage applied to the gate of the third NMOS transistor drops to the ground. At this time, since the source of the third NMOS transistor is connected to the power-supply voltage, its gate is grounded, and its drain is at a high voltage, the third NMOS transistor turns off, preventing a leakage current from the high voltage. Therefore, the high voltage applied to the input terminal is supplied, without lowering in level, as an output voltage to the output terminal via the drain-source of the first and second NMOS transistors.

With the present invention, even when the threshold voltage of the NMOS transistor drops and the cut-off characteristic deteriorates, the stepped-up voltage can be prevented from dropping by reducing a leakage current from the stepped-up voltage in the unselected mode of the high-voltage switching circuit.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a block diagram of a NAND-cell EEPROM according to an embodiment of the present invention;

FIGS. 2A to 2C are characteristic diagrams of a high-withstand-voltage MOS transistor;

FIGS. 3A to 3E show the structures of a high-voltage switching circuit;

FIG. 5 shows the structure of a block select circuit and a block control circuit;

FIG. 6 shows the structure of a main bit-line control circuit, a sub bit-line control circuit, and a data latch/sense amplifier circuit;

FIG. 8 is a timing chart to help explain a read operation;

FIG. 9 is a timing chart to help explain a write operation;

FIG. 10 is a timing chart to help explain a write operation;

FIGS. 16A and 16B show concrete structures of the control circuit;

FIGS. 18A and 18B show concrete structures of the control circuit;

FIG. 24 shows a concrete structure of the control circuit;

FIG. 26 shows a concrete structure of the control circuit;

FIG. 27 shows a concrete structure of the control circuit;

FIG. 28 shows a concrete structure of the control circuit;

FIG. 30 shows a concrete structure of the control circuit;

FIG. 31 shows a concrete structure of the control circuit;

FIG. 36 shows a concrete structure of the control circuit;

FIG. 38 shows a concrete structure of the control circuit;

FIG. 43 is a timing chart to help explain the operation of the control circuit;

FIG. 45 is a timing chart to help explain the operation of the control circuit;

FIG. 46 shows a concrete structure of the control circuit;

FIG. 47 is a timing chart to help explain the operation of the control circuit;

FIG. 48 shows a concrete structure of the control circuit;

FIG. 49 is a timing chart to help explain the operation of the control circuit;

FIG. 50 shows a concrete structure of the control circuit;

FIG. 51 is a timing chart to help explain the operation of the control circuit;

FIGS. 52A and 52B show concrete structures of the control circuit;

FIG. 53 shows a concrete structure of the control circuit;

FIG. 54 shows a concrete structure of the control circuit;

FIG. 55 is a timing chart to help explain the operation of the control circuit;

FIG. 56 is a timing chart to help explain the operation of the control circuit;

FIG. 57 shows a concrete structure of the control circuit;

FIG. 58 shows the distribution of threshold voltages after the data has been written into memory cells;

FIGS. 59A and 59B show an algorithm for a method of trimming the writing voltage and sensing discrete bits;

FIG. 60 is an another block diagram of a NAND-cell EEPROM according to an embodiment of the present invention;

DETAILED DESCRIPTION OF THE PREFERRED EMBODIMENTS

Figure 3C:
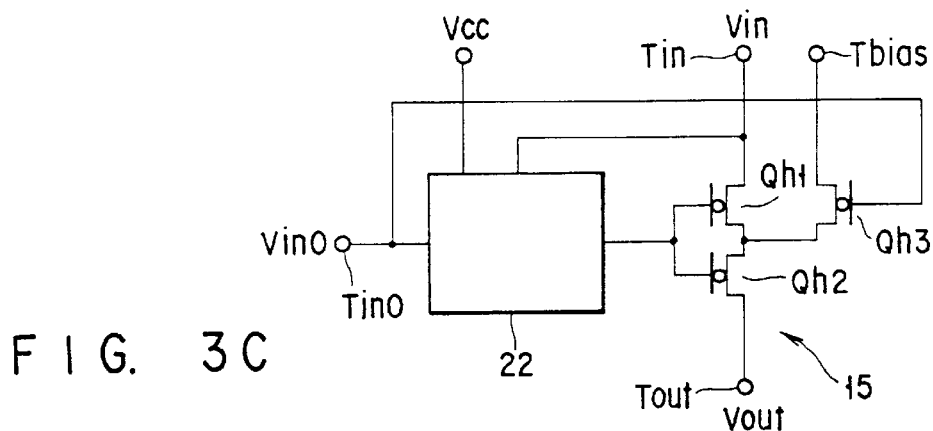

Hereinafter, referring to the accompanying drawings, embodiments of the present invention will be explained.

FIG. 1 shows the structure of a NAND-cell EEPROM according to an embodiment of the present invention. Bisected memory cell arrays 1A, 1B are provided with main bit-line control circuits 2A, 2B and sub bit-line control circuits 3A, 3B, respectively. A memory cell array 1 is provided with a data latch/sense amplifier circuit 4 that functions as a sense amplifier in a read operation and as a writing data latch circuit in a write operation. The main and sub bit-line control circuits 2A, 2B, 3A, 3B, and data latch/sense amplifier circuit 4 are controlled by a column control circuit 5.

Block select circuits 7A, 7B that receive the output of a block address buffer 8 and select blocks and word-line control circuits 6A, 6B that control the word lines of the selected blocks are provided in the memory cell arrays 1A, 1B, respectively. The block select circuits 7A, 7B and word-line control circuits 6A, 6B are controlled by a row control circuit 9.

To control a cell well in which the memory cell array 1 is formed and the source lines of the memory cells, a cell-well control circuit 10 and a cell-source control circuit 11 are provided.

The voltages Vpp (up to 20 V), $V_{m10}$ (up to 10 V), and $V_{m8}$ (up to 8 V) necessary for writing and erasing are stepped up from a power supply voltage of Vcc (e.g., 3 V) at a Vpp charge pump circuit 12, a $Vm_{10}$ charge pump circuit 13, and a $V_{m8}$ charge pump circuit 14, respectively.

FIG. 2A shows a high-withstand-voltage n-channel MOS transistor (hereinafter, referred to as an HVNMOS transistor) Qh used in the present embodiment and applied with the voltage Vpp. FIGS. 2B and 2C show static characteristics of the transistor. In the characteristic diagrams, the drain current Id is shown with the gate voltage Vg as a parameter in the case where the source and substrate are grounded as shown in FIG. 2A and a voltage is applied -to the drain so that the transistor may operate like a pentode. A threshold voltage of Vt is defined as shown in FIG. 2B. The threshold voltage Qh of the HVNMOS transistor is lower than that of an enhanced type transistor and is not cut off even if the gate voltage Vg is 0 V as shown in FIG. 2C, i.e., is in a weak inversion state. The threshold voltage Vt may be negative. It is desirable, however, that the threshold voltage Vt should be positive and in the weak inversion state with the gate voltage Vg being 0 V.

The substrate bias voltage may be applied as required according to the operation. It is desirable, however, that the substrate should be grounded.

FIG. 3A shows a high-voltage switching circuit (hereinafter, referred to as a switching circuit) composed of HVNMOS transistors Qh. A first and second HVNMOS transistors Qh1 and Qh2 are connected together at node N1 and both have a gate voltage of V1. A bias circuit 15 is connected to node N1. Hereinafter, the substrate bias in an n-channel MOS transistor is at 0 V unless otherwise specified.

When the drain voltage Vin of HVNMOS transistor Qh1 is transferred to the source voltage Vout of HVNMOS transistor Qh2, voltage V1 is set higher than Vin+Vt (sub=Vin). Vt (sub=Vsub) is the threshold voltage of HVNMOS transistor at the time when the substrate bias is −Vsub. At this time, the bias circuit 15 is in the deactivated state so as to have no effect on node N1.

When voltage Vin is electrically cut off from voltage Vout, V1 is set at a sufficiently low voltage (e.g., 0 V) and the activated bias circuit 15 applies a sufficiently high specific voltage to node N1. With the sufficiently high voltage Vin or Vout, HVNMOS transistor Qh1 or Qh2 is in the cut-off state, electrically cutting off voltage Vin from Vout. Furthermore, when the switching circuit is in the stand-by condition, the bias circuit 15 is also in the deactivated state.

A more concrete circuit diagram of the switching circuit is given in FIG. 3B and a concrete operation of the embodiment will be explained.

The switching circuit is provided in, for example, the power-supply circuit of the semiconductor memory device and applies to the semiconductor memory circuit the high voltage Vin obtained by stepping up a power-supply voltage Vcc. The switching circuit is made up of a first to third HVNMOS transistors Qh1 to Qh3. The drain of the first NMOS transistor Qh1 is connected to input terminal Tin to which high voltage Vin is applied and its source is connected to the drain of the second HVNMOS transistor Qh2. The source of the second NMOS transistor Qh2 is connected to output terminal Tout that supplies output voltage Vout. The gates of the first and second HVNMOS transistors Qh1, Qh2 are connected to the gate voltage.

The connection, or node, between the first NMOS transistor Qh1 and the drain of the second NMOS transistor Qh2 is connected to the source of the third HVNMOS transistor Qh3. The drain of the third HVNMOS transistor Qh3 is connected to input terminal Tbias and its gate is selectively connected to the signal of the power-supply voltage and the ground.

In the above circuit, the power supply Vbias for the bias circuit has, for example, a power-supply voltage of Vcc (up to 3 V). Voltage Vin is the stepped-up voltage Vpp (up to 20 V). When this voltage is transferred to Vout, voltage V1 is set at Vpp+Vt (sub=Vpp) or more. The control voltage V2 of the bias circuit is set at 0 V, for example. When the source and drain are at Vcc, the substrate bias and the gate is at 0 V, and the HVNMOS transistor Qh is in the cut-off state, voltage Vin is transferred to Vout only.

Even when the control voltage V2 of the bias circuit is, for example, Vcc, there is no problem as long as no charge is transferred from node N1 to Vbias by the back bias effect.

When voltage Vin is the stepped-up voltage Vpp (up to 20 V) and electrically cut off Vout, voltage V1 is set at 0 V, for example. Furthermore, voltage V2 is Vcc, for example. When the voltage at node N1 transferred by HVNMOS transistor Qh3 is Vn1, the source and drain are at Vn1, and the substrate bias and gate are at 0 V, and the HVNMOS transistor Qh is in the cut-off state, this brings HVNMOS transistor Qh1 into the cut-off state, electrically cutting off voltage Vpp inputted to Vin from Vout.

For example, when the NAND-cell EEPROM of the present embodiment is in the stand-by condition (all of the circuits are in the stand-by condition), the switching circuit of FIG. 3B is also in the stand-by condition with voltage V1, for example, at 0 V. With voltage Vout at 0 V, when voltage V2 is, for example, at Vcc, Vcc serving as voltage Vbias leaks to Vout. As a result, when the switching circuit is in the stand-by condition, voltage V2 is set at, for example, 0 V, deactivating the bias circuit 15. This reduces the leakage current from Vbias to Vout remarkably. In the stand-by condition, Vin is often at about Vcc, so that there is a leakage current from Vin to Vout. The leakage current, however, is much smaller than the leakage current from Vbias to Vout in the case where voltage V2 is, for example, at Vcc.

The operation will be explained in more detail about the selected mode and the unselected mode.

In the unselected mode, gate voltage V1 applied to the gates of the first and second NMOS transistors Qh1 and Qh2 is at the ground, and gate voltage V2 applied to the gate of the third HVNMOS transistor Qh3 is at the power-supply voltage level. At this time, the source voltage of the third HVNMOS transistor Qh3 is lower than the power-supply voltage Vcc by the threshold voltage of HVNMOS transistor Qh1. As a result, the cut-off characteristic of HVNMOS transistor Qh3 improves, reducing the leakage current from the stepped-up voltage Vin. In contrast, because the source (Vout) of the second HVNMOS transistor Qh2 and its gate are at the ground, a leakage current as large as in a conventional equivalent develops. The leakage current, however, stems from the power-supply voltage Vcc applied to terminal Tbias, so that the stepped-up voltage Vin will not drop.

In the selected mode, gate voltage V1 applied to the gates of the first and second HVNMOS transistors Qh1 and Qh2 is at the boosted voltage level of high voltage Vin, and gate voltage V2 applied to the gate of the third HVNMOS transistor Qh3 is at the ground. At this time, since the source of the third HVNMOS transistor Qh3 is connected to the power supply voltage Vcc, its gate is grounded, and its drain is at the stepped-up voltage Vin, the third HVNMOS transistor Qh3 is off, preventing a leakage current from the stepped-up voltage Vin. Therefore, the high voltage Vin applied to input terminal Tin is supplied, without its level being dropped, as output voltage Vout to output terminal Tout via the drains and sources of the first and second HVNMOS transistors Qh1 and Qh2.

Another structure of the switching circuit is shown in FIG. 3C.

In this switching circuit, a switching main section 15 has a similar structure to that of the embodiment of FIG. 3B and is composed of the first, second, and third HVNMOS transistors Qh1, Qh2, and Qh3. A booster 22 is connected between the switching main section 15 and control input (Vin0) terminal Tin0, which constitutes a switching circuit.

With the switching circuit, in the unselected mode, Vin terminal Tin0 is at a high level, the booster 22 is deactivated, and the output terminal of the booster 22 is grounded. As a result, the HVNMOS transistors Qh1 and Qh2 are off, electrically disconnecting the high voltage Vin from the output Vout.

In the selected mode, Vin terminal Tin0 is at a low level. At this time, the booster 22 is activated, outputting a boosted voltage of the high voltage Vin. The boosted voltage causes the HVNMOS transistors Qh1 and Qh2 to turn on, which enables the high voltage Vin applied to the drain of the HVNMOS transistor Qh1 to be transferred to the source of the HVNMOS transistor Qh2 and then outputted at the output (Vout) terminal 15. Thereafter, to cut off the HVNMOS transistors Qh1 and Qh2, Vin terminal Tin0 is placed at the high level. At this time, the booster 22 is reset and the output terminal is grounded.

With the above-described switching circuit, in the unselected mode, the control input Vin is at a high level, the source voltage of the NMOS transistor Qh1 is lower than the power-supply voltage Vcc by the threshold voltage of the HVNMOS transistor Qh3. As a result, the cut-off characteristic of HVNMOS transistor Qh1 is improved, reducing a leakage current from the stepped-up voltage vin. Because the source (Vout) and gate of the HVNMOS transistor Qh2 are grounded, a leakage current as large as in a conventional equivalent develops as shown in FIG. 3B. The leakage current comes from the power-supply voltage Vcc, so that the problem that the stepped-up voltage Vin drops will not arise.

On the other hand, in the selected mode, the control input Vin is at a low level, so that the source of the HVNMOS transistor Qh3 is at the power-supply voltage level, the gate is at the ground, and the drain is at the stepped-up voltage Vin. Therefore, the HVNMOS transistor Qh3 is off, preventing a leakage current from the stepped-up voltage Vin. Consequently, the high voltage Vin applied to input terminal Tin is supplied, without its level being dropped, as output voltage Vout to output terminal Tout via the drains and sources of the first and second HVNMOS transistors Qh1 and Qh2.

Figure 3D:
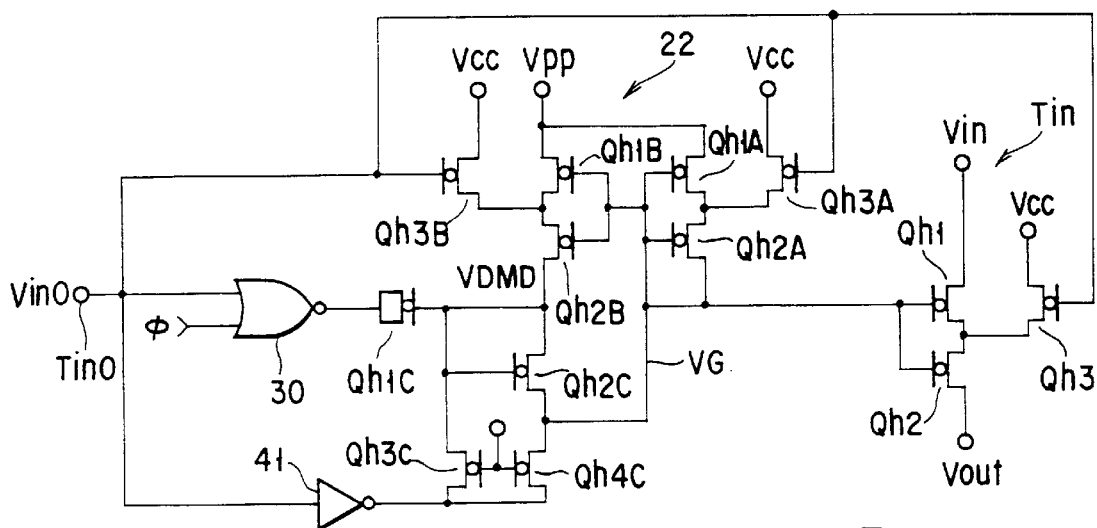

Still another structure of the switching circuit is shown in FIG. 3D.

The booster 22 of FIG. 3C is composed of a NOR gate 30, HVNMOS transistors Qh1A to Qh4C, and an inverter 41. A first input terminal of NOR gate 30 is connected to Vin terminal Tin0 and a second input terminal of NOR gate 30 is connected to a clock ($\phi$) terminal. The gate of HVNMOS transistor Qh3B is connected to Vin terminal Tin0, its drain is connected to a Vcc terminal, and its source is connected to the source-drain connection node between HVNMOS transistors Qh1B and Qh2B. The source of HVNMOS transistor Qh2B is connected to not only the drain and source of a HVNMOS transistor Qh2C but also the drain of an HVNMOS transistor Qh3C. The gate of HVNMOS transistor Qh3C is connected to not only the gate of an HVNMOS transistor Qh4C but also the Vcc terminal. The drain of HVNMOS transistor Qh4C is connected to not only the source of HVNMOS transistor Qh2C but also the gates of the HVNMOS transistors Qh1B, Qh2B, Qh1A, and Qh2A. The source-drain connection node between the HVNMOS transistors Qh1A and Qh2A is connected to the source of an HVNMOS transistor Qh3A. The source of HVNMOS transistor Qh2A is connected to its own gate. The source and drain of HVNMOS transistor Qh1C are connected together and to the output terminal of a NOR gate 30 and its gate is connected to the gate-drain connection node of HVNMOS transistor Qh2C. An inverter 41 is connected between Vin terminal and the source of HVNMOS transistor Qh3C. The high voltage Vin is applied to the drains of the HVNMOS transistors Qh1B and Qh1A.

The output of the booster 22 thus constructed, or the source of HVNMOS transistor Qh2A, is connected to the gates of the HVNMOS transistors Qh1 and Qh2 in the main switching section 15.

In the embodiment of FIG. 3D, the booster 22 is provided with two switching circuits of FIG. 3B. Namely, the booster 22 is provided with a circuit composed of the HVNMOS transistors Qh3B, Qh1B, Qh2B and a circuit composed of the HVNMOS transistors Qh1A, Qh2A, Qh3A.

With the above circuit, in the unselected mode, input Vin is at a high level. At this time, the gates of the HVNMOS transistors Qh1B, Qh2B, Qh2C, Qh1A, Qh2A, Qh1C are grounded. Since the source voltage of the HVNMOS transistors Qh1B, Qh1A, and 11 are lower than the power-supply voltage Vcc by the threshold voltage of the NMOS transistor, a leakage current from the stepped-up voltage Vin will not develop. Therefore, the stepped-up voltage will not drop.

In the selected mode, input Vin is at a low level. At this time, the voltage VPMP at the drain-gate connection node of HVNMOS transistor Qh2C, the source-gate connection node of HVNMOS transistor Qh2A, and the voltage V1 at the common connection node between the gates of HVNMOS transistors Qh1B, Qh2B, Qh1A and the source of HVNMOS transistor Qh2C are lower than the power-supply voltage Vcc by the threshold voltage of the NMOS transistor because of the presence of an inverter 41. An HVNMOS transistor Qh1C whose source and drain are connected together and which functions as a capacitor is driven by clock $\phi$ via the NOR gate 30. While the HVNMOS transistors Qh1B, Qh2B are operating in the pentode region, the HVNMOS transistor Qh1C is charged by the stepped-up voltage Vin to VPMP expressed by the following equation (1) during the time when clock $\phi$ is at a high level:

$$\text{VPMP} = V1 - Vt \quad (1)$$

Figure 40:
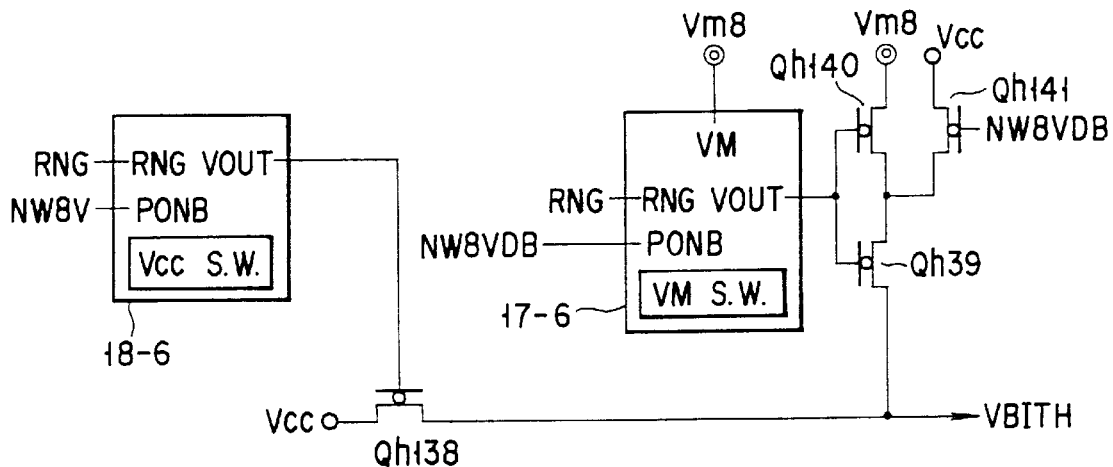
FIG. 40 shows a concrete structure of the control circuit.

The charge stored in the NMOS FIG. 40 when clock $\phi$ is at a low level is transferred to the source of the HVNMOS transistor Qh2C, with the result that voltage V1 increases by value A V1 expressed by the following equation (2):

$$\begin{aligned}\Delta V1 &= (VPMP + Vcc - Vt) - V1 \\ &= Vcc - 2Vt\end{aligned} \quad (2)$$

where Vt is assumed to meet the following expression (3):

$$Vt < Vcc/2 \quad (3)$$

In this way, during one cycle of clock $\phi$, voltage V1 increases by AV1 expressed by equation (2). This continues until voltage V1 becomes Vin+Vt. When voltage V1 has reached this value, the HVNMOS transistors Qh1A, Qh2A turn on, preventing these transistors from being boosted to a higher voltage unnecessarily. The value is equal to the necessary minimum to raise the output Vout to the stepped-up voltage Vin.

Figure 3E:
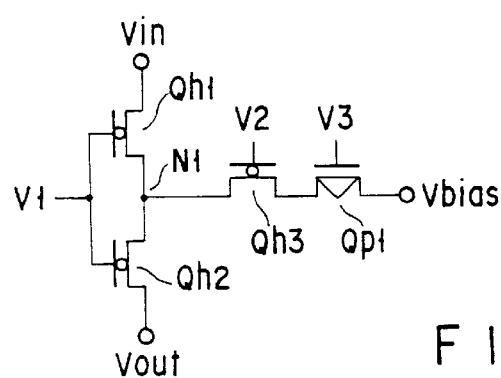

FIG. 3E shows still another structure of the switching circuit. An enhanced type p-channel MOS transistor (hereinafter, referred to as a PMOS transistor) Qp1 is connected in series between an HVNMOS transistor Qh3 and the voltage Vbias. The PMOS transistor, together with the HVNMOS transistor Qh3, constitutes a bias circuit 15. The PMOS transistor has no high-voltage withstand structure. Its gate voltage is V3. In the stand-by condition, voltage V3 is set at, for example Vcc, cutting off a leakage current from the voltage Vbias to Vout. In the non-stand-by condition (in the activated condition), V3 is set at, for example, 0 V. With the switching circuit, in the stand-by condition, voltage V2 may be, for example, Vcc. The PMOS transistor Qp1 is basically shared by a plurality of bias circuits 15 of FIG. 3B.

Since the switching circuits shown in FIGS. 3A to 3E are composed of HVNMOS transistors Qh whose threshold voltage is low, they have the advantages of suppressing the voltage V1 to a low level and lowering the gate insulating film breakdown voltage, when the high voltage Vpp applied to voltage Vin is transferred.

Figure 4:
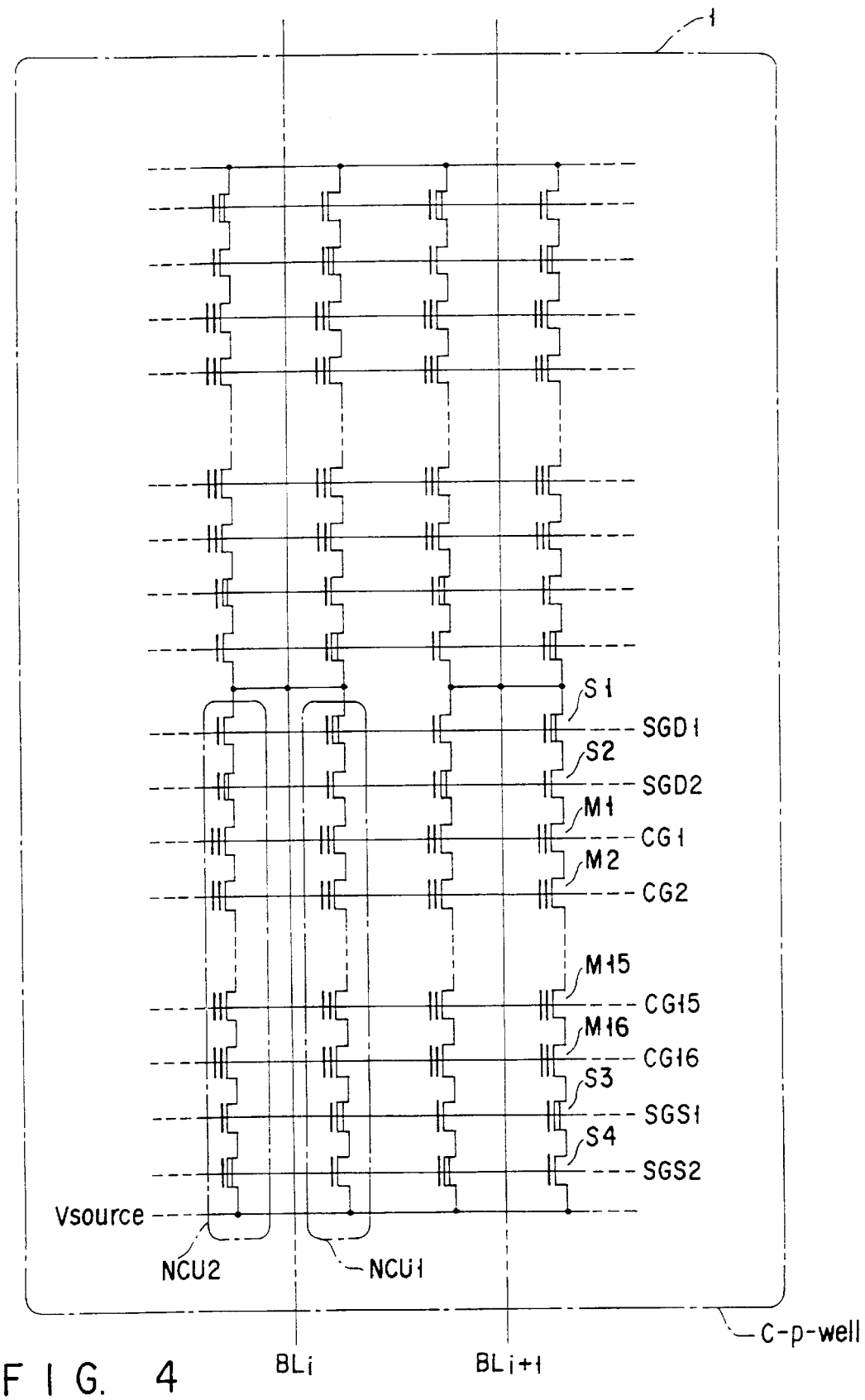
FIG. 4 shows the structure of a NAND memory-cell array.

FIG. 4 shows a concrete structure of the memory cell array 1. Memory cells M1 to M16 are connected in series. One end of the series connection is connected to a bit line BL via a depletion type select transistor S1 and an enhanced type select transistor S2, and the other end is connected to a common source line Vsource via a depletion type select transistor S3 and an enhanced type select transistor S4, thereby forming a NAND-cell unit NCU1.

The gate electrodes of the memory cells M1 to M16 are connected to the control gates CG1 to CG16, respectively, and are shared by a plurality of NAND-cell units. The NAND cell unit NCU2 adjacent to the NAND cell unit NCU1 sharing the control gate differs in the type of select transistor S1. This holds true for the select transistors S2 to S4. Specifically, in the case of the select transistors S1 sharing one select gate, for example, SGD1, depletion type ones and enhanced type ones are arranged alternately.

In the alternately arranged NAND-cell units NCU1 and NCU2, a pair of adjacent units shares a bit line BL. The NAND cell units sharing control gates CG1 to CG16 and select gates SGD1, SGD2, SGS1, and SGS2 constitute one block. A memory cell M and select transistor S are of the n-channel type. The memory cell array 1 is formed on a dedicated p-well C-p-well.

FIG. 5 concretely shows the word-line control circuit 6 and block select circuit 7 of FIG. 1 together with the memory cell array of FIG. 4.

HVNMOS transistors Qh20 to Qh24 and enhanced type n-channel MOS transistors (hereinafter, referred to as NMOS transistors) Qn4 constitute a select gate control circuit that controls a select gate, for example, SGD1. The NMOS transistor Qn has no high-voltage withstand structure. The circuit made up of the HVNMOS transistors Qh21 to Qh23 has the same configuration as that of the switching circuit composed of the HVNMOS transistors Qh1 to Qh3 shown in FIG. 3C to 3E. The HVNMOS transistor Qh25 constitutes a control gate control circuit that controls a control gate, for example, CG1. Four select gate control circuits and 16 control gate control circuits constitute a word-line control circuit 6 that controls the word lines for a single cell block.

Each word-line control circuit 6, using the output N2 of the block select circuit 7 as a block select signal, selectively transfers and applies the voltages VSGD1, VSGD2, VSGS1, VSGS2 common to each block and the voltages VCG1 to VCG16 to the control gates SGD1, SGD2, SGS1, SGS2 of the selected block and the control gates CG1 to CG16.

The block select circuit 7 is composed largely of two circuits. One circuit of the block select circuit 7 is a block address decoder made up of PMOS transistors Qp2 to Qp5, NMOS transistors Qn1 to Qn3, a fuse F1, inverters I1, I2, and NOR gates G1, G2. In a case where the fuse F1 is cut off or any one of block address signals RA, RB, RC is low, when a decoder activating inverted signal RDENBB is low, the output N3 of the block address decoder is low and in the block unselected state. At this time, a sub-decoder activating inverted signal RDENBBD is low, signal $\phi$ is high.

The other circuit of the block select circuit 7 is a voltage conversion circuit made up of a NAND gate G3, an inverter I3, and HVNMOS transistors Qh4 to Qh19. When node N3 is high and in the block selected state and a signal RNGRD oscillates, the output N2 of the block select circuit will be at a voltage of $V_{ppRW}+Vt$ (sub=$V_{ppRW}$). In the stand-by condition, all of the block select circuits 7 are in the block selected state with signal RDENBB at a high level and node N3 at a high level.

For the voltage conversion circuit to operate properly, it is desirable that Vt (sub=$V_{ppRW}$) of HVNMOS transistor Qh should be lower than Vcc. Furthermore, it is desirable that HVNMOS transistor Qh should be in a very weak inversion state or a cut-off state with the substrate bias at 0 V and the source and gate voltages at Vcc.

FIG. 6 shows a concrete structure of the main bit-line control circuit 2, sub bit-line control circuit 3, and data latch/sense amplifier circuit 4 of FIG. 1.

The main bit-line control circuit 2A is connected to the data latch/sense amplifier circuit 4 when the signal SA at the gate electrode of NMOS transistor Qn14 goes high. NMOS transistors Qn15 and Qn16, when a verify signal VRFYA goes high, charges the gate electrode of a depletion type n-channel MOS transistor Qd1 according to the data stored in the data latch/sense amplifier circuit 4. The channel in the depletion type n-channel MOS transistor can be formed without an additional manufacturing process, if it is formed at the same time that the channel of the depletion type select transistor in the memory cell array is formed. In place of the depletion type n-channel MOS transistor, a MOS capacitor may be formed of an HVNMOS transistor Qh.

When signal SR goes high and signal SS1 or SS2 goes high, this selectively connects bit line BL1 or BL2 in the memory cell array 1A to the main bit-line control circuit 2. To achieve this, NMOS transistors Qn17, Qn19, Qn20 and HVNMOS transistors Qh28, Qh29 are provided. The NMOS transistor Qn18 resets the bit line when signal RST is at a high level.

The main bit-line control circuit 2B has the same circuit configuration as that of the main bit-line control circuit 2A except that signal SB is set as control signal for signal SA and signal VRFYB is set as control signal for signal VRFYA according to the bit lines BL3, BL4 in the cell array 1B.

The data latch/sense amplifier circuit 4 comprises a flip-flop FF made up of NMOS transistors Qn11 to Qn13 and PMOS transistors Qp6 to Qp8, an NMOS transistor Qn10 acting as an equalizer circuit, NMOS transistors Qn21, Qn22 acting as column select gates, and a NOR circuit G4 acting as a column address decoder.

When signal $\phi N$ is high and $\phi p$ is low, this will activate the flip-flop FF; and when $\phi N$ is low and $\phi p$ is high, this will deactivate the flip-flop FF. When signal $\phi E$ goes high, the two terminals of the flip-flop are equalized. The voltage VBITH is a power-supply voltage for the flip-flop. When all of the column address inverted signals CADDBn (n=1, 2, 3) are low and column address decoder activating inverted signal CENBB is low, the column select gate will turn ON and the flip-flop FF will be connected to the data input/ output lines IOA, IOB.

The sub bit-line control circuit 3A comprises a bit-line select gate composed of HVNMOS transistors Qh26, Qh27 and NMOS transistors Qn5, Qn6, an NMOS transistor Qn7 for bit-line resetting, an NMOS transistor Qn8 for transferring a voltage of VA to a bit line, an NMOS transistor Qn9 serving as a bit-line voltage sensing circuit, and fuses F2, F3 for relieving defective bit lines.

The signals SS1 and SS2 selectively connect bit line BL1 or BL2 to the sub bit-line control circuit 3A. When signal RSTD is high, the bit line will be reset. When signal PRE is high, the bit line charging voltage VA will be transferred to the bit line. The output of the bit-line voltage sensing circuit is supplied as φDTCA. Bit lines with leak defects have the fuses F2, F3 cut off.

The sub bit-line control circuit 3B has the same circuit configuration as that of the sub bit-line control circuit 3A except that voltage VB is set for voltage VA and signal φDTCB is set for signal φDTCA according to the bit lines BL3, BL4 in the cell array 1B.

The operation of the memory cell array 1, main bit-line control circuit 2, sub bit-line control circuit 3, data latch/ sense amplifier circuit 4, word-line control circuit 6, and block select circuit 7 will be described with reference to FIGS. 7 to 13. In the figures, the cell array section indicates the memory cell array 1 section, the row decoder section indicates the sections of the word-line control circuit 6 and block select circuit 7, the sense amplifier section indicates the sections of the main bit-line control circuit 2, sub bit-line control circuit 3, and data latch/sense amplifier circuit 4.

Figure 7:
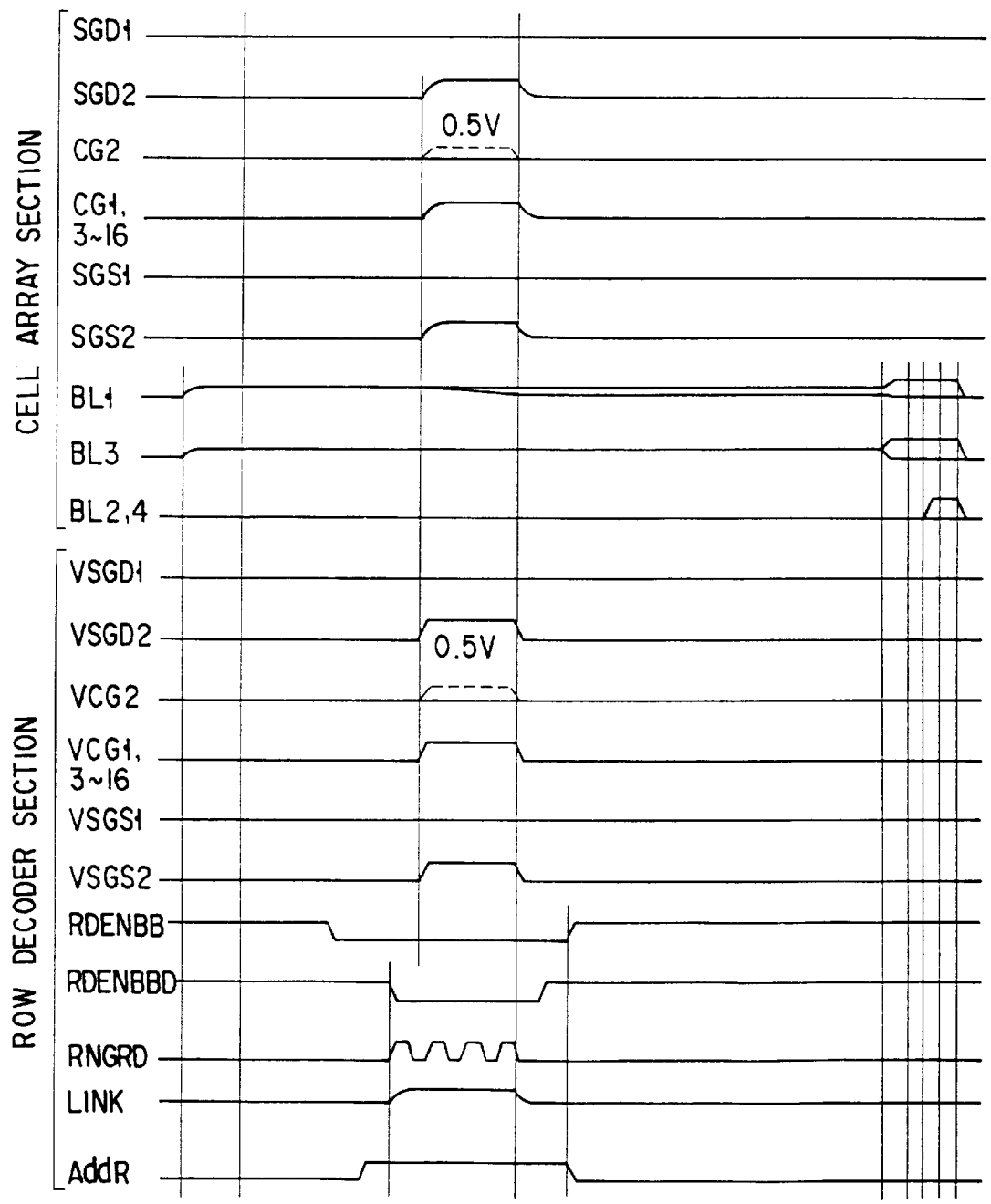
FIG. 7 is a timing chart to help explain a read operation.

FIGS. 7 and 8 show the timing for a read operation in the case where NAND cell unit NCU1 is selected, control gate CG2 is selected, and bit line BL1 is selected. In this case, bit line BL3 is a dummy bit line and bit lines BL2, BL4 are shielded lines.

First, when signal SS1 goes low, bit line BL1 is connected to the sub bit-line control circuit 3A, bit line BL2 is connected to the main bit-line control circuit 2A, bit line BL3 is connected to the sub bit-line control circuit 3B, and bit line BL4 is connected to the main bit-line control circuit 2B. Signal PRE goes high, allowing voltage VA (e.g., 1.2 V) and VB (e.g., 1.0 V) to charge the bit lines BL1, BL3, respectively. After the charging is complete, signal PRE goes low, following by signal SS2 going low, with the result that all of the bit lines are brought into the floating state. Signal RST goes low, and then signal RSTD goes high and SS1 goes high, so that the select bit line BL1 and dummy bit line BL3 are connected to the main bit-line control circuit 2 and the bit lines BL2, BL4 are connected to the sub bit-line control circuit 3 and grounded.

Only the block select circuit 7 whose block address signals RAn, RBn, RCn (in FIGS. 7 and 8, generally called AddR) all go high when signal RDENBB goes low, produces the output N2 of a high level. When signal RDENBBD goes low and signal RNGRD oscillates, the output N2 of the block select circuit 7 is stepped up to Vcc+Vt (sub=Vcc). Signal LINK is also stepped up to higher than Vcc+Vt (sub=Vcc).

When the signals VCG1, VCG3 to VCG16, VSGD2, VSGS2 go to Vcc, only the selected control gate CG2 goes to 0 V and the other control gates CG1, CG3 to CG16 go to Vcc. When the threshold voltage of memory cell M is higher than 0 V, the voltage of bit line BL1 remains unchanged; when the threshold voltage is lower than 0 V, the voltage of bit line BL1 drops below the voltage of dummy bit line BL3. In a write verify operation, VCG2 goes to, for example, 0.5 V and CG2 goes to 0.5 as shown by doted lines in FIGS. 7 and 8. It is when the threshold voltage of memory cell M is 0.5 V or less that the voltage of bit line BL1 drops below the voltage of dummy bit line BL3.

After the signals VSGD2, VSGS2, VCG1 to VCG16 are all at 0 V, signal RNGRD stops oscillating, and signal RDENBBD goes high, followed by RDENBB going high, signal SR goes low, with the result that the voltage of select bit line BL1 is taken into the gate electrode of depletion type n-channel MOS transistor Qd1 and the voltage of dummy bit line BL3 is taken into the gate electrode of depletion type n-channel MOS transistor Qd2. Thereafter, only in a write verify operation, signal VRFYA goes high, making the voltage of the gate electrode of depletion type n-channel MOS transistor Qd1 after "1" writing higher than the voltage of the gate electrode of depletion type n-channel MOS transistor Qd2.

Signals φN, φP go low and high, respectively, followed by signal φE going high, with the result that the data latch/sense amplifier circuit 4 is reset. Signals SA, SB go high, connecting the main bit-line control circuit 2 to the data latch/ sense amplifier circuit 4, with the result that signal φP goes low and φN goes high, allowing the voltage of the gate electrodes of the depletion type n-channel MOS transistors Qd1, Qd2 to be sensed. The sensed data is then latched. Signal SR goes high and the sensed data is transferred via bit line BL to the gate of NMOS transistor Qn9 serving as the bit-line voltage sensing circuit.

When the writing has been finished in a write verify operation, all of the dummy bit lines BL3 are low, so that signal φDCTB previously charged to a high level remains high. When the erasing has been finished in an erase verify operation, all of the select bit lines BL1 are low, so that signal φDCTA previously charged to a high level remains high.

In the present embodiment, sensing is effected by taking the voltage of bit line BL into the gate electrodes of depletion type n-channel MOS transistors Qd1, Qd2. By controlling signal SR as shown by a single-dot-dash line in FIGS. 7 and 8, bit line BL can be sensed directly.

During a read operation, the voltage $V_{ppRW}$ of the block select circuit 7 and the voltage VBITH of data latch/sense amplifier circuit 4 are the power-supply voltage Vcc.

FIGS. 9 and 10 show the timing for a write operation in the case where NAND cell unit NCU1 is selected, control gate CG2 is selected, and bit line BL1 is selected.

When signal RDENBB goes low, determining block address AddR, and signal RDENBBD goes low, allowing signal RNGRD to oscillate, the output N2 of the block select circuit becomes $V_{ppRW}$+Vt (sub=$V_{ppRW}$).

Signal SS2 goes low, connecting the selected bit line BL1 to the main bit-line control circuit 2A and the unselected bit line BL2 to the sub bit-line control circuit 3A. Signal RST goes low.

Signals VSGD2, VSGS1, VCG1 to VCG16, voltage Vsource, VA, signals PRE and VRFYA go to the power-supply voltage Vcc. At this time, the selected bit line BL1 is high in a "1" writing operation and low in a "0" writing operation. When signal VRFYA goes low and signal SA goes high, bit line BL1 is connected to data latch/sense amplifier circuit 4 via the main bit-line control circuit 2A.

Then, voltage Vsource, VA, VBITH go to the output $V_{m8}$ (up to 8 V) of the Vm8 charge pump circuit 14, signal LINK and voltage $V_{ppRW}$ go to the output $V_{ppw}$ (up to 18 V) of the Vpp charge pump circuit 12, and signals SS1, PRE, SA, SR go to the output Vm10 (up to 10 V) of the charge pump circuit 13.

Furthermore, signals VSGD2, VSGS1, VCG1, VCG3 to VCG16 go to Vm10. The timing with which these signals change may be the same as the timing that voltage VBITH is stepped up to Vm8. Then, signal VCG2 goes to $V_{ppW}$ and the selected control gate CG2 goes to writing voltage $V_{ppW}$. At this time, selected bit line BL1 is at Vm8 in a "1" writing operation, and at 0 V in a "0" writing operation. The unselected bit line BL2 is at Vm8. Therefore, only in the memory cell M into which "0" is written, the voltage difference between the voltage $V_{ppW}$ of the control gate CG and the channel voltage of 0 V causes electron injection in the charge storage layer, making the threshold voltage shift in the positive direction.

In the embodiment, bit line BL1, unselected bit line BL2, and Vsource voltage are placed at Vm8 in a "1" write operation. The channel of memory cell M may be at about Vm8 through the capacitive coupling between the control gate CG and the channel of memory cell M by making use of the fact that the control gates CG1 to CG16 is raised from Vcc to Vm10 or $V_{ppW}$ with bit lines BL1, BL2, source line Vsource, and select gates SGD2, SGS1 at Vcc. In this case, the signals take the forms as shown by dotted lines in FIGS. 9 and 10. The above scheme is called a channel floating scheme.

Signal VCG2 changes from $V_{ppW}$ to Vcc and the selected control gate CG2 goes to Vcc. Then, signals VSGD2, VSGS1, VCG1, VCG3 to VCG16 change from Vm10 to Vcc, resetting the individual signals and voltages to the stand-by condition. During the write operation, signal φN is Vcc and φp and φE are at 0 V.

Figure 11:
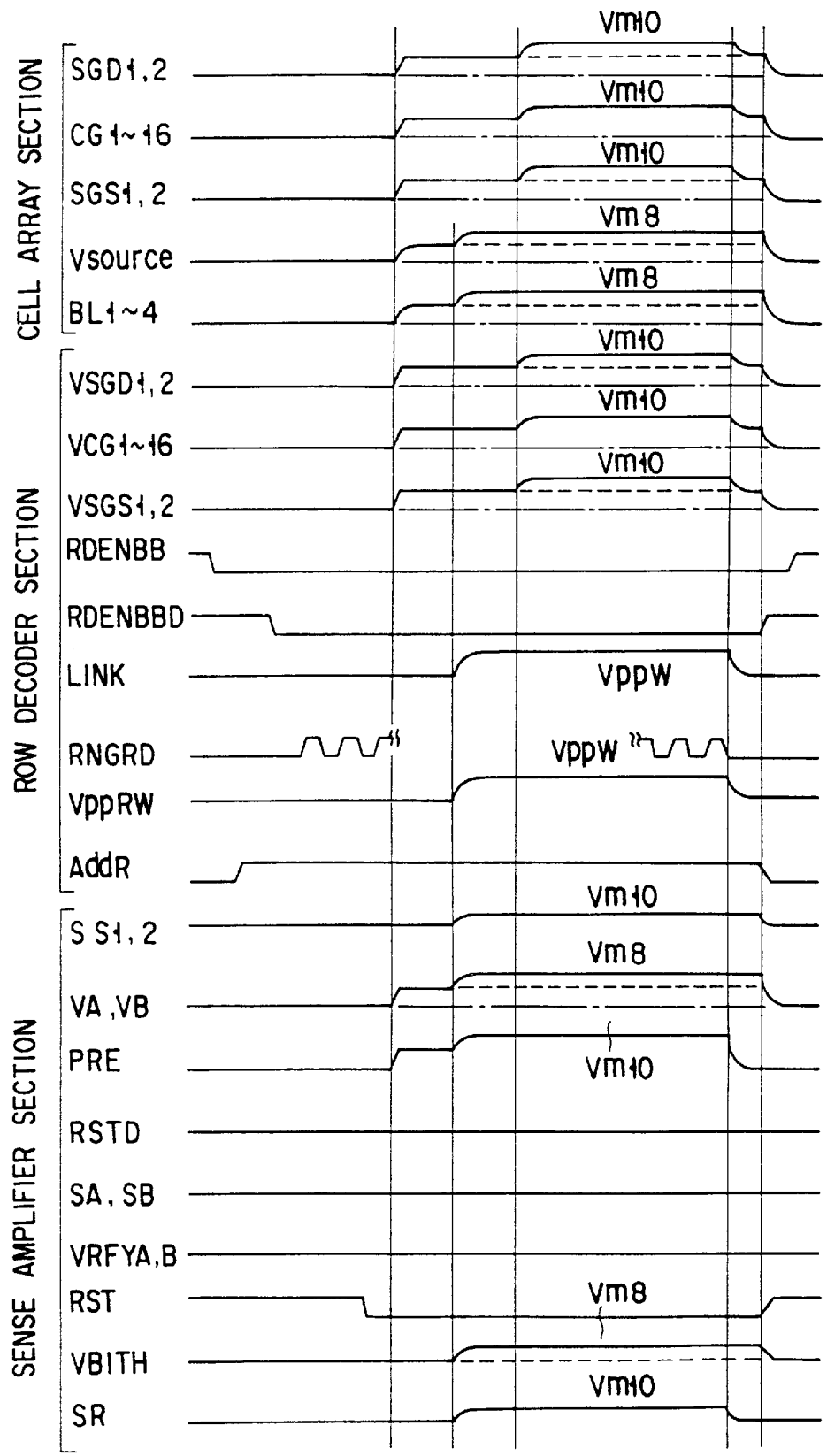
FIG. 11 is a timing chart to help explain the operation of conducting a stress test on the write peripheral circuit.

FIG. 11 shows the timing for the write stress test operation of the circuits except for the memory cell array to which voltages Vm8, Vm10, and $V_{ppW}$ are applied in the write operation.

The write stress test operation is basically the same as the write operation except that writing voltage $V_{ppW}$ is not applied to any control gates. Furthermore, control gates SGD1, SGD2, SGS1, SGS2 are selected at the same time, and signals SS1, SS2, voltages VA, VB are also selected simultaneously. Both of signals SA and SB remain low, preventing voltage stress from being applied to the memory cell array. A stress test in a case where Vm10 is applied to signals SA, SB is conducted during an erasure stress test, which will be explained later with reference to FIG. 13.

Furthermore, block addresses AddR are generated so as to select all of the blocks. At this time, the blocks whose fuses F1 are cut off in the block select circuit 7 are not selected. To select such blocks, signals RDENBB and RDENBBD are set high.

In FIG. 11, the solid lines are related to a first write stress test, where Vm10 is applied to the select gates and control gates in the memory cell array and Vm8 is applied to the bit lines and source lines. In the case of the write operation in the channel floating scheme explained using FIGS. 9 and 10, the results are shown by the dotted lines. The single-dot-dash lines in FIG. 11 indicate the results of a second write stress test, where the select gates, control gates, bit lines, and source lines are all at 0 V. The data in the data latch/sense amplifier circuit 4 during the first write stress test is inverted in the second write stress test.

Figure 12:
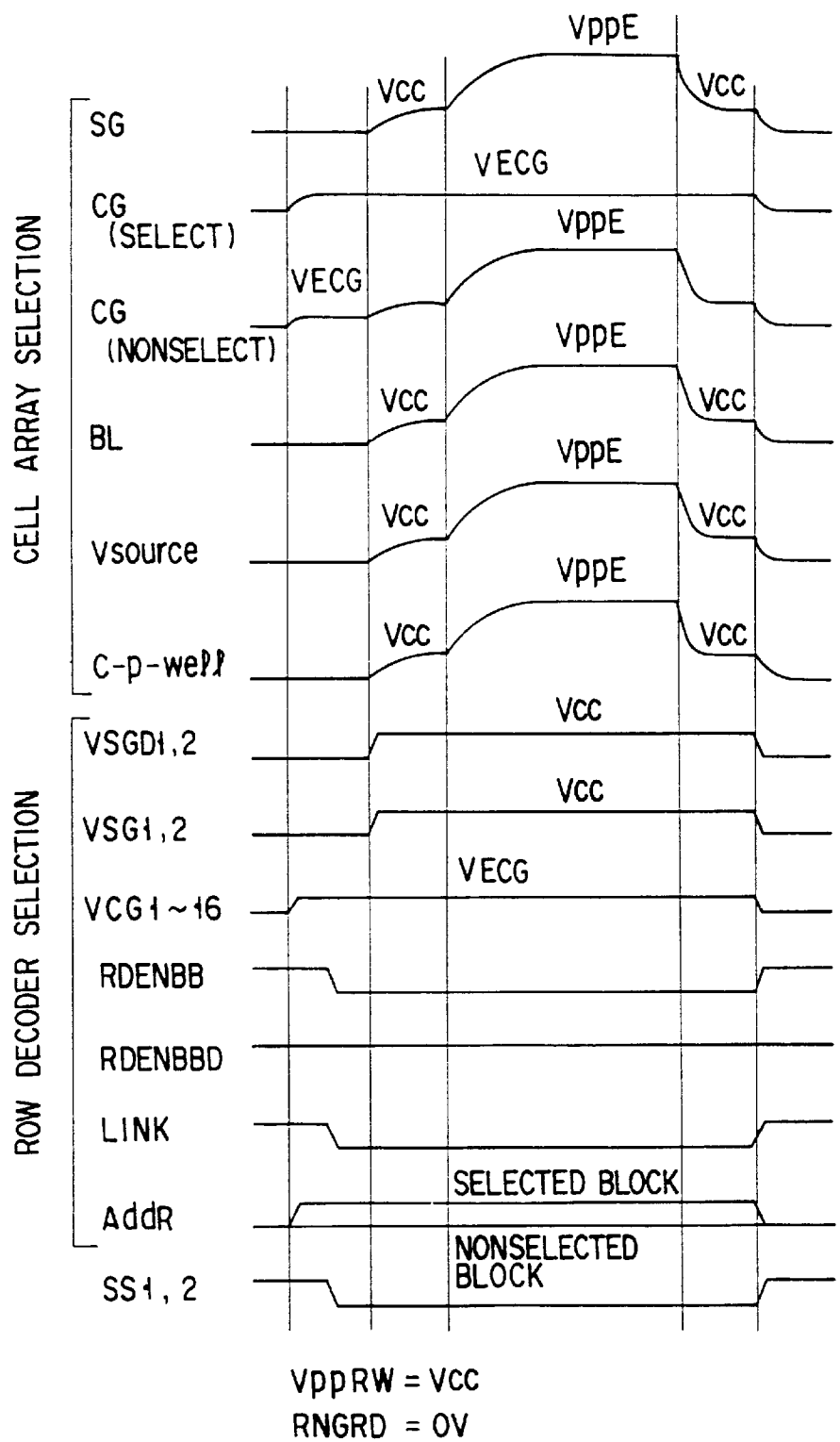
FIG. 12 is a timing chart to help explain an erase operation.

FIG. 12 is the timing chart for an erase operation. First, all of the signals VCG1 to VCG16 go to $V_{ECG}$. The voltage $V_{ECG}$ is such that when $V_{ECG}$ is applied to the source and drain of HVNMOS transistor Qh and the gate and substrate voltage are set at 0 V, HVNMOS transistor Qh is brought into the cut-off state. The voltage $V_{ECG}$ is about 1 V. The block address signals RA, RB, RC are all high in the selected block (in FIG. 12, AddR is high) and any one of them is low in the unselected block (in FIG. 2, AddR is low).

The signals RDENBB, LINK, SS1, SS2 go low and the bit lines and the control gates in the unselected block are brought into the floating state. The source lines Vsource are also brought into the floating state. Then, the signals VSGD1, SGD2, VSGS, VSGS2 are placed at Vcc and the cell well C-p-well in which the memory cell array 1 is formed is placed at Vcc. As a result, all of the bit lines BL, source lines Vsource, all of the select gates SG, and the control gates CG of all of the unselected blocks are raised to about Vcc by the voltage of cell well C-p-well. Only all of the control gates in the selected block are at $V_{ECG}$.

Furthermore, when the cell well C-p-well has reached an erasing voltage $V_{ppE}$ (up to 20 V), the output of the Vpp charge pump circuit 12, all of the bit lines, source lines Vsource, all of the select gates SG, and all of the control gates in all of the unselected blocks are raised to about $V_{ppE}$ by the voltage of cell well C-p-well. The voltage difference between the voltage $V_{ECG}$ of the control gates CG in the selected block and the voltage $V_{ppE}$ of cell well C-p-well causes electrons to be discharged from the charge storage layer in the memory cell M in the selected block, making the threshold voltage shift in the negative direction.

After the cell well C-p-well changes from the erasing voltage $V_{ppE}$ to Vcc, the individual signals and voltages are reset to the stand-by condition. In the erase operation, the voltage $V_{ppRW}$ is at Vcc, signal RNGRD is at 0 V, and the individual signals and voltages in the sense amplifier section are at the same voltages as in the stand-by condition except for the signals SS1 and SS2.

Figure 13:
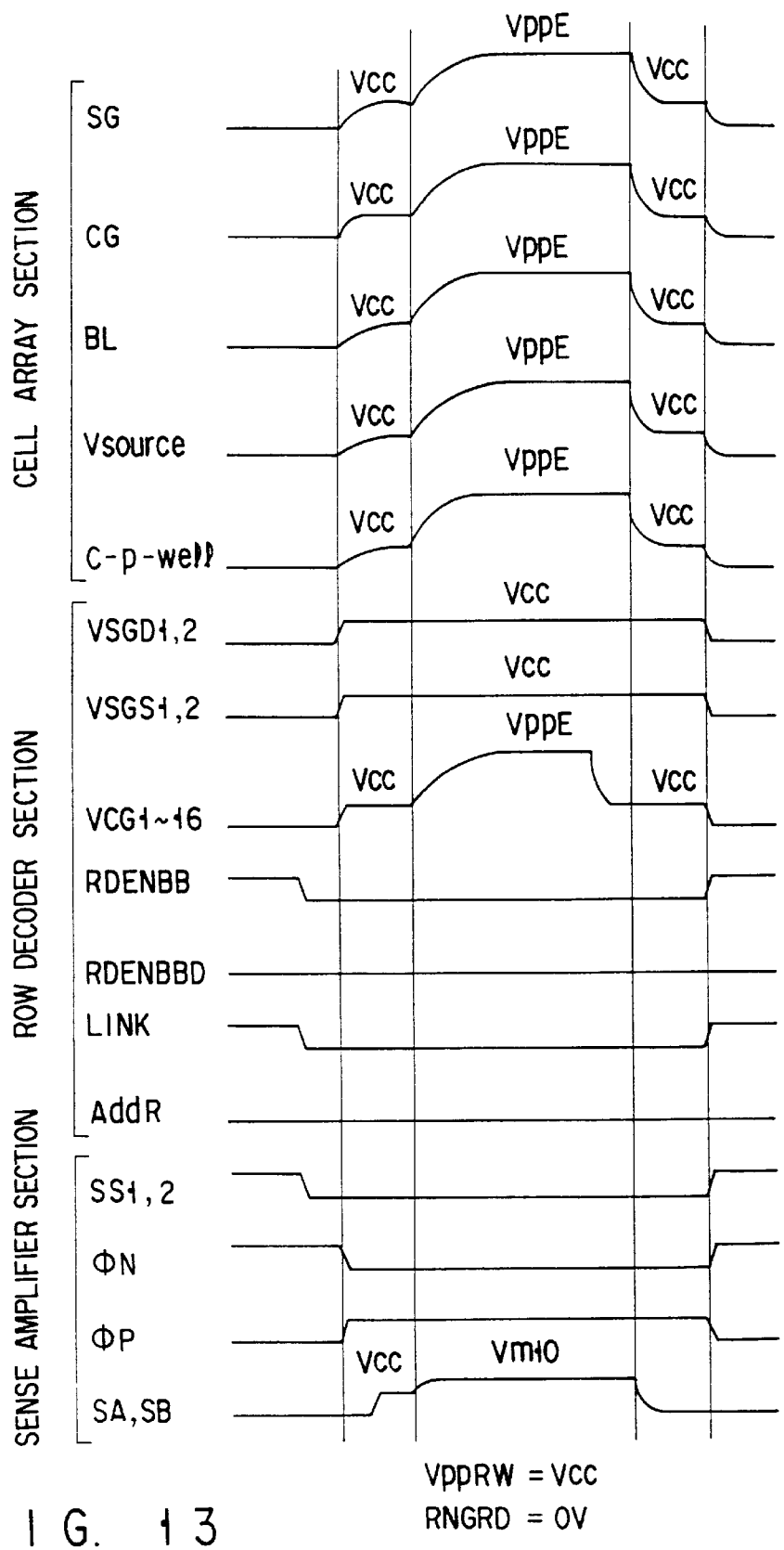
FIG. 13 is a timing chart to help explain the operation of conducting a stress test on the erase peripheral circuit.

FIG. 13 shows the timing for an erasure stress test for the peripheral circuits to which the erasing voltage is applied except for the memory cell array. The timing is basically the same as that for the erase operation except that no block is selected. Furthermore, the signals VCG1 to VCG16 are supplied as Vpp output ($V_{ppE}$ is outputted, although $V_{ppW}$ in the write operation), which would not be effected in the write stress test, so that signal φN goes low and φp goes high, deactivating the data latch/sense amplifier circuit 4, placing signals SA and SB at Vm10.

FIGS. 14A to 54 show the circuit configurations of the chief circuits dealing with voltages Vm8, Vm10, and Vpp among the column control circuit 5, row control circuit 9, cell-well control circuit 10, cell-source control circuit 11, and charge pump circuits 12 to 14, and the operations of these circuits.

Figures 14A, 14B:
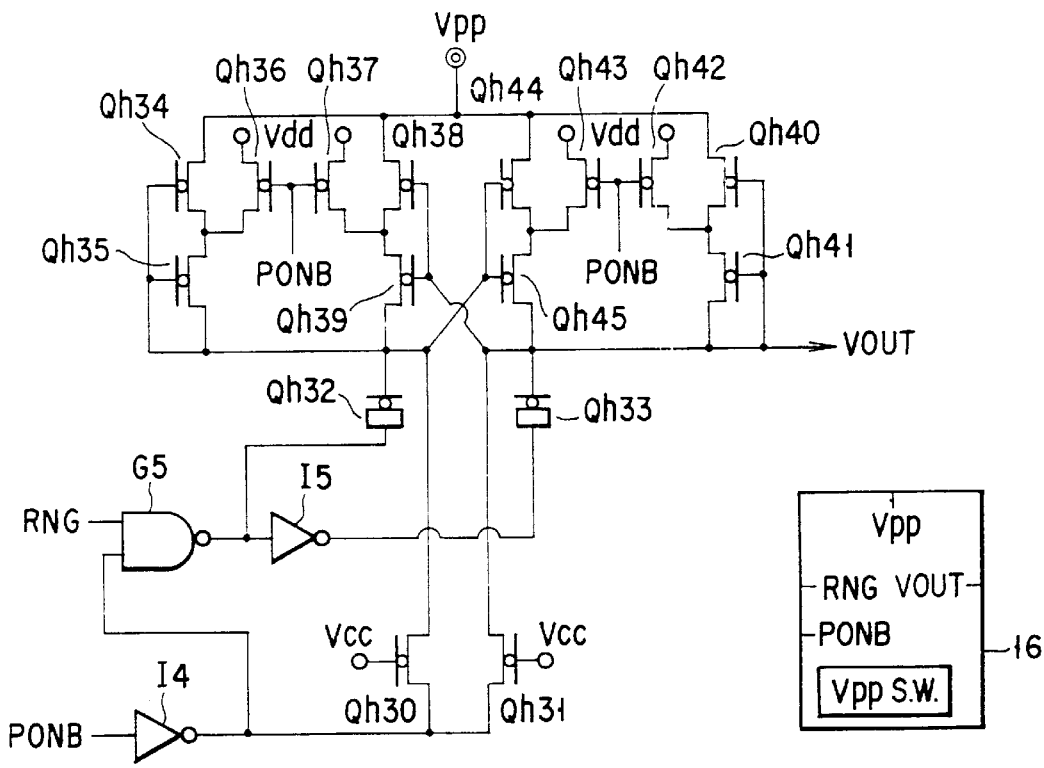
FIGS. 14A and 14B show concrete structures of the control circuit.

FIG. 14A shows a concrete configuration of the Vpp switching circuit for switching between the writing voltage/erasing voltage (Vpp) and the ground. FIG. 14B shows a schematic symbol for the Vpp switching circuit. In FIG. 14A, HVNMOS transistors Qh34 to Qh36, Qh37 to Qh39, Qh40 to Qh42, Qh43 to Qh45 have the same structure as that of the switching circuits shown in FIGS. 3C to 3E.

Figure 15:
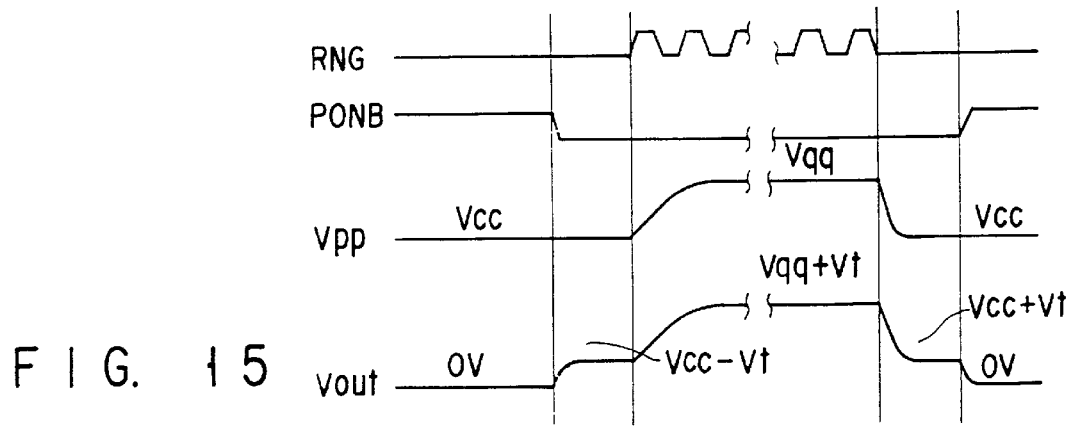
FIG. 15 is a timing chart to help explain the operation of the control circuit.

When signal PONB is high, output Vout is at 0 V. With signal PONB at a low level, when signal RNG oscillates, output Vout will rise to Vpp+Vt (sub=Vpp) higher than the writing voltage/erasing voltage (Vpp). FIG. 15 shows the timing for the operation of this circuit. In the stand-by condition, signal RNG is at 0 V, signal PONB is at Vcc, voltage Vpp is at Vcc, and Vout is at 0 V. When signal PONB is 0 V, Vout is at about Vcc−Vt (sub=Vcc). With signal RNG oscillating, when voltage Vpp is Vqq, Vout is Vqq+Vt (sub=Vqq). When voltage Vpp is Vcc and signal PONB is at Vcc, Vout is 0 V.

Figure 17:
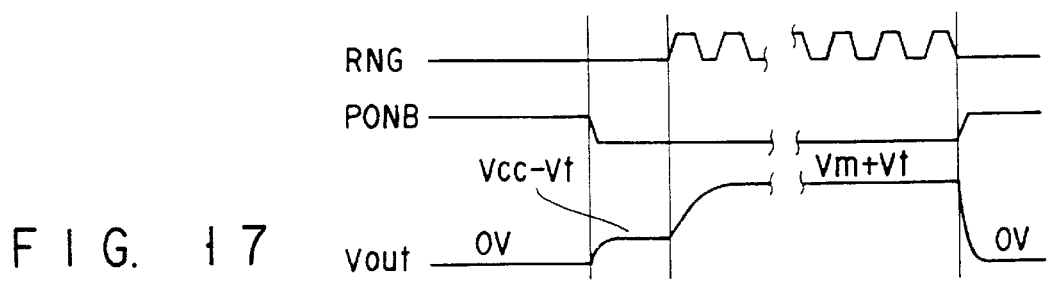
FIG. 17 is a timing chart to help explain the operation of the control circuit.

FIG. 16A shows a concrete configuration of the Vm switching circuit 17 for switching between voltage $V_{m8}$ or Vm10 and the ground. FIG. 16B shows a schematic symbol for the Vm switching circuit. HVNMOS transistors Qh50 to Qh52, Qh53 to Qh55 have the same structure as that of the switching circuits shown in FIGS. 3C to 3E. When signal PONB is high, output Vout is at 0 V. With signal PONB at a low level, when signal RNG oscillates, output Vout will rise to Vm+Vt (sub=Vm). FIG. 17 shows the timing for the operation of this circuit. In the stand-by condition, signal RNG is at 0 V, signal PONB is at Vcc, and Vout is at 0 V. When signal PONB is 0 V, Vout is at about Vcc−Vt (sub=Vcc). When signal RNG oscillates, Vout is Vm+Vt (sub=Vm). When signal PONB is Vcc, Vout is 0 V.

Figure 19:
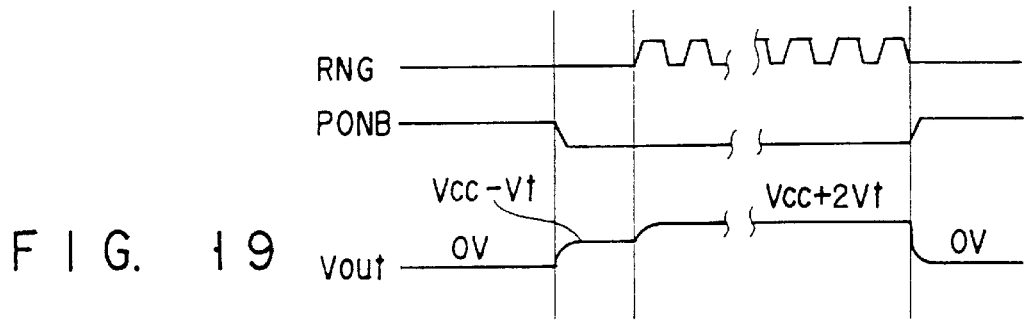
FIG. 19 is a timing chart to help explain the operation of the control circuit.
Figure 20C:
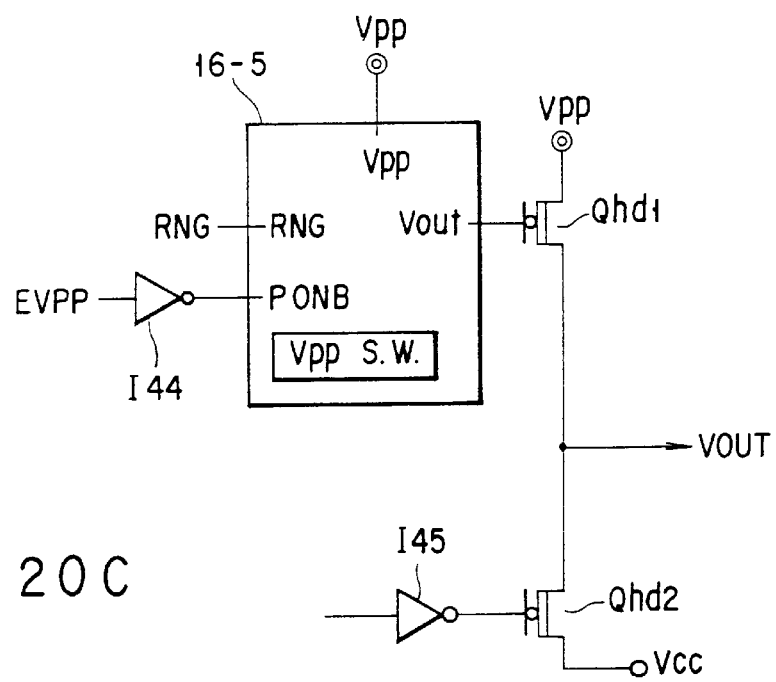
FIGS. 20A to 20C show concrete structures of the control circuit.

FIG. 18A shows a concrete configuration of the Vcc switching circuit 18 for switching between the power-supply voltage and the ground. FIG. 18B shows a schematic symbol for the Vcc switching circuit. When signal PONB is high, output Vout is at 0 V. With signal PONB at a low level, when signal RNG oscillates, output Vout will rise to Vcc+2Vt (sub=Vcc). FIG. 19 shows the timing for the operation of this circuit. In the stand-by condition, signal RNG is at 0 V, signal PONB is at Vcc, and Vout is at 0 V. When signal PONB is 0 V, Vout is at about Vcc−Vt (sub=Vcc). When signal RNG oscillates, Vout is Vcc+2Vt (sub=Vcc). When signal PONB is Vcc, Vout is 0 V.

Figure 21:
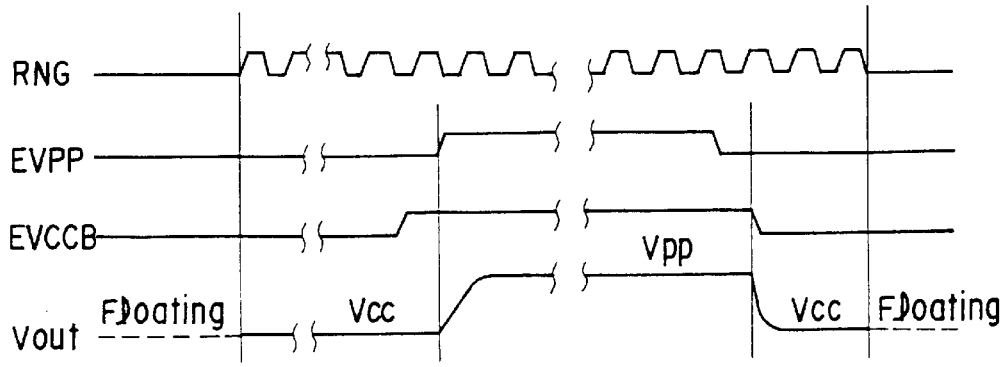
FIG. 21 is a timing chart to help explain the operation of the control circuit.
Figures 20A, 20B:
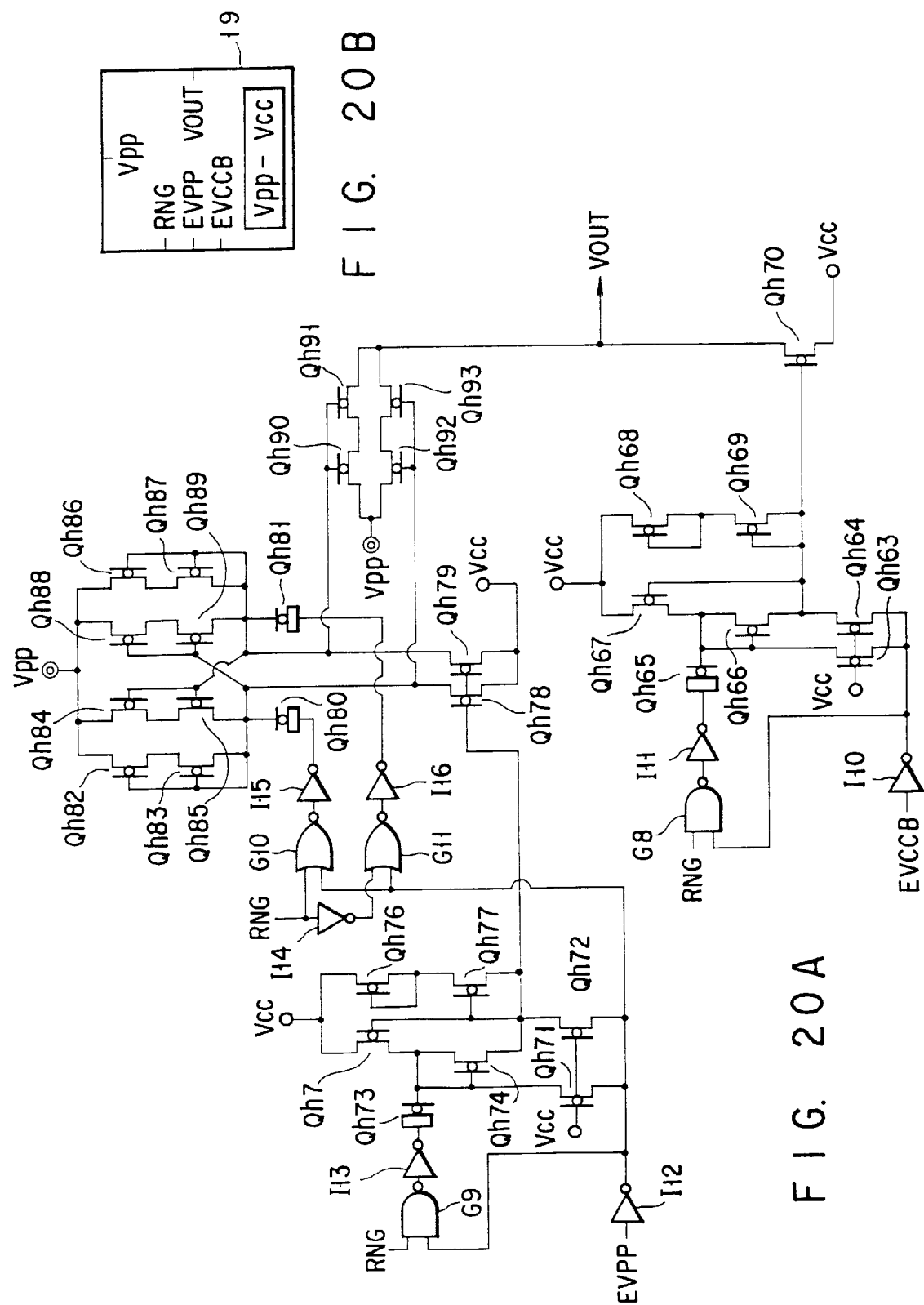

FIG. 20A shows a concrete configuration of the Vpp-Vcc switching circuit 19 for switching between the writing voltage/erasing voltage and the power-supply voltage Vcc. FIG. 20B shows a schematic symbol for the Vpp-Vcc switching circuit. When signal EVCCB is low and signal EVPP is low, output Vout is at Vcc. With the signal EVCCB at a high level and the signal EVPP at a high level, when signal RNG oscillates, output Vout is at Vpp. FIG. 21 shows the timing for this circuit. In the stand-by condition, signal RNG is at 0 V, signals EVCCB and EVPP are at 0 V, and Vout is at about Vcc in the floating state. When signal RNG oscillates, Vout becomes Vcc. When signal EVCCB goes to Vcc, followed by signal EVPP going to Vcc, then Vout goes to Vpp. When signal EVPP goes to 0 V, followed by signal EVCCB going to 0 V, then Vout goes to Vcc.

In this circuit, when the HVNMOS transistors Qh63, Qh64, Qh70, Qh71, Qh72, Qh78, Qh79 are made of the depletion type devices whose threshold voltage is lower, the stability is improved. In this case, it is desirable that depletion type high-voltage-withstand n-channel MOS transistors should be such that they are in the inversion state with the gate voltage at Vcc, source voltage at 0 V, drain voltage at Vcc, and substrate voltage at 0 V, and that they are in the cut-off state with the gate voltage at 0 V, source voltage at Vcc, drain voltage at Vcc, and substrate voltage at 0 V. When the depletion type is used, the input signal RNG to the NAND circuits G8, G9 is not needed and may be set to 0 V. Furthermore, the depletion type high-voltage-withstand n-channel MOS transistors Qhd1, Qhd2 may be used to form a circuit of FIG. 20C. The circuit of FIG. 20C has a small number of transistors used, so that the circuit area can be made smaller.

The HVNMOS transistors Qh4, Qh5, Qh6, Qh7 in the block select circuit 7 of FIG. 5 may be replaced with the depletion type high-withstand voltage n-channel MOS transistors Qhd and signal RDENBBD may be supplied to the gates of Qh4 and Qh5. Furthermore, the HVNMOS transistors Qh30, Qh31, Qh32, Qh33, Qh46, Qh47, Qh48, Qh56, Qh57, Qh58 in FIGS. 14A, 14B, 16, and 18 may be replaced with the depletion type high-withstand voltage n-channel MOS transistors Qhd and signal PONB may be supplied to the gates of Qh30, Qh31, Qh46, Qh47, Qh56 and Qh57.

Figure 22:
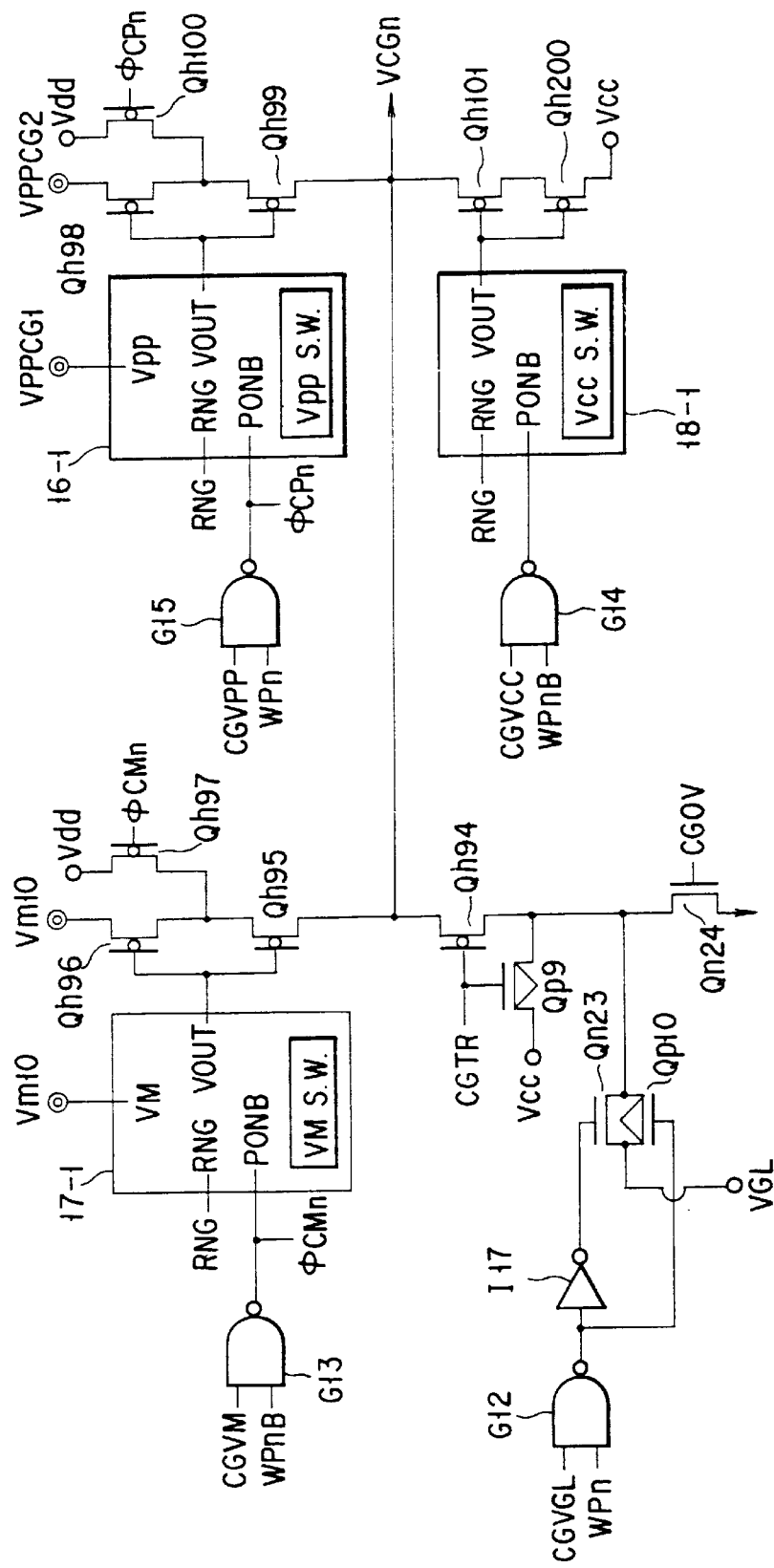
FIG. 22 shows a concrete structure of the control circuit.
Figure 23:
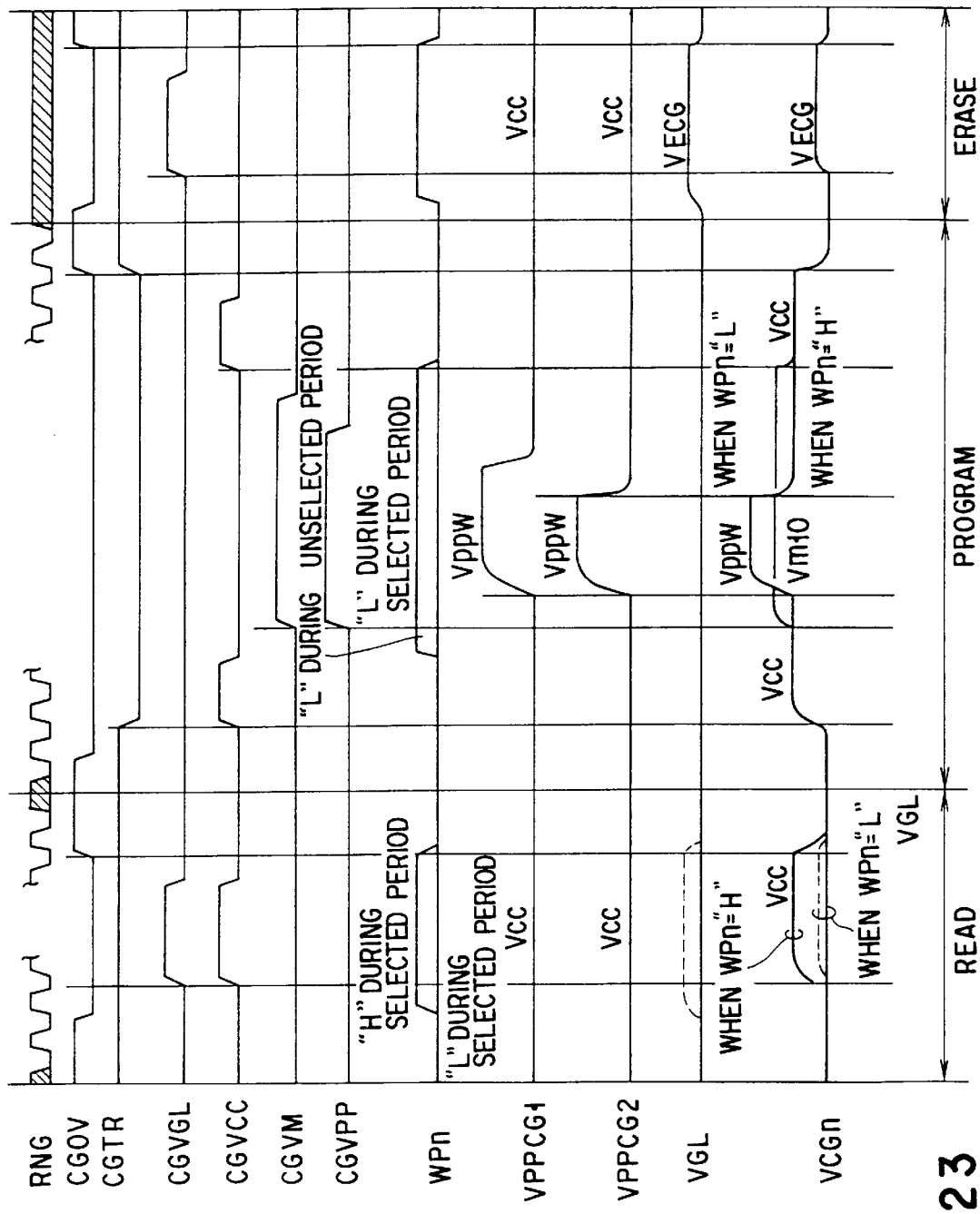
FIG. 23 is a timing chart to help explain the operation of the control circuit.

FIG. 22 shows a concrete configuration of the control gate driver that outputs signals VCGn (n=1 to 16). HVNMOS transistors Qh95 to Qh97, Qh98 to Qh100 have the same structure as that of the switching circuits shown in FIGS. 3C to 3E. FIG. 23 shows the timing for this circuit. In the stand-by condition, signals RNG, CGVGL, CGVCC, CGVM, CGVPP, WPn are at 0 V. WPn (n=1 to 16) corresponds to output VCGn (n=1 to 16), and WpnB is the reverse of the WPn.

In the stand-by condition, signals CGOV and CGTR are at Vcc, voltages VPPCG1 and VPPCG2 are at Vcc and voltage VGL is at 0 V. Therefore, output VCGn is at 0 V.

In a read operation, signal CGOV is at 0 V and signals CGVGL and CGVCC are at Vcc. At this time, when WPn is at Vcc, voltage VGL is outputted. VGL is at 0 V in a read operation, at the verify voltage (up to 0.5 V) in a write verify operation, and at about 0 V to Vcc in a test operation of measuring the threshold voltage of a memory cell. When WPn is at 0 V, output VCGn is at Vcc.

In a write operation, signal CGOV is at 0 V, CGTR is at 0 V, and CGVCC is at Vcc, thereby outputting Vcc. Thereafter, signal CGVCC goes to 0 V, signals CGVPP and CGVM go to Vcc and voltages VPPCG1 and VPPCG2 go to $V_{ppW}$. At this time, when signal WPn is at Vcc, $V_{ppW}$ is outputted; when WPn is at 0 V, $Vm_{10}$ is outputted. With voltage VPPCG2 returning to Vcc, when WPn is at Vcc, output is Vcc. Thereafter, VPPCG1 returns to Vcc. Then, signal CGVPP goes to 0 V and CGVM goes to 0 V. With signal CGVCC at Vcc again, when WPn is at 0 V, CGVM goes to 0 V. Signal CGVCC toes to 0 V, CGOV and CGTR go to Vcc, causing the output to return to 0 V.

In an erase operation, when signal CGOV is at 0 V, all of the WPn are at Vcc, and signal CVGL is at Vcc, voltage VGL is outputted. Voltage VGL is at $V_{ECG}$ (up to 1 V).

The HVNMOS transistor Qh94 may be replaced with the depletion type high-withstand voltage n-channel MOS transistor Qhd.

Figure 25:
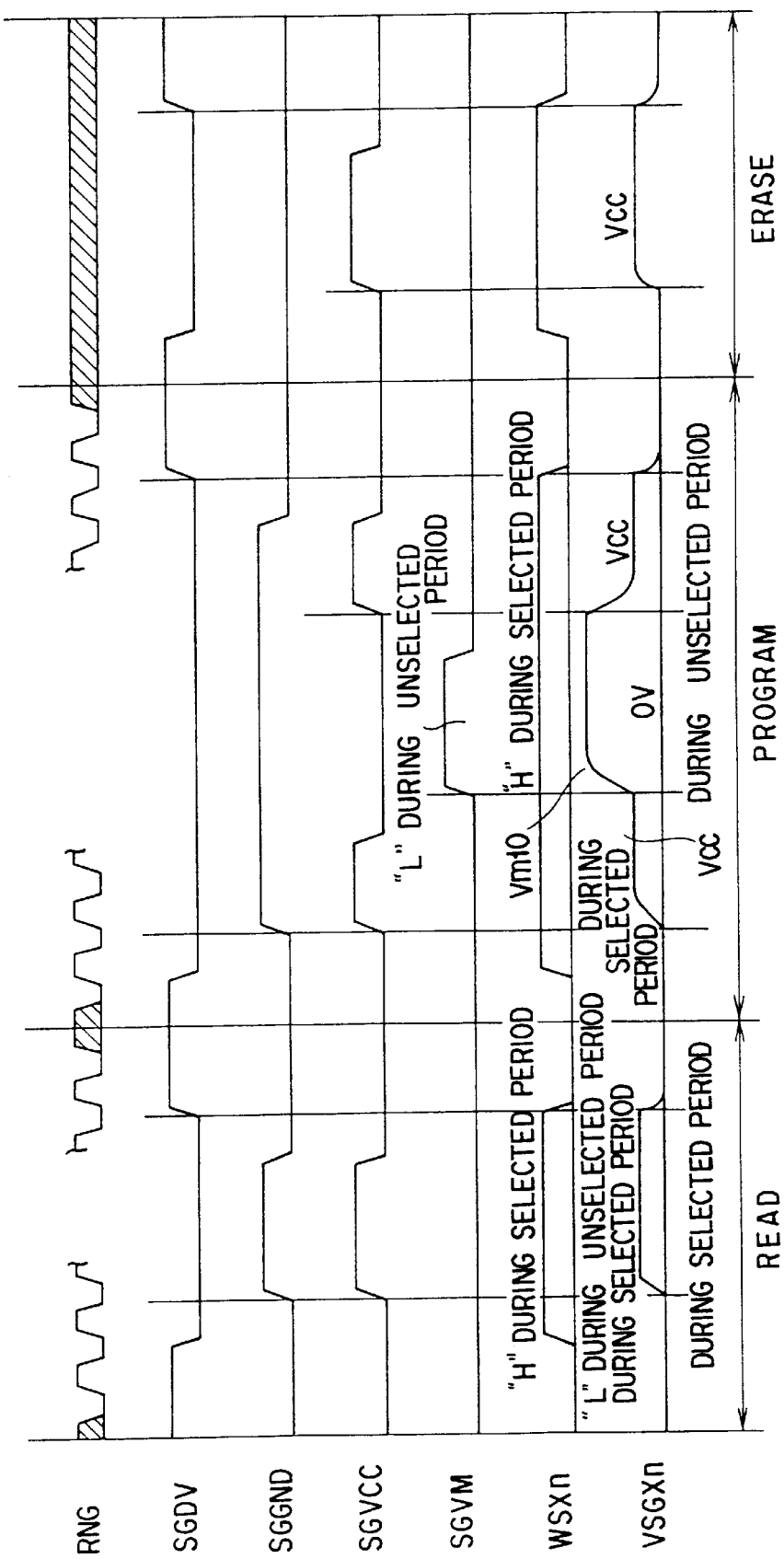
FIG. 25 is timing chart to help explain the operation of the control circuit.

FIG. 24 shows a concrete configuration of the select gate driver that outputs signals VSGXn (X=D, S, n=1, 2). HVNMOS transistors Qh105 to Qh107 have the same structure as that of the switching circuits shown in FIGS. 3C to 3E. FIG. 25 shows the timing for this circuit. In the stand-by condition, signals RNG, SGGND, SGVCC, SGVM, WSXn are at 0 V. Signal WSXn (X=D, S, n=1, 2) corresponds to output VSGXn (X=D, S, n=1, 2), and WSXnB is the reverse of the WSXnB. Signal SGOV is at Vcc.

In a read operation, with signal SGOV at 0 V and signals SGGND, SGVCC at Vcc, when signal WSXn is at Vcc, Vcc is outputted; and when WSXn is at 0 V, output is at 0 V. In a write operation, when signal SGOV goes to 0 V and signal WSXn is at 0 V, signal SGGND going to Vcc outputs 0 V. With signal WSXn at Vcc, when SGVCC is at Vcc, Vcc is outputted; and when signal SGVM is at Vcc, Vm10 is outputted. In an erase operation, all of the signal WSXn are at Vcc and all of the VSGZn are at Vcc.

FIG. 26 shows a circuit that controls voltage VPPCGn (n=1, 2). Signals CDVPPn (n=1, 2) and CDVCCnB (n=1, 2) correspond to output VPPCGn (n=1, 2). When signals CDVPPn and CDVCCnB are at 0 V, Vcc is outputted; and when signals CDVPPn and CDVCCnB are at Vcc and signal RNG oscillates, Vpp is outputted.

FIG. 27 shows a circuit that controls voltage $V_{ppRW}$. When signals RWVPP and RWVCCB are at 0 V, Vcc is outputted; and when signals RWVPP and RWVCCB are at Vcc and signal RNG oscillates, Vpp is outputted.

Figure 29:
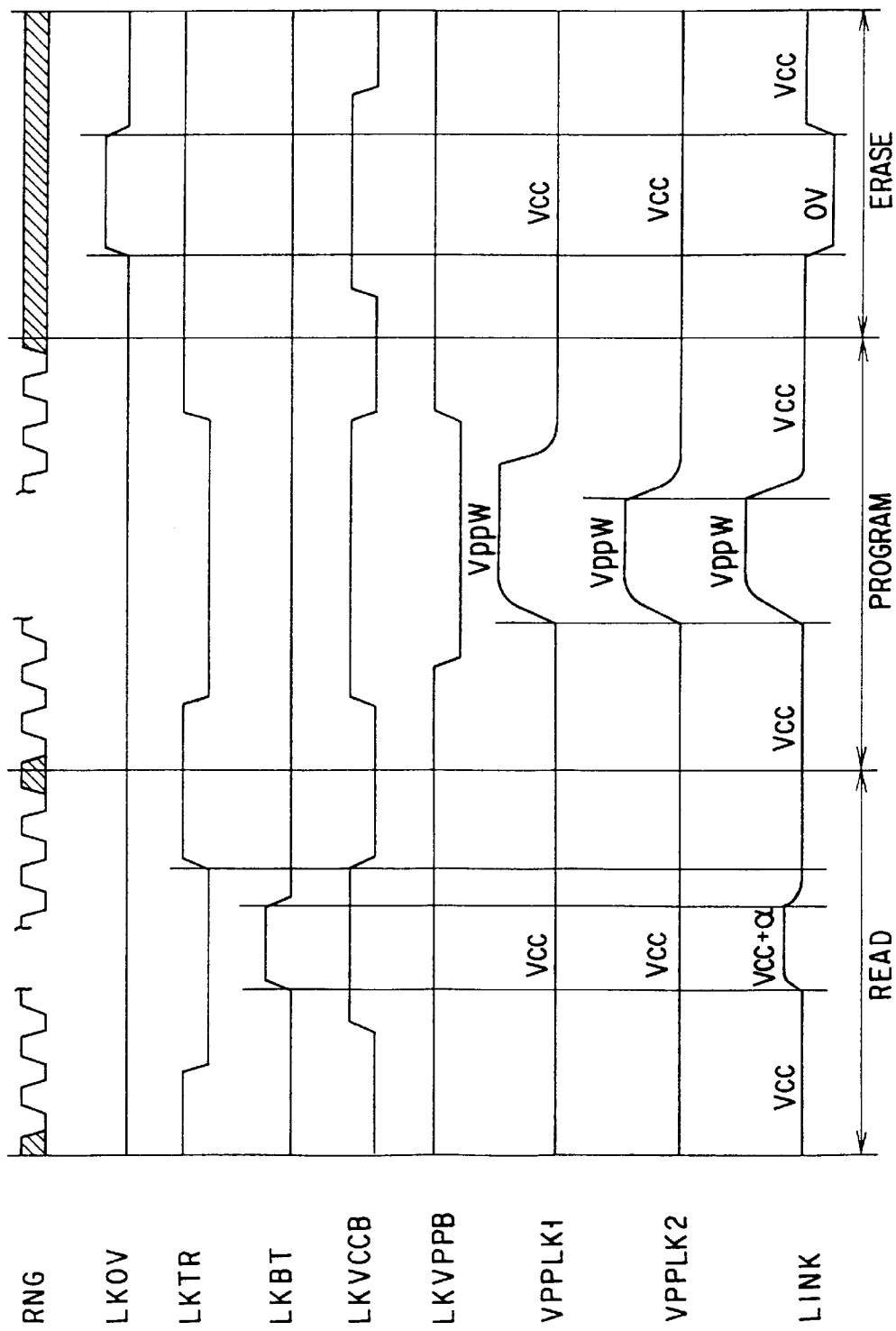
FIG. 29 is a timing chart to help explain the operation of the control circuit.

FIG. 28 shows a concrete configuration of a circuit that outputs signal LINK. FIG. 29 shows the timing for the operation of this circuit. In the stand-by condition, when signals RNG, LKOV, LKBT, and LKVCCB are at 0 V, signals LKTR and LKVPPB are at Vcc and voltages VPPLK1 and VPPLK2 are at Vcc. Therefore, the output is at Vcc.

In a read operation, when signal LKTR goes to 0 V, signal LKVCCB goes to Vcc, and signal LKBT goes to Vcc, then the output LINK is raised from Vcc to Vcc+α. α is lower than Vcc. In a write operation, when signal LKTR goes to 0 V, LKVCCB goes to Vcc, LKVPPB goes to 0 V, and voltages VPPLK1 and VPPLK2 go to $V_{ppW}$, the output LINK goes to $V_{ppW}$, When voltage VPPLK2 goes to Vcc, the output LINK goes to Vcc. In an erase operation, when signals LKVCCB and LKOV go to Vcc, the output LINK goes to 0 V.

The HVNMOS transistors Qh108 and Qh109 may be replaced with the depletion type high-withstand voltage n-channel MOS transistor Qhd.

FIG. 30 shows a circuit that controls voltage VPPLKn (n=1, 2). Signals LKVPPn (n=1, 2) and LKVCCnB (n=1, 2) correspond to output VPPLKn (n=1, 2). When signals LKVPPn and LKVCCnB are at 0 V, Vcc is outputted; and when signals LKVPPn and LKVCCnB are at Vcc and signal RNG oscillates, Vpp is outputted.

FIG. 31 shows a circuit that controls voltage VPPCPWn (n=1, 2). Signals CPVPPn (n=1, 2) and CPVCCnB (n=1, 2) correspond to output VPPCPWn (n=1, 2). When signals CPVPPn and CPVCCnB are at 0 V, Vcc is outputted; and when signals CPVPPn and CPVCCnB are at Vcc and signal RNG oscillates, Vpp is outputted.

Figure 32:
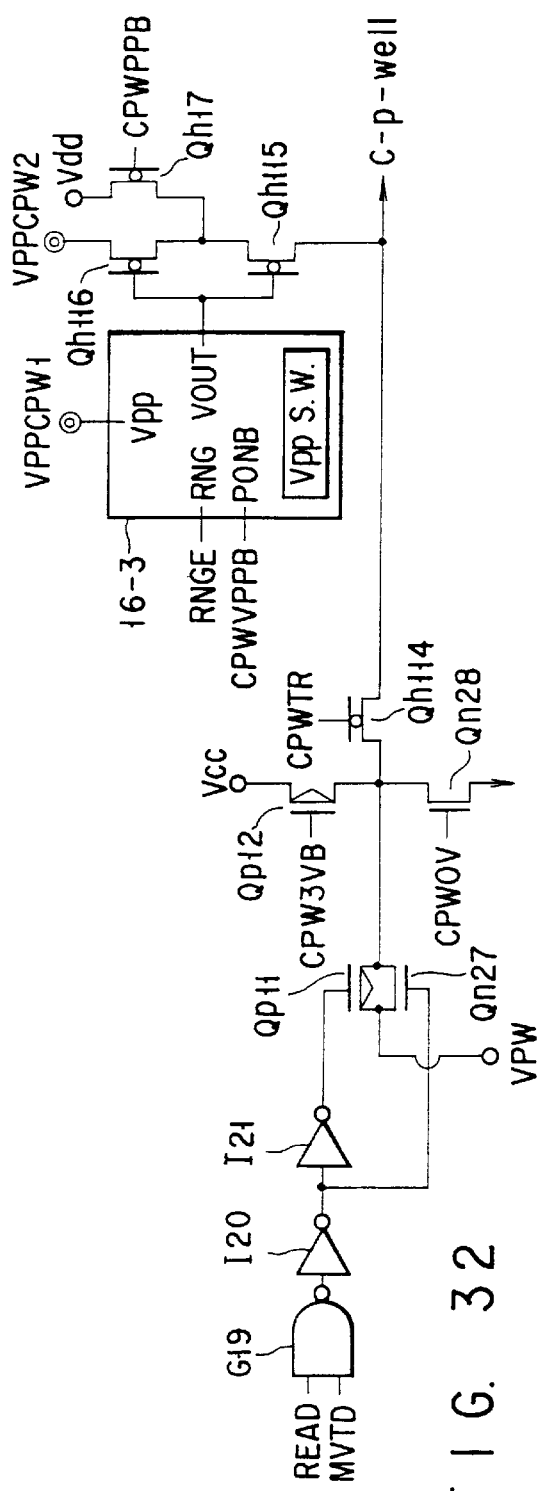
FIG. 32 shows a concrete structure of the control circuit.
Figure 33:
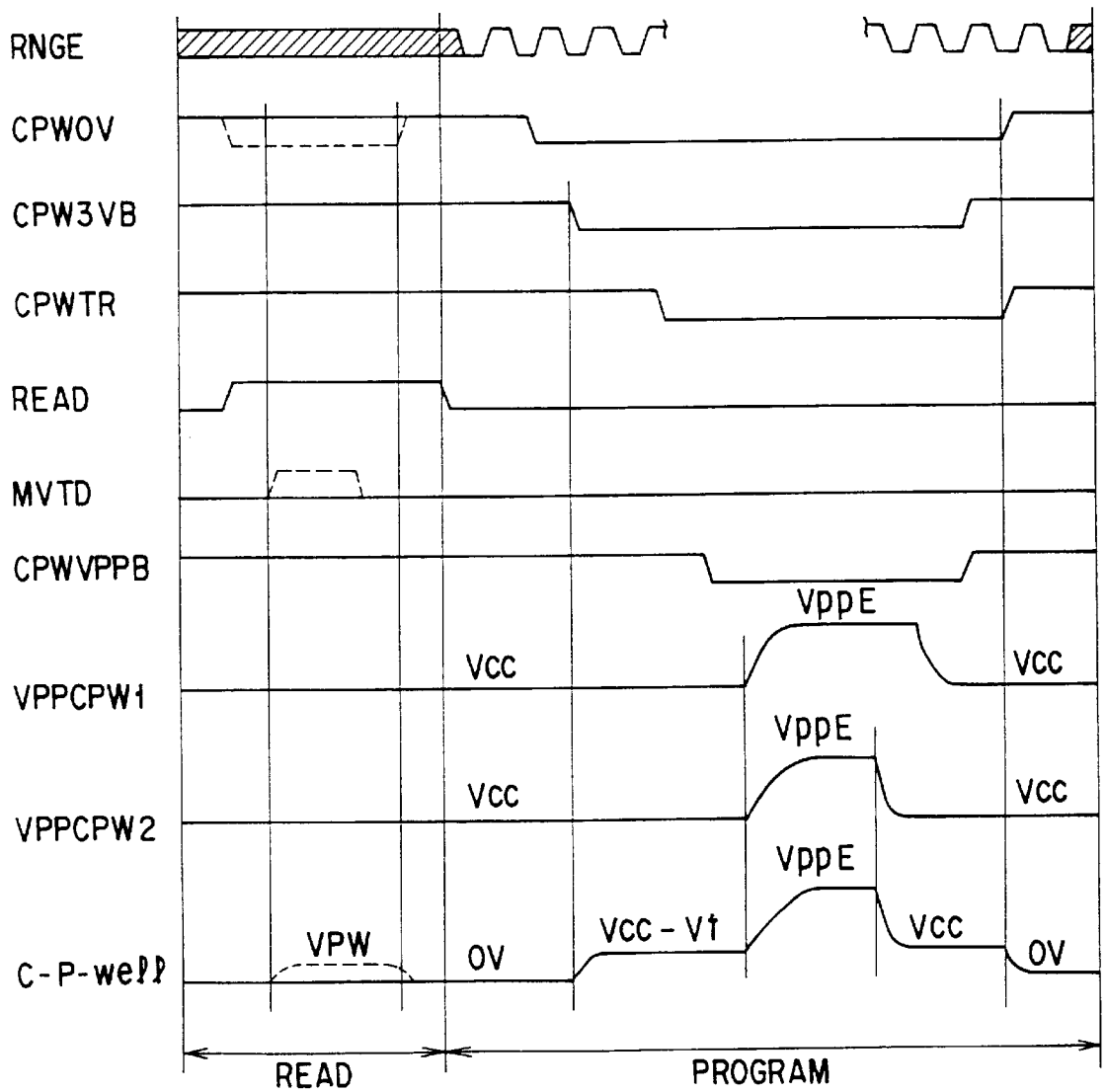
FIG. 33 is a timing chart to help explain the operation of the control circuit.

FIG. 32 shows a concrete configuration of a circuit that outputs voltage C-p-well. HVNMOS transistors Qh115 to Qh117 have the same structure as that of the switching circuits shown in FIGS. 3C to 3E. FIG. 33 shows the timing for the operation of this circuit. In the stand-by operation, when signals RNGE, READ, MVGD are at 0 V, signals CPW0V, CPW3VB, CPWTR, CPWVPPB are at Vcc and voltages VPPCPW1, VPPCPW2 are at Vcc. Therefore, the output is at 0 V.

In a read operation, although the output C-p-well is at 0 V, when signal MVTD goes to Vcc, voltage VPW is outputted. Voltage VPW ranges from 0 V to Vcc and is used in a test operation of measuring the negative threshold voltage of memory cell M. In an erase operation, when signals CPW0V, CPW3VB, CPWTR, CPWVPPB go to 0 V and voltages VPPCPW1, VPPCPW2 go to $V_{ppE}$, $V_{ppE}$ is outputted. When voltage VPPCPW2 goes to Vcc, C-p-well goes to Vcc, signals CPW0V, CPW3VB, CPWTR, CPWVPPB go to Vcc, the output goes to 0 V.

The HVNMOS transistor Qh114 may be replaced with the depletion type high-withstand voltage n-channel MOS transistor Qhd.

Figure 34:
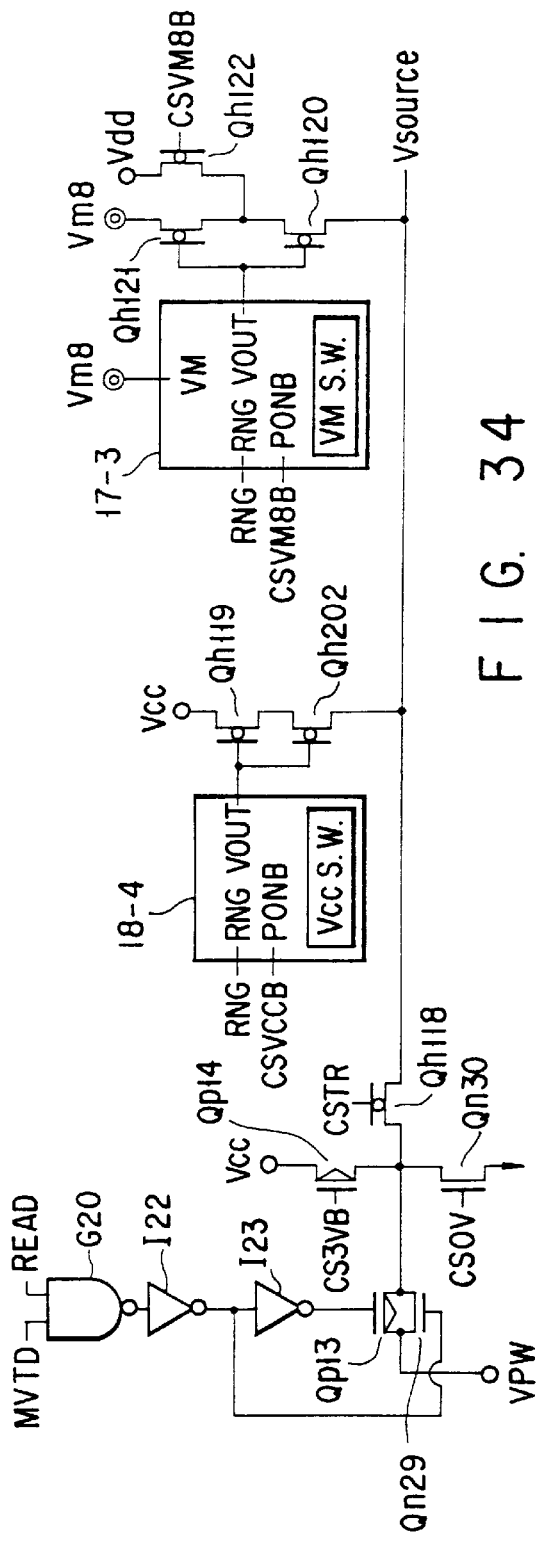
FIG. 34 shows a concrete structure of the control circuit.
Figure 35:
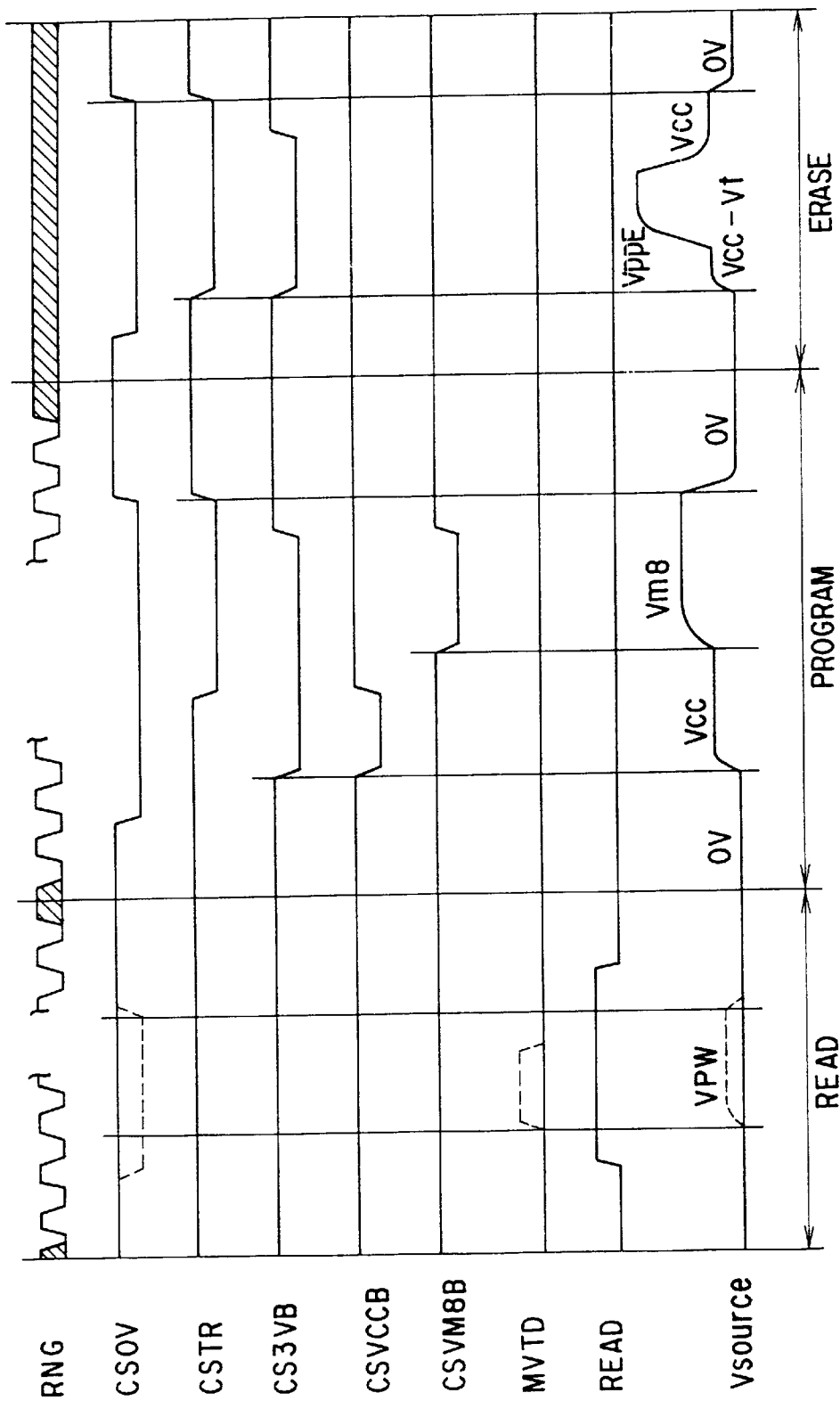
FIG. 35 is a timing chart to help explain the operation of the control circuit.

FIG. 34 shows a concrete configuration of a circuit that outputs voltage Vsource. HVNMOS transistors Qh120 to Qh122 have the same structure as that of the switching circuits shown in FIGS. 3C to 3E. FIG. 35 shows the timing for the operation of this circuit. In the stand-by operation, when signals RNGE, READ, MVTD are at 0 V, signals CS0V, CSTR, CS3VB, CSVCCB, and CSVM8B are at Vcc. Therefore, the output is at 0 V.

In a read operation, although output Vsource is at 0 V, when signal MVTD is at Vcc, voltage VPW is outputted. The voltage VPW ranges from 0 V to Vcc and is used in a test operation of measuring the negative threshold voltage of memory cell M. In a write operation, when signal CS0V goes to 0 V and CS3VB and CSVCCB go to 0 V, Vcc is outputted. Thereafter, when signal CSVCCB goes to Vcc, CSTR and CSVM8B go to 0 V, Vm8 is outputted. In an erase operation, when signals CS0V, CS3VB, and CSTR go to 0 V, the output Vsource is brought into the floating state. At this time, the voltage changes according to the voltage C-p-well.

The HVNMOS transistor Qh118 may be replaced with the depletion type high-withstand voltage n-channel MOS transistor Qhd.

Figure 37:
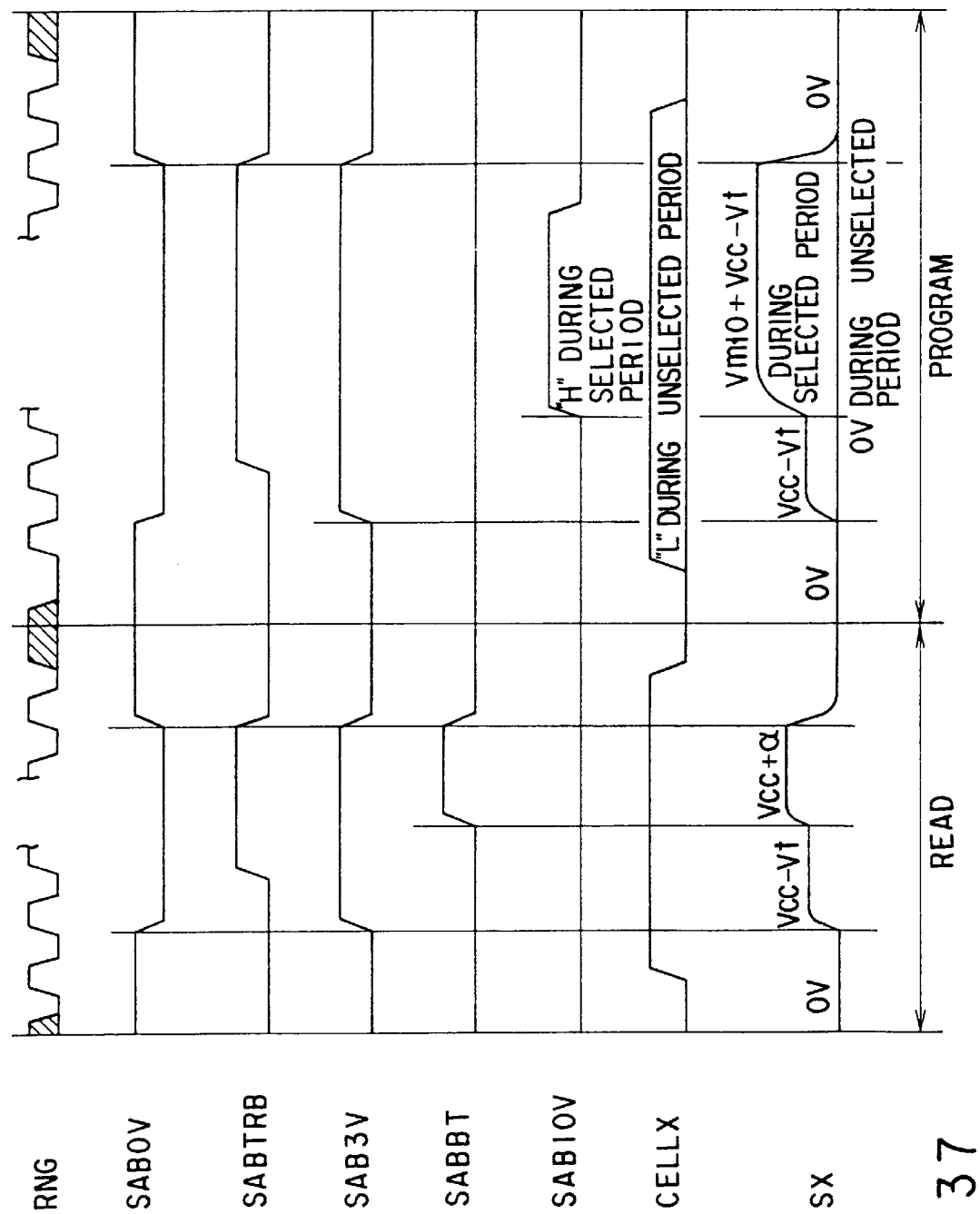
FIG. 37 is a timing chart to help explain the operation of the control circuit.

FIG. 36 shows a concrete configuration of a circuit that outputs signal SX (X=A, B). HVNMOS transistors Qh127 to Qh129 have the same structure as that of the switching circuits shown in FIGS. 3C to 3E. FIG. 37 shows the timing for the operation of this circuit. In the stand-by operation, when signals RNG, SABTRB, SAB3V, SABBT, SAB10V, CELLX are at 0 V, signal SAB0V is at Vcc. Therefore, the output is at 0 V. Signal CELLX (X=A, B) corresponds to output SX (X=A, B).

In a read operation, when signal SAB0V goes to 0 V, SAB3V goes to Vcc, and both of CELLA and CELLB go to Vcc, and then signals SAETRB and SABBT go to Vcc, the output becomes Vcc+α. α is lower than Vcc.

In a write operation, when signal SAB0V goes to 0 V and signal SAB3V goes to Vcc, and then signal SABTRB goes to Vcc, SAB10V goes to Vcc. In this case, when signal CELLX is at Vcc, the output is at about Vm10+Vcc−Vt (sub=Vm10).

The HVNMOS transistors Qh123, Qh124 may be replaced with the depletion type high-withstand voltage n-channel MOS transistors Qhd.

Figure 39:
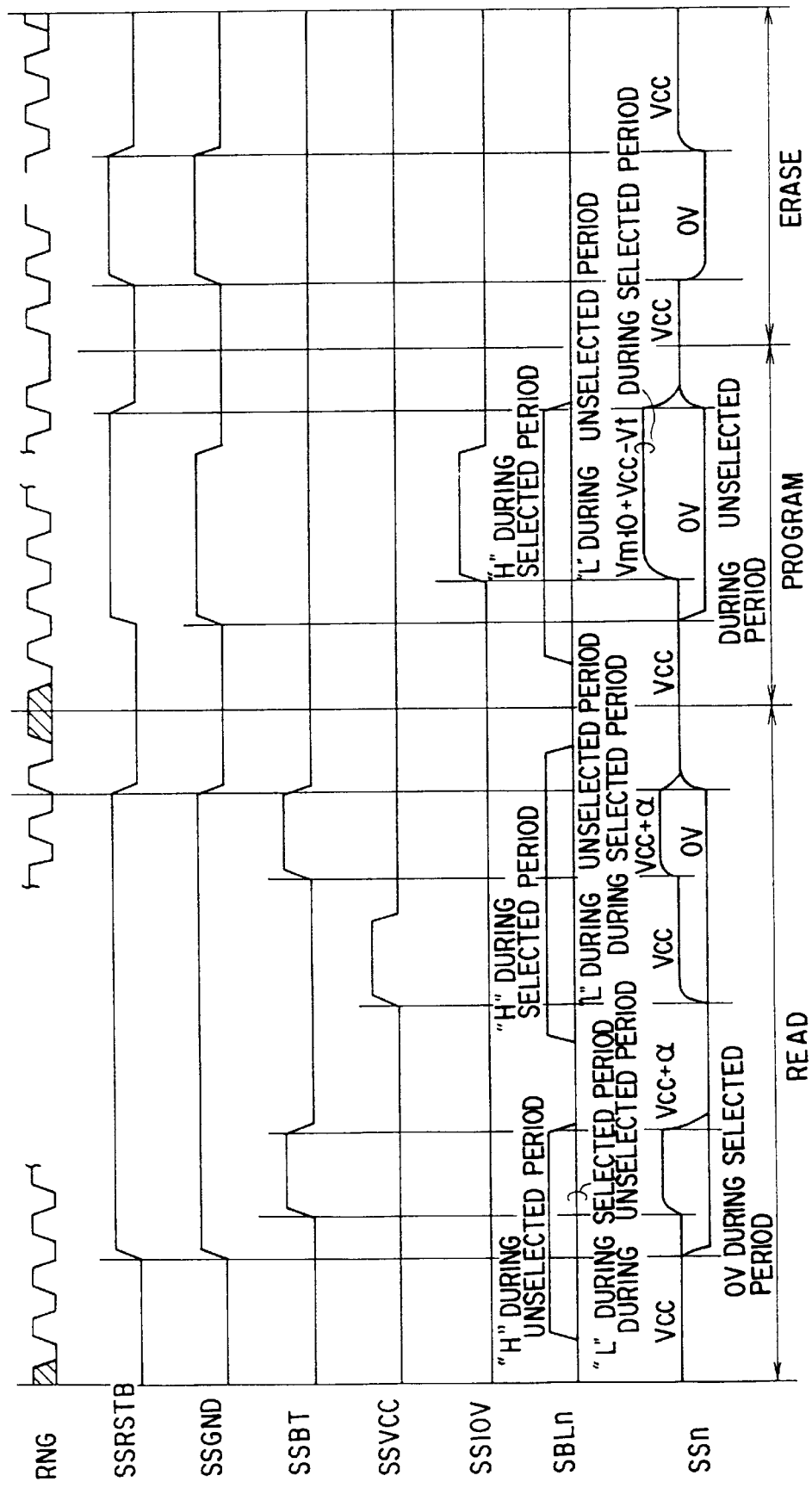
FIG. 39 is a timing chart to help explain the operation of the control circuit.

FIG. 38 shows a concrete configuration of a circuit that outputs signal SSn (n=1, 2). FIG. 39 shows the timing for the operation of this circuit. In the stand-by operation, when signals RNG, SSRSTB, SSGND, SSBT, SSVCC, SS10V, SBLn are at 0 V. Therefore, the output is at Vcc. Signal SBLn (X=1, 2) corresponds to output SSn (X=1, 2). The signal SBLnB is the reverse of signal SBLn.

In a read operation, signal SSRSTB goes to Vcc, SSGND goes to Vcc, and SSBT goes to Vcc. In this situation, when signal SBLn is at Vcc, the output is raised to Vcc+α. α is lower than Vcc. When signal SBLn is at 0 V, the output is 0 V. In a write operation, signals SSRSTB and SSGND go to Vcc and signal SS10V goes to Vcc. In this situation, when signal SBLn is at Vcc, the output is at about Vm10+Vcc−Vt (sub=Vm10). When signal SBLn is at 0 V, 0 V is outputted. In an erase operation, when signals SSRSTB and SSGND go to Vcc and both of SBL1 and SBL2 go to 0 V, both of outputs SS1 and SS2 go to 0 V.

Figure 41:
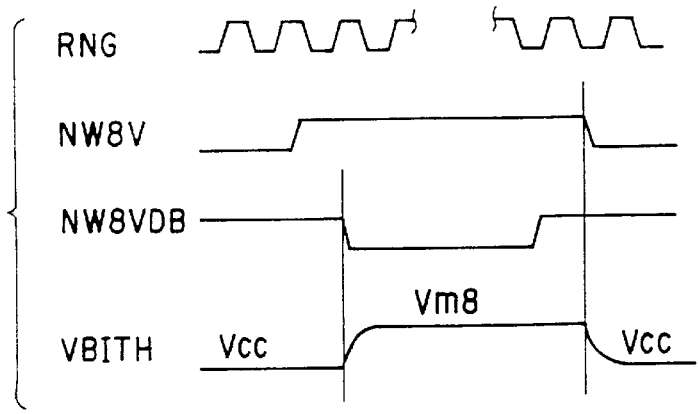
FIG. 41 is a timing chart to help explain the operation of the control circuit.

FIG. 40 shows a concrete configuration of a circuit that controls voltage VBITH. FIG. 41 shows the timing for the operation of this circuit. In the stand-by operation, when signals RNG, NW8V are at 0 V and signal NW8VDB is at Vcc. Therefore, the output is at Vcc. When signal NW8V is at Vcc and NW8VDB is at 0 V, voltage VBITH is at Vm8.

The HVNMOS transistor Qh138 may be replaced with the depletion type high-withstand-voltage n-channel MOS transistor Qhd.

Figure 42:
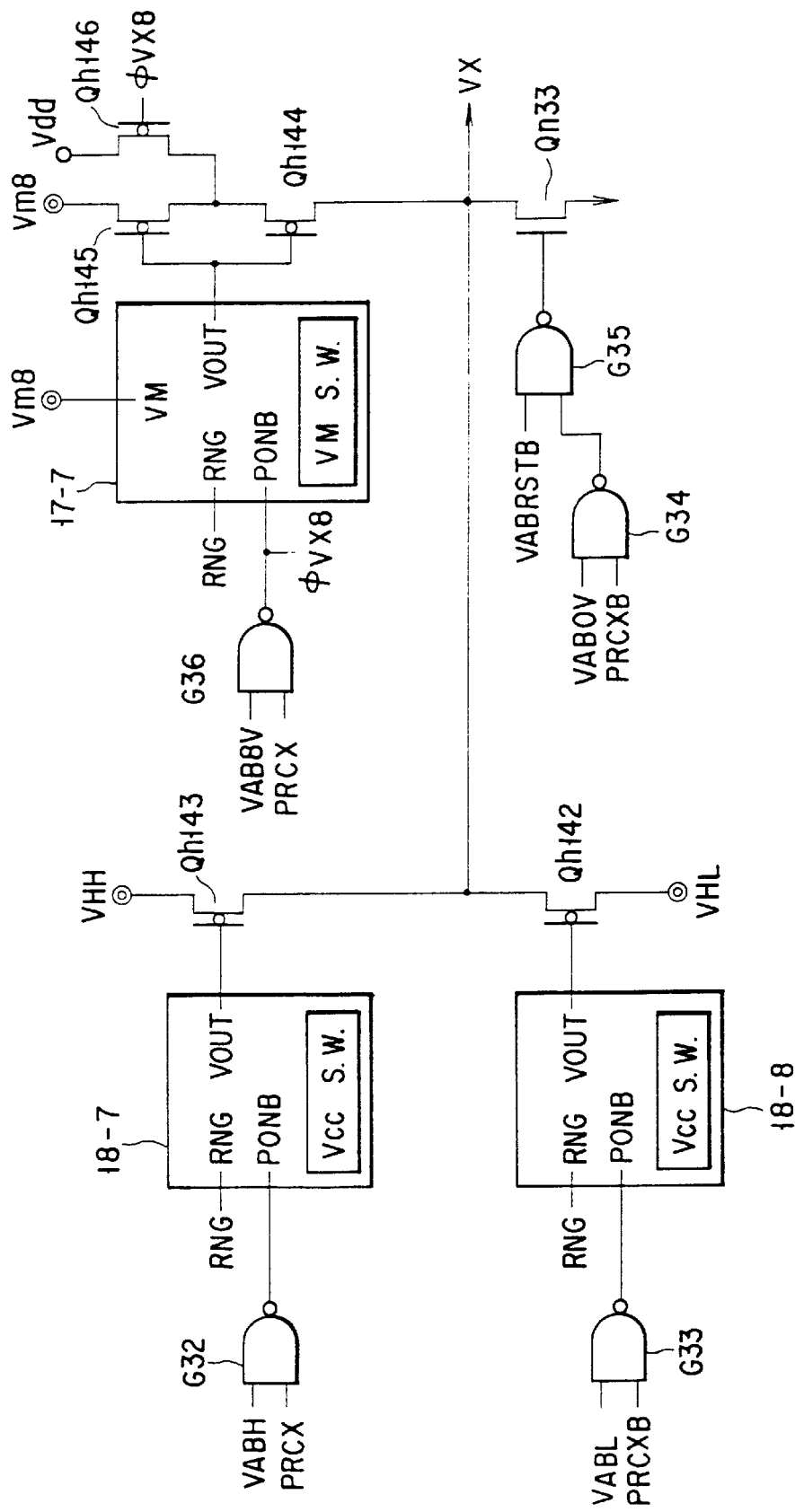
FIG. 42 shows a concrete structure of the control circuit.

FIG. 42 shows a concrete configuration of a circuit that outputs voltage VX (X=A, B). HVNMOS transistors Qh144 to Qh146 have the same structure as that of the switching circuits shown in FIGS. 3C to 3E. FIG. 43 shows the timing for the operation of this circuit. In the stand-by operation, when signals RNG, VABRSTB, VAB0V, VABL, VABH, VAB8V, PRCX are at 0 V, and both voltages of VHL and VHH are at 0 V. Therefore, the output is at 0 V. Signal PRCX (X=A, B) corresponds to output VX (X=A, B). Signal PRCXB is the reverse of PRCX.

In a read operation, with signal VABRSTB at Vcc, and both of VABL and VABH at Vcc, when PRCX is at Vcc, voltage VHH is outputted; and when signal PRCX is at 0 V, voltage VHL is outputted. In a write operation, signal VABRSTB is at Vcc. With signal PRCX at 0 V, when signal VAB0V is at Vcc, the output is at 0 V. With signal PRCX at Vcc, when signal VABH and voltage VHH go to Vcc, the output goes to Vcc; and when signal VAB8V goes to Vcc, the output goes to Vm8.

Figure 44:
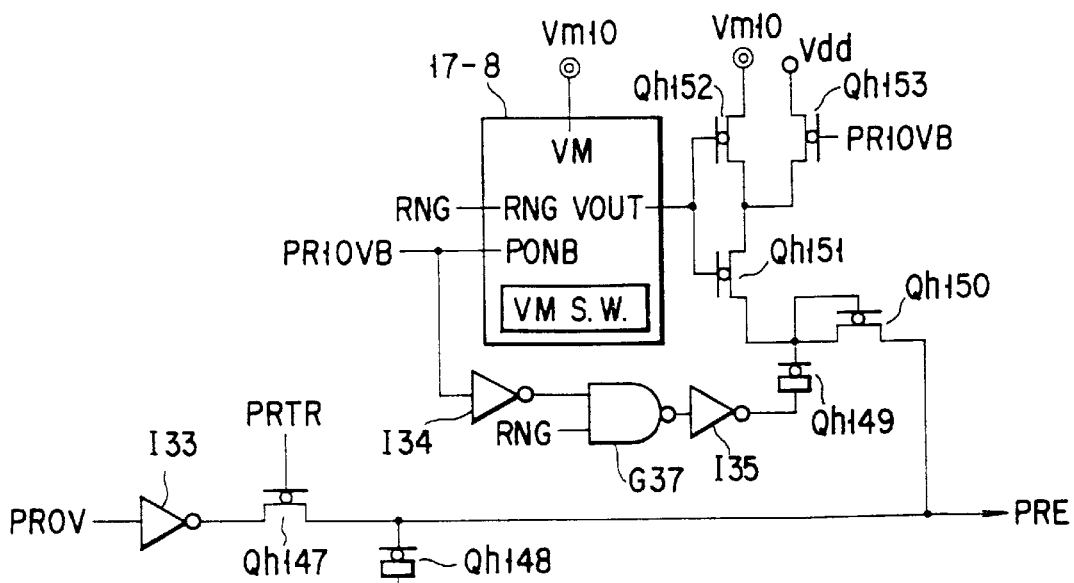
FIG. 44 shows a concrete structure of the control circuit.

FIG. 44 shows a concrete configuration of a circuit that outputs signal PRE. HVNMOS transistors Qh151 to Qh153 have the same structure as that of the switching circuits shown in FIGS. 3C to 3E. FIG. 45 shows the timing for the operation of this circuit. In the stand-by operation, when signals RNG, PREBT, and PRE10V are at 0 V, and signals PR0V and PRTR are at Vcc. Therefore, the output is at 0 V.

In a read operation, with signal PR0V at 0 V and PRTR at 0 V, when signal PRBT is at Vcc, the output is at Vcc+α. α is lower than Vcc. In a write operation, when signal PR0V goes to 0 V, signal PRTR goes to 0 V and then signal PR10V goes to Vcc, the output becomes about Vm10+Vcc−Vt (sub=Vm10).

The HVNMOS transistors Qh147, Qh148 may be replaced with the depletion type high-withstand voltage n-channel MOS transistors Qhd.

FIG. 46 shows a concrete configuration of a circuit that outputs signal SR. FIG. 47 shows the timing for the operation of this circuit. In the stand-by operation, when signals RNG, SR0V, SRBT, SRVCCB are at 0 V, signal SR10VB is at Vcc. Therefore, the output is at Vcc.

In a read operation, when signal SRVCCB goes to Vcc and signal SRBT goes to Vcc, the output becomes Vcc+α. α is lower than Vcc. Then, when SR0V goes to Vcc, the output becomes 0 V. In a write operation, when signal SRVCCB goes to Vcc, and then signal SR10VB goes to 0 V, the output becomes about Vm10+Vcc−Vt (sub=Vm10).

FIG. 48 shows a concrete configuration of a circuit that outputs signal φE. FIG. 49 shows the timing for the operation of this circuit. In the stand-by operation, signals FIETRB, FIEBT are at 0 V and signal FIE3VB is at Vcc. Therefore, the output is at Vcc.

In a read operation, when signal FIE3VB goes to 0 V and signal FIETRB goes to Vcc, and then signal FIEBT goes to Vcc, the output becomes Vcc+α. α is lower than Vcc. The HVNMOS transistors Qh162, Qh163 may be replaced with the depletion type high-withstand voltage n-channel MOS transistors Qhd.

FIG. 50 shows a concrete configuration of a circuit that outputs signal VRFYX (X=A, B). FIG. 51 shows the timing for the operation of this circuit. In the stand-by operation, signals VR3V, VRTRB, VRBT, PRCX are at 0 V. Therefore, the output is at Vcc. Signal PRCX (X=A, B) corresponds to output VRFYX (X=A, B). Signal PRCXB is the reverse of PRCX.

In a read operation, when signal VR3V goes to Vcc and signal VRTRB goes to Vcc, then signal VRBT goes Vcc. In this situation, when signal PRCX is at Vcc, the output becomes Vcc+α. α is lower than Vcc. When signal PRXC is at 0 V, the output is at 0 V.

The HVNMOS transistors Qh164, Qh165 may be replaced with the depletion type high-withstand voltage n-channel MOS transistors Qhd.

FIG. 52A concretely shows a charge pump cell used in the charge pump circuit. When signal PRST rises sufficiently, the charge pump cell is reset. With signal PRST at 0 V and signal φ at 0 V, when signal φB goes to Vcc, the input voltage Vin is transferred to Vout. Thereafter, signal φ becomes Vcc, stepping up the voltage Vout. FIG. 52B shows a schematic symbol for the charge pump cell 20.

The HVNMOS transistors Qh166, Qh169, Qh170, Qh172 may be replaced with the depletion type high-withstand voltage n-channel MOS transistors Qhd.

FIG. 53 shows a concrete configuration of the charge pump circuit. A Vpp charge pump circuit 12, a Vm10 charge pump circuit 13, and a Vm8 charge pump circuit 14 are the same as that of FIG. 3E except for the number of charge pump cells 20. A charge pump circuit with a low stepped-up voltage requires a smaller number of charge pump cells. In FIG. 53, the output is VPUMP. The Vpp charge pump circuit 12, Vm10 charge pump circuit 13, and Vm8 charge pump circuit 14 output Vpp, Vm10, and Vm8, respectively. When signal PRSTB is at Vcc, the charge pump circuit is reset. When signal PRSTB goes to 0 V and signals φ1 to φ4 oscillate, the output VPUMP is stepped up.

The HVNMOS transistors Qh173, Qh174, Qh176, Qh178 may be replaced with the depletion type high-withstand-voltage n-channel MOS transistors Qhd. In this case, the gates of Qh174, Qh176 are supplied with signal PRSTB.

FIG. 54 shows a concrete configuration of the stepped-up voltage limiter circuit. The stepped-up voltage limiters connected to a Vpp charge pump circuit 12, a Vm10 charge pump circuit 13, and a Vm8 charge pump circuit 14 are the same as that of FIG. 3E except for the way of connecting a switch. In FIG. 54, the output is VPUMP. The Vpp charge pump circuit 12, Vm10 charge pump circuit 13, and Vm8 charge pump circuit 14 output Vpp, Vm10, and Vm8, respectively. When signal PRSTB is at Vcc, the output VPUMP is at Vcc.

Signal EXV is normally at 0 V. When Vpp, Vm10, and Vm8 are supplied externally in a test operation, EXV is at Vcc. When signal PRSTB goes to 0 V, resistors R1 to Rn between voltage VPUMP and the ground supply a voltage proportional to VPUMP to a voltage comparator 21 via the switch SW. The voltage is compared with a reference voltage Vref. If Vref is higher, the voltage comparator applies a low voltage to the gate electrode of NMOS transistor Qn35. If Vref is lower, the voltage comparator applies a high voltage to the gate electrode of NMOS transistor Qn35 to lower VPUMP. With the limiter circuit, by changing the connection of switch SW after manufacturing, voltage trimming can be effected according to variations in production. FIG. 55 shows the timing for the stepping-up operation. As an example, the way of stepping up the output Vpp of the Vpp charge pump circuit is shown in FIG. 56 in connection with FIG. 55.

The HVNMOS transistor Qh181 may be replaced with the depletion type high-withstand voltage n-channel MOS transistor Qhd. In this case, the gate of Qh181 is supplied with signal PRSTB.

FIG. 57 shows a concrete configuration of a circuit that controls voltage Vdd. In the stand-by condition, when signal CESB is at Vcc, voltage Vdd is disconnected from the power-supply voltage Vcc. When it is not in the stand-by condition, signal CESB is at 0 V and Vdd is at Vcc.

FIG. 58 shows the distribution of threshold voltages of memory cells M after the data is written into such a NAND EEPROM. The distribution was obtained by writing "0" into all of memory cells M with the same writing voltage and the same writing time. Since actual writing is effected by alternating a write operation with a bit-by-bit verify operation, the threshold voltage distribution width of memory cells M becomes narrower. To cause the threshold voltages to fall in a specific distribution range within a specific writing time, however, the distribution as shown in FIG. 58 must fall in the specific range. To achieve this, cells (remote bits) whose threshold voltage is remote from the specific range must be replaced with redundant cells. Furthermore, when the writing voltage deviates from the setting, trimming must be done. Then, the threshold voltage range having the distribution rate larger than a suitable distribution rate K is measured. Its lower limit is determined to be Vt-min and its upper limit is determined to be Vt-max.

FIGS. 59A and 59B show the method of trimming the writing voltage $V_{ppw}$ using Vt-min and Vt-max and the method of sensing remote bits.

First, more than a specific number of memory cells, for example, all of the memory cells, are erased (step P1). The writing voltage V is placed at an initial value of $V_{ppW0}$ (step P2), thereby writing the data into the erased memory cells during a fixed writing time $T_{pW}$ (step P3). After the writing, the threshold voltage distribution of the written memory cells is measured to find Vth-min and Vth-max (step P4).

When Vt-min is lower than 0 V, the writing voltage is too low. When Vt-max exceeds the power-supply voltage Vcc, the writing voltage is too high. Therefore, it is desirable that when too low, the writing voltage $V_{ppw}$ should be raised by $\Delta$Vpp and when too high, it should be lowered by $\Delta$Vpp. The reason for this is that they exceed the threshold voltage range in which the threshold voltage can be measured accurately. All of the bits are erased and measured again. Here, when $V_{ppw}$ has exceeded the upper limit $V_{ppw\text{-}max}$ or dropped below the lower limit $V_{ppW\text{-}min}$, the measurement is stopped and the product is treated as defective (steps P5, P6, P17 to P21).

Vt-center is determined to be (Vt-max+Vt-min)/2 (step P7).

When Vt-center is higher than V2, the writing voltage is too high. When Vt-center is lower than V1, the writing voltage is too low. Therefore, it is desirable that when too low, the writing voltage $V_{ppw}$ should be raised by $\Delta$Vpp and when too high, it should be lowered by $\Delta$Vpp. The reason for this is that they exceed the threshold voltage range in which the threshold voltage can be measured accurately. All of the bits are erased and measured again. Here, when $V_{ppW}$ has exceeded the upper limit $V_{ppw\text{-}max}$ or dropped below the lower limit $V_{ppw\text{-}min}$, the measurement is stopped and the product is treated as defective (steps P8, P9, P22 to P26).

Taking into account the difference between the initial value $V_{ppW0}$ of the writing voltage and the writing voltage $V_{ppw}$ used in measurement, Vt-center is corrected to be Vt1. For example, it is assumed that Vt-center is corrected by $V_{ppW0}$–$V_{ppw}$ to be Vt1 (step P10). Then, the deviation $\Delta$Vt of Vt1 from the optimum value Vt0 is determined (step P11). If $\Delta$Vt is not a value that allows trimming, the measurement is stopped and the product is treated as defective (step P12).

Writing voltage trimming is effected on the basis of $\Delta$Vt (step P13). Memory cells whose threshold voltage exceeds a specific range with Vt-center in the center are determined to be remote bits (step P14). When remote bits cannot be relieved, the product is treated as defective (step P15). Finally, the remote bits are relieved (step P16) and the process is completed.

The trimming of the writing voltage $V_{ppW}$ is effected by shifting, for example, $\Delta$Vt. Specifically, immediately after the manufacture, if $V_{ppw}$ is 20 V and $\Delta$Vt is 1 V, trimming is done so the $V_{ppw}$ may be the closest to 21 V. The same holds true for erasing voltage trimming and remote bits after erasure on the basis of the threshold voltage distribution after erasure.

FIG. 60 is an another block diagram of a NAND-cell EEPROM according to an embodiment of the present invention. The NAND-cell EEPROM of FIG. 60 characterized by further comprising a test mode signal generating circuit 23.

With the above, configuration, the test mode signal generating circuit 23 performs an erasure operation without selecting any memory cell and at the same time, deactivates the data storage circuit includes in the test mode signal generating circuit 23 (not shown).

Figure 61:
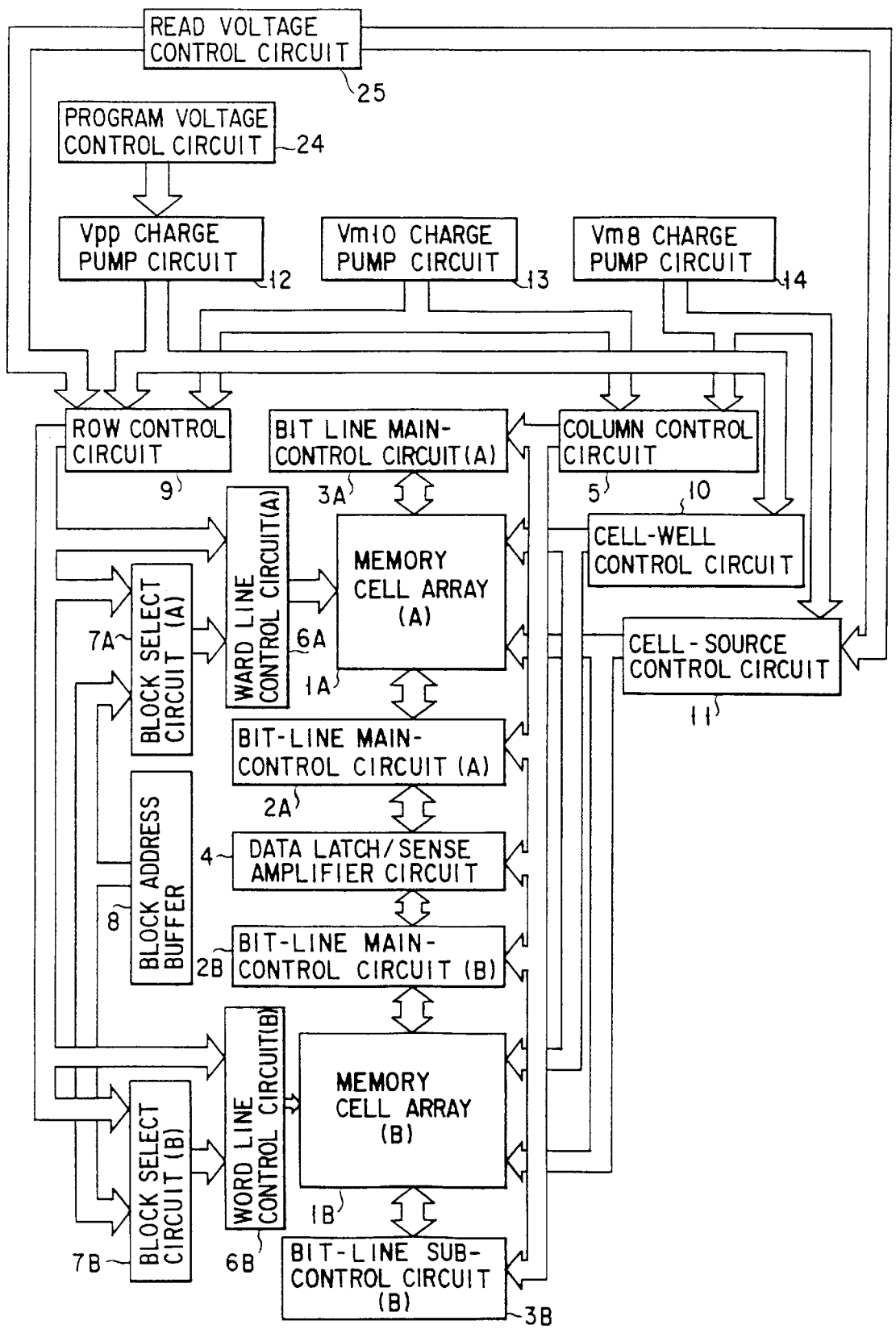
FIG. 61 a still another block diagram of a NAND-cell EEPROM according to an embodiment of the present invention.

FIG. 61 a still another block diagram of a NAND-cell EEPROM according to an embodiment of the present invention. The NAND-cell EEPROM of FIG. 61 characterized by further comprising a programming voltage control circuit 24 and a reading voltage control circuit 25. With this configuration, the programming voltage control circuit 24 adjusts a programming voltage, and the reading voltage control circuit 25 applies a positive voltage to the gate of memory cell and 0 V to the source of NAND-cell in the read operation after the programming operation, and 0 V to the gate of memory cell and the positive voltage to the source of NAND-cell in the read operation after the erasure operation.

Figure 62:
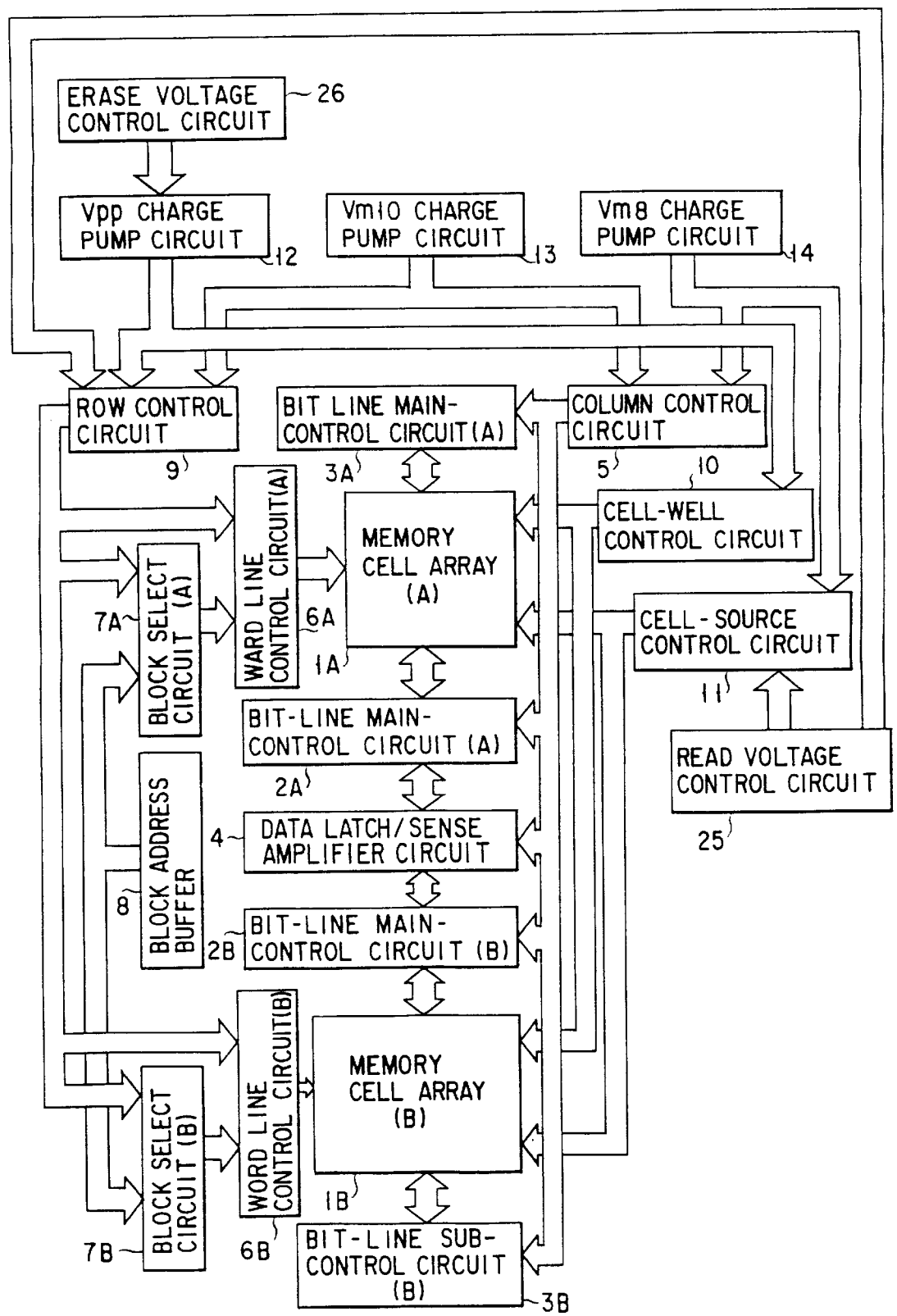
FIG. 62 shows a still another block diagram of a NAND-cell EEPROM according to an embodiment of the present invention.

FIG. 62 a still another block diagram of a NAND-cell EEPROM according to an embodiment of the present invention. The NAND-cell EEPROM of FIG. 62 characterized by further comprising a reading voltage control circuit 25 and a erasing voltage control circuit 26. With this configuration, the reading voltage control circuit 25 applies a positive voltage to the gate of memory cell and 0 V to the source of NAND-cell in the read operation after the programming operation, and 0 V to the gate of memory cell and the positive voltage to the source of NAND-cell in the read operation after the erasure operation, and the erasing voltage control circuit 26 adjusts an erasing voltage.

As described above, with the present invention, the high-withstand-voltage transistors to which the writing voltage or the erasing voltage is applied are made up of such transistors as are in the inverted or weak inversion state when its threshold voltage is low, and its gate voltage, source voltage, and substrate voltage are at 0 V. Furthermore, it has been explained that the high-withstand-voltage transistors may be restricted to only one type. While in the embodiments, the high-withstand-voltage transistors have been explained using n-channel MOS transistors as an example, the same holds true for p-channel MOS transistors.

Furthermore, with the present invention, not only writing voltage trimming but also the sensing of the memory cells with remote threshold voltages forming the foot of the threshold voltage distribution can be effected on the basis of the threshold voltage range with a specific distribution rate in the threshold voltage distribution of the memory cells after a write operation without a verify operation. While in the embodiments, these operations are performed on the basis of the threshold voltage after writing, NOR EEPROMs enable the same operations on the basis of the threshold voltage after erasing.

A nonvolatile semiconductor memory device of the present invention can be applied to not only the NAND-cell EEPROM as described above, but also the NOR-cell EEPROM. Furthermore, it can be partially applied to various types of semiconductor memory devices such as DRAMs, SRAMs, or MROMs.

Furthermore, the present invention has a variety of applications to the effect of being explained above. For example, in the switching circuits shown in FIGS. 3B and 3E, the HVNMOS transistor Qh3 may be replaced with a depletion type n-channel MOS transistor with its gate voltage fixed at 0 V. In this case, it is desirable that the depletion type n-channel MOS transistor should be in the cut-off state with its substrate bias and gate voltage at 0 V and its source voltage at 0 V. Furthermore, when a voltage to be transferred to the source with the substrate bias and gate voltage at 0 V and the drain voltage at Vcc, is applied to the source, it is desirable that the HVNMOS transistor Qh should be in the cut-off state.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a memory cell array where memory cells are arranged in a matrix, said memory cells forming a plurality of memory cell groups;
   block select circuits for selecting memory cell blocks containing said plurality of memory cell groups; and
   means for bringing all of said block select circuits into a block-selected state in a stand-by condition.

2. A semiconductor memory device according to claim 1, wherein said block select circuits contains voltage conversion circuits, each composed of a block address decoder and a MOS transistor of a first-conductivity type connected to said block address decoder.

3. A semiconductor memory device according to claim 2, further comprising a block control circuit that receives the outputs of said block select circuits and controls said memory-cell blocks, wherein
   said block control circuit is a voltage transfer circuit composed of the first-conductivity-type MOS transistor whose gate electrode is connected to said block select circuit.

4. A semiconductor memory device comprising:
   an array of electrically rewritable memory cells which are arranged in a matrix, said memory cells forming a plurality of memory cell groups;
   erasing means for applying an erasing voltage to said memory cells to effect erasing;
   writing means for applying a writing voltage to said memory cells to effect writing; and
   block select circuits for selecting memory cell blocks containing said plurality of memory cell groups, wherein
      in said erasing means and writing means, MOS transistors to which a voltage higher than said erasing voltage and writing voltage is applied or transferred are in a weak inversion state or an inversion state with their substrate bias voltage, gate voltage and source voltage at 0 V, and said erasing means and writing means contain means for bringing all of said block select circuits into a block-selected state in a stand-by condition.

5. A semiconductor memory device according to claim 4, wherein said block select circuits contains voltage conversion circuits, each composed of a block address decoder and a MOS transistor of a first-conductivity type connected to said block address decoder.

6. A semiconductor memory device according to claim 5, further comprising a block control circuit that receives the outputs of said block select circuits and controls said memory-cell blocks, wherein
   said block control circuit is a voltage transfer circuit composed of the first-conductivity-type MOS transistor whose gate electrode is connected to said block select circuit.

7. A semiconductor memory device comprising:
   a memory cell array in which memory cells are arranged in a matrix; and
   memory-cell control means for controlling said memory cells, wherein
      said memory cell control means contains a switching circuit comprising a charge transfer circuit where the source electrode of a first MOS transistor is connected to the drain electrode of a second MOS transistor and the gate electrode of said first MOS transistor is connected to the gate electrode of said second MOS transistor and
      a bias circuit that applies a bias voltage to the source electrode of said second MOS transistor and the drain electrode Os said second MOS transistor so as to electrically disconnect the drain electrode of said first MOS transistor from the source of said second MOS transistor in case that said switching circuit is unselected and that does not apply said bias voltage to the source electrode of said first MOS transistor and the drain electrode of said second MOS transistor so as to electrically connect the drain electrode of said first MOS transistor to the source electrode of said second MOS transistor in case that said switching circuit is selected, said bias circuit being deactivated in a stand-by condition.

* * * * *